(12) United States Patent
Lin et al.

(10) Patent No.: US 9,704,824 B2
(45) Date of Patent: Jul. 11, 2017

(54) SEMICONDUCTOR DEVICE AND METHOD OF FORMING EMBEDDED WAFER LEVEL CHIP SCALE PACKAGES

(71) Applicant: STATS ChipPAC, Ltd., Singapore (SG)

(72) Inventors: Yaojian Lin, Singapore (SG); Pandi C. Marimuthu, Singapore (SG); Il Kwon Shim, Singapore (SG); Byung Joon Han, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 14/070,509

(22) Filed: Nov. 2, 2013

(65) Prior Publication Data

US 2014/0183761 A1    Jul. 3, 2014

Related U.S. Application Data

(63) Continuation-in-part of application No. 14/036,525, filed on Sep. 25, 2013.

(60) Provisional application No. 61/748,742, filed on Jan. 3, 2013.

(51) Int. Cl.
*H01L 23/00* (2006.01)
*H01L 21/56* (2006.01)
*H01L 23/31* (2006.01)

(52) U.S. Cl.
CPC ............ *H01L 24/96* (2013.01); *H01L 21/561* (2013.01); *H01L 21/568* (2013.01);
(Continued)

(58) Field of Classification Search
CPC ....... H01L 21/563; H01L 24/11; H01L 24/19; H01L 24/96; H01L 2224/1205; H01L 2924/18162
USPC .................................................. 257/666, 737
See application file for complete search history.

(56) References Cited

U.S. PATENT DOCUMENTS 6,136,137 A    10/2000    Farnworth et al.
7,109,587 B1 *  9/2006    Li ................................. 257/779
(Continued)

OTHER PUBLICATIONS

Yoon, Seung Wook, "Integrated 3D Wafer Level Packaging Solutions for Mobile Applications", SEMICON Singapore, pp. 1-25, May 2013.

*Primary Examiner* — Thanhha Pham
(74) *Attorney, Agent, or Firm* — Robert D. Atkins; Patent Law Group: Atkins and Associates, P.C.

(57) ABSTRACT

A semiconductor device includes a semiconductor die and an encapsulant deposited over and around the semiconductor die. A semiconductor wafer includes a plurality of semiconductor die and a base semiconductor material. A groove is formed in the base semiconductor material. The semiconductor wafer is singulated through the groove to separate the semiconductor die. The semiconductor die are disposed over a carrier with a distance of 500 micrometers (μm) or less between semiconductor die. The encapsulant covers a sidewall of the semiconductor die. A fan-in interconnect structure is formed over the semiconductor die while the encapsulant remains devoid of the fan-in interconnect structure. A portion of the encapsulant is removed from a non-active surface of the semiconductor die. The device is singulated through the encapsulant while leaving encapsulant disposed covering a sidewall of the semiconductor die. The encapsulant covering the sidewall includes a thickness of 50 μm or less.

5 Claims, 32 Drawing Sheets

(52) U.S. Cl.
CPC .......... *H01L 23/3114* (2013.01); *H01L 24/11* (2013.01); *H01L 24/19* (2013.01); *H01L 2224/1134* (2013.01); *H01L 2224/12105* (2013.01); *H01L 2224/16225* (2013.01); *H01L 2224/48091* (2013.01); *H01L 2224/73265* (2013.01); *H01L 2924/01322* (2013.01); *H01L 2924/10157* (2013.01); *H01L 2924/12041* (2013.01); *H01L 2924/12042* (2013.01); *H01L 2924/1306* (2013.01); *H01L 2924/13091* (2013.01); *H01L 2924/181* (2013.01); *H01L 2924/18162* (2013.01); *H01L 2924/3511* (2013.01)

(56) References Cited

U.S. PATENT DOCUMENTS

| 8,258,633 | B2 | 9/2012 | Sezi et al. |
| 8,367,475 | B2 | 2/2013 | Law et al. |
| 2009/0011543 | A1* | 1/2009 | Karta ................ H01L 21/561 438/114 |
| 2009/0196011 | A1 | 8/2009 | Kobayashi et al. |
| 2011/0014746 | A1* | 1/2011 | Do .................... H01L 21/568 438/107 |
| 2011/0221055 | A1* | 9/2011 | Lin ................... H01L 21/563 257/692 |
| 2011/0241222 | A1 | 10/2011 | Sezi et al. |
| 2012/0187568 | A1* | 7/2012 | Lin ................ H01L 21/76898 257/774 |
| 2012/0273959 | A1 | 11/2012 | Park et al. |
| 2012/0273960 | A1* | 11/2012 | Park et al. ................. 257/774 |
| 2012/0286429 | A1 | 11/2012 | Han et al. |
| 2013/0037935 | A1* | 2/2013 | Xue et al. ................. 257/737 |
| 2013/0341774 | A1* | 12/2013 | Chang et al. ............. 257/666 |
| 2014/0110842 | A1* | 4/2014 | Zenz .................... H01L 23/31 257/738 |

\* cited by examiner

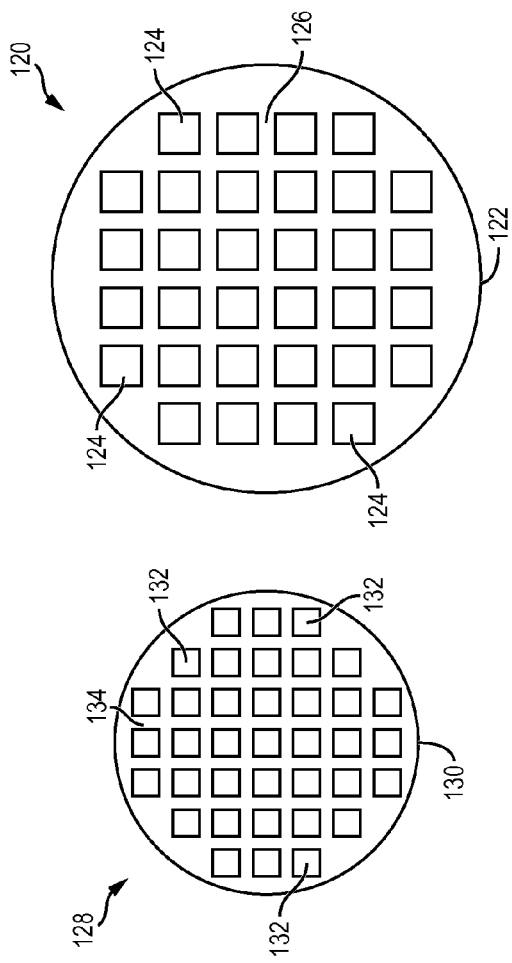
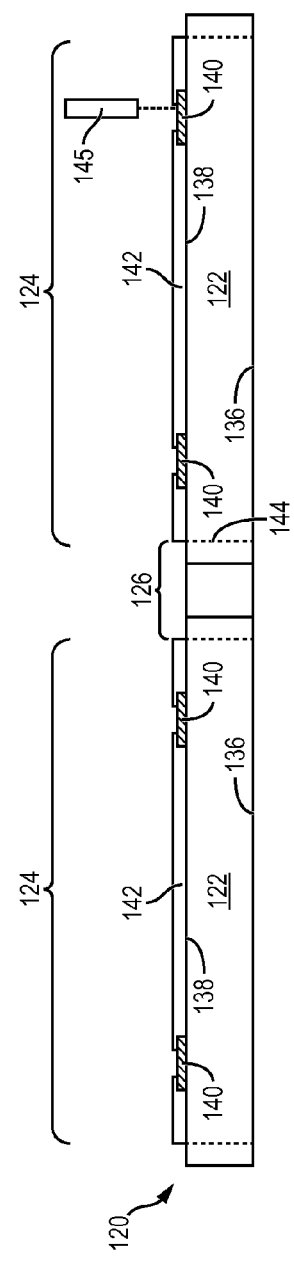
FIG. 3
FIG. 4a

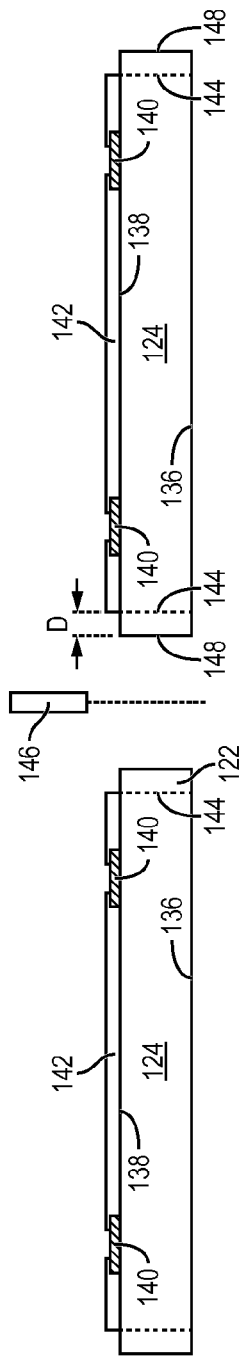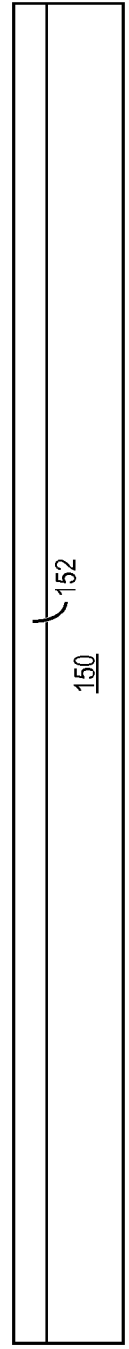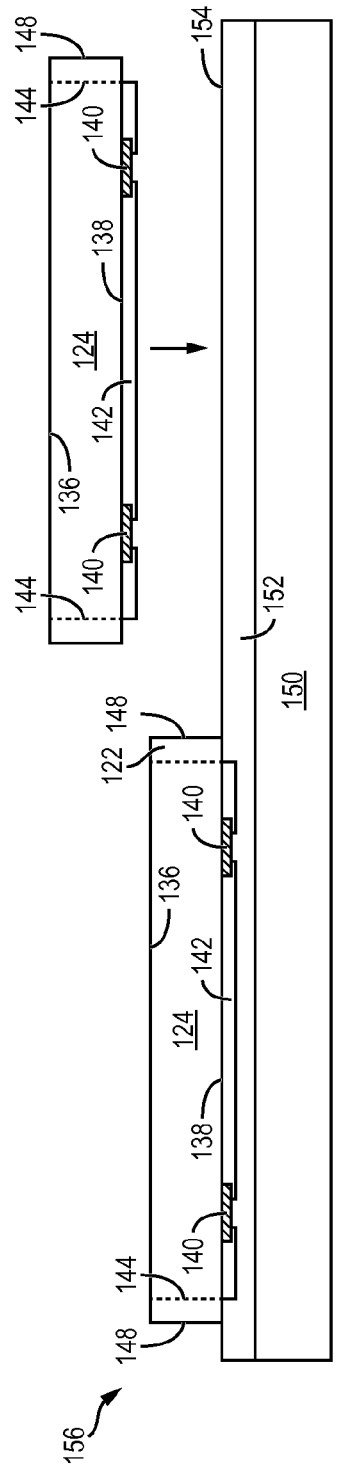
FIG. 4b
FIG. 4c
FIG. 4d

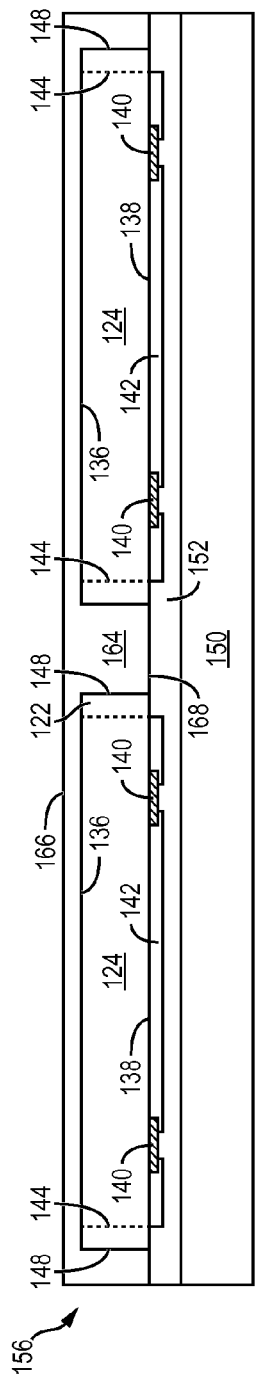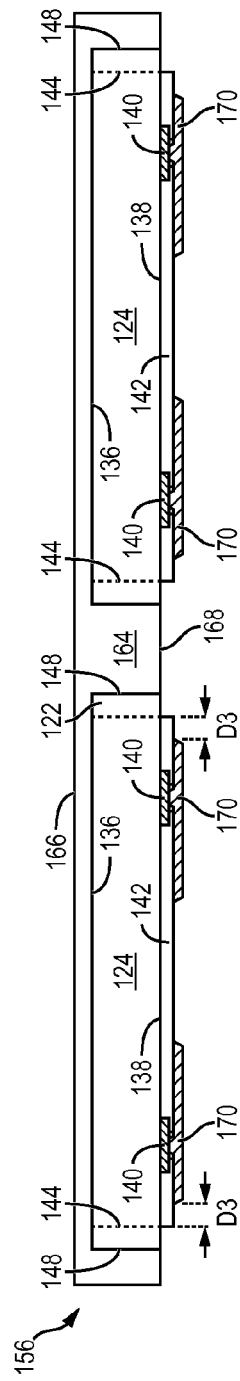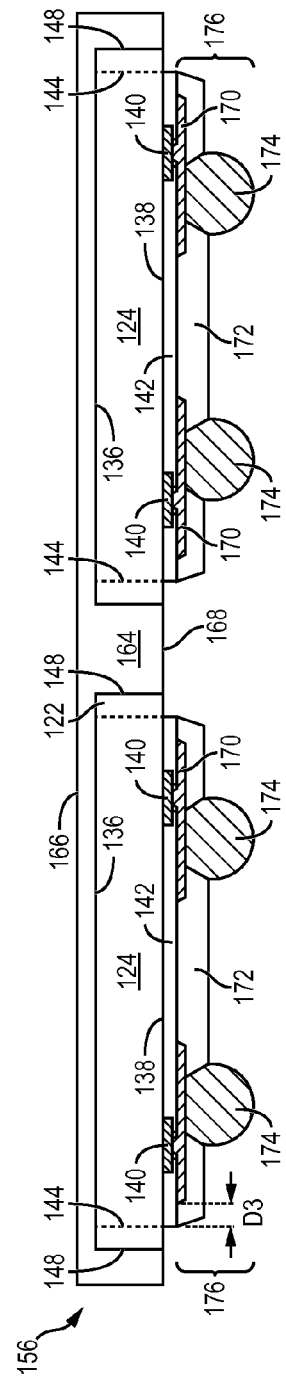
FIG. 4i
FIG. 4j
FIG. 4k

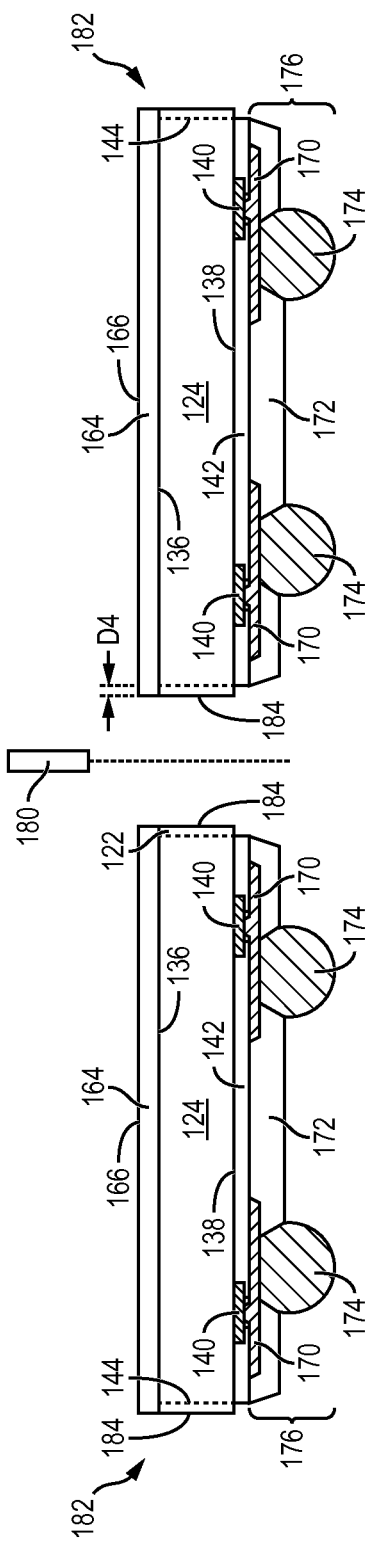
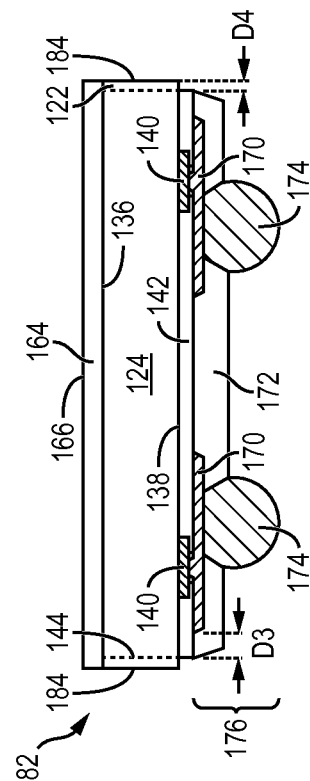
FIG. 4l
FIG. 4m

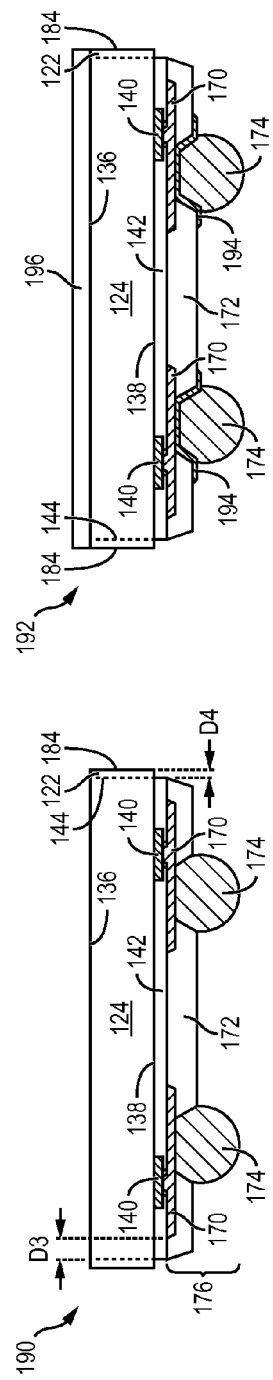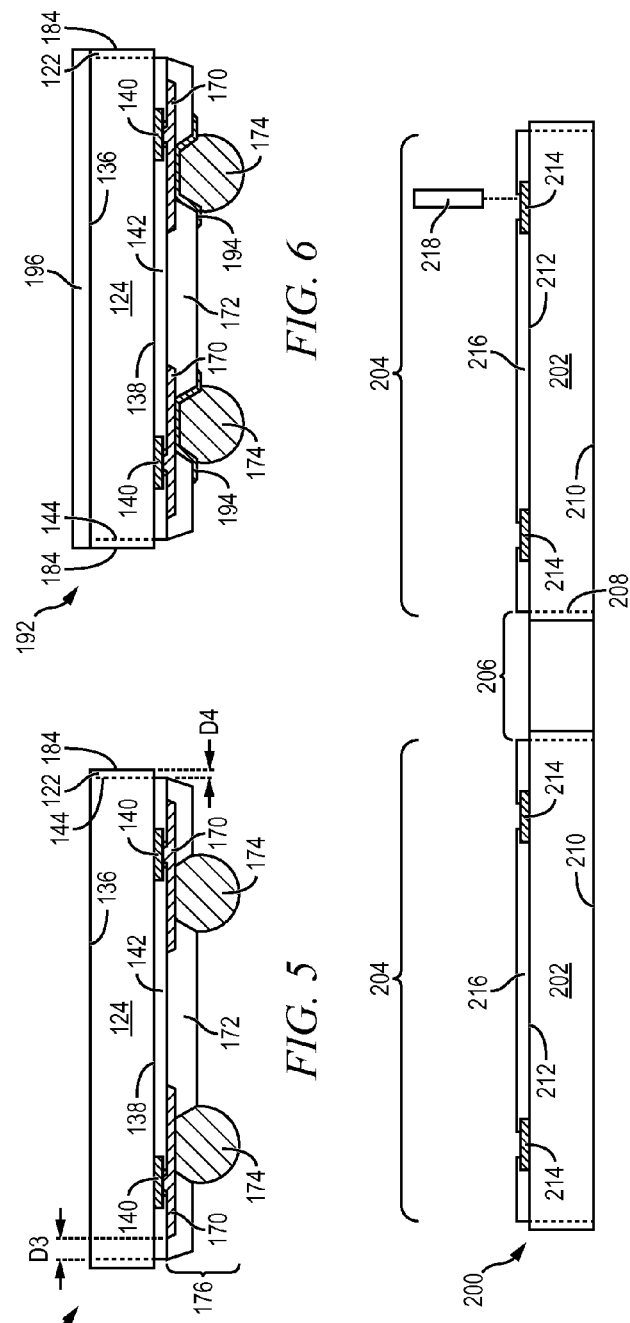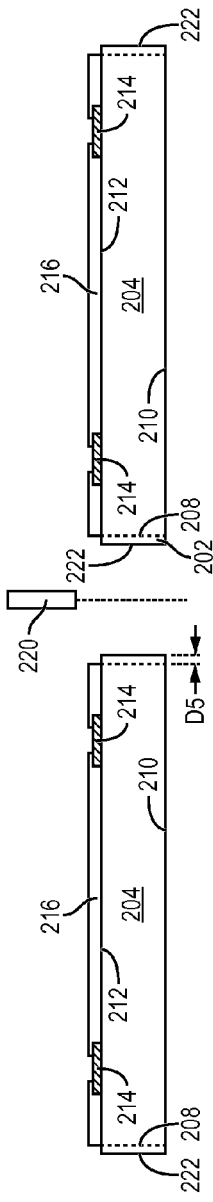

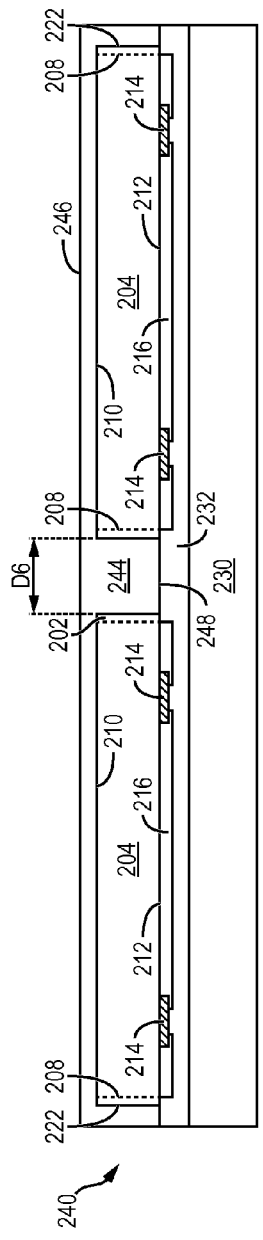
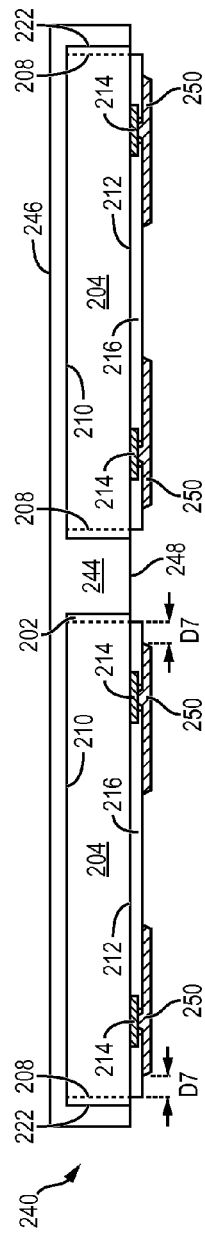
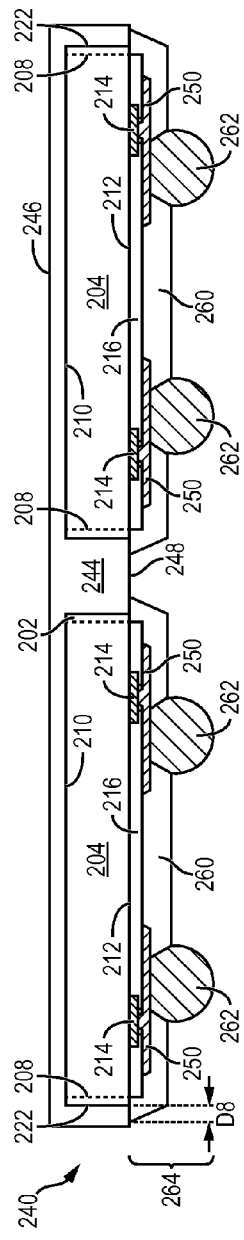

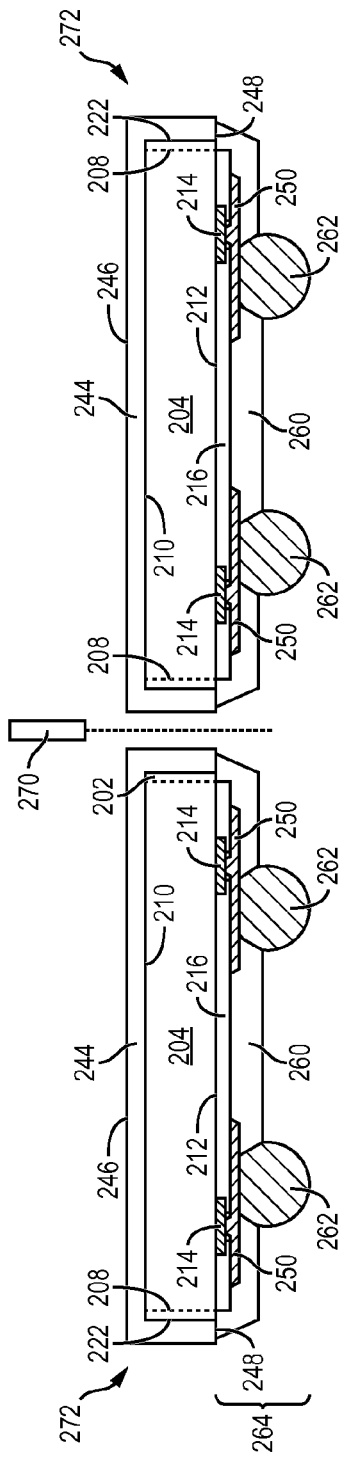
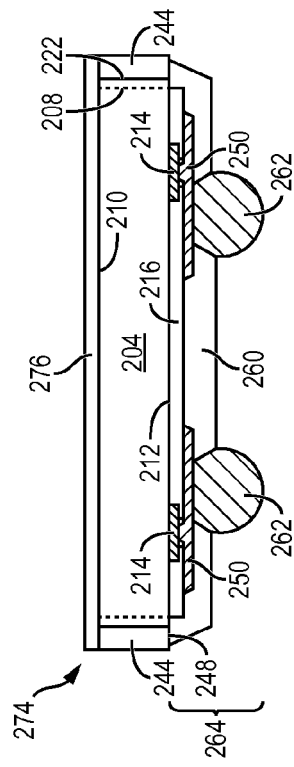
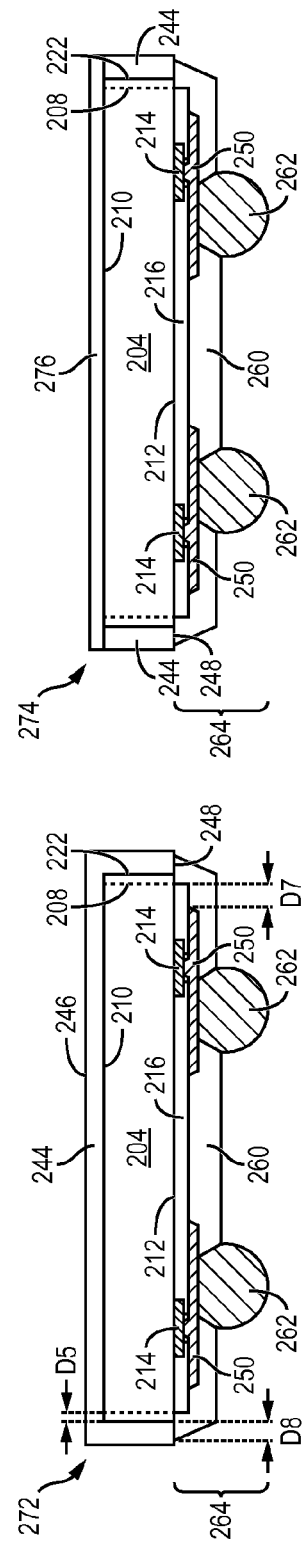
FIG. 7h
FIG. 7i
FIG. 8

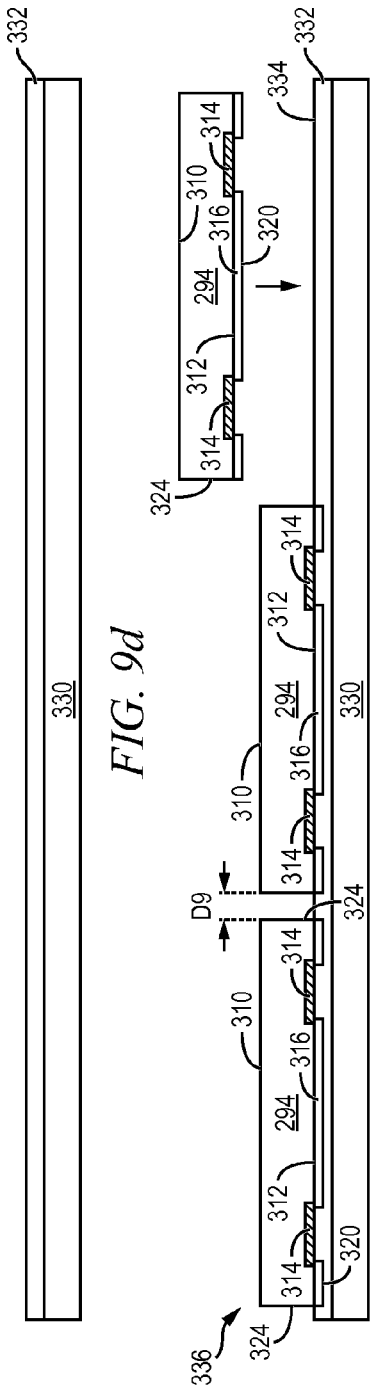
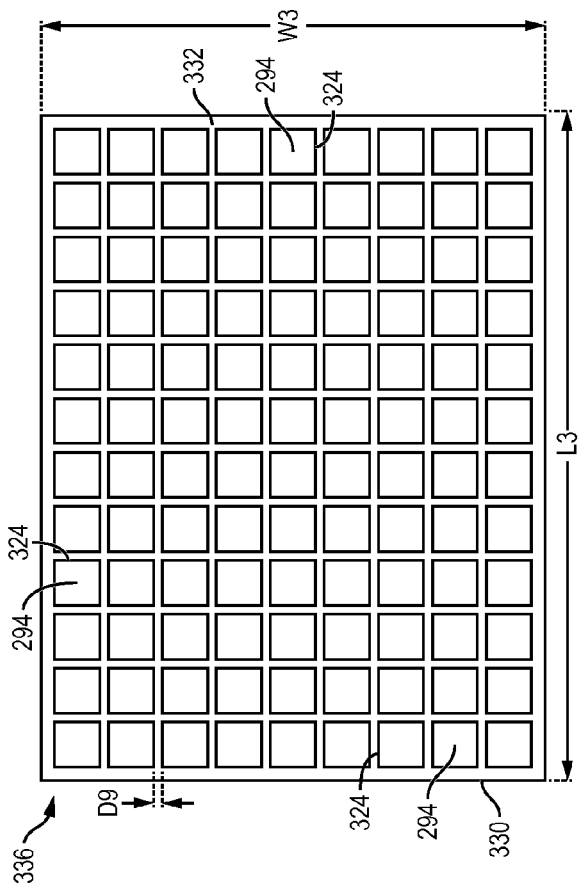

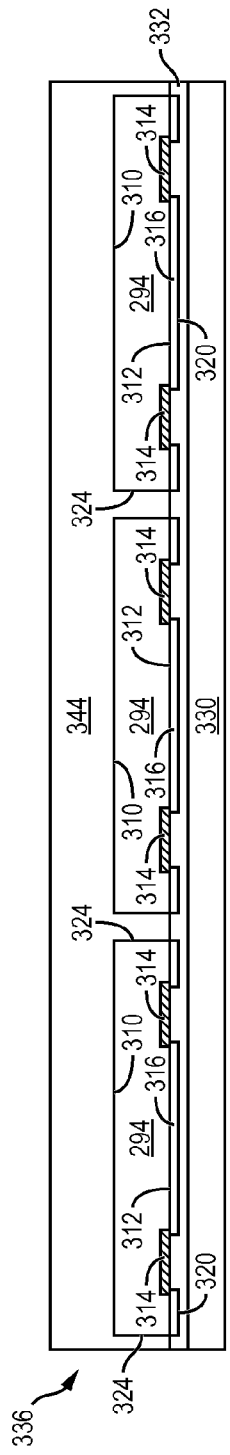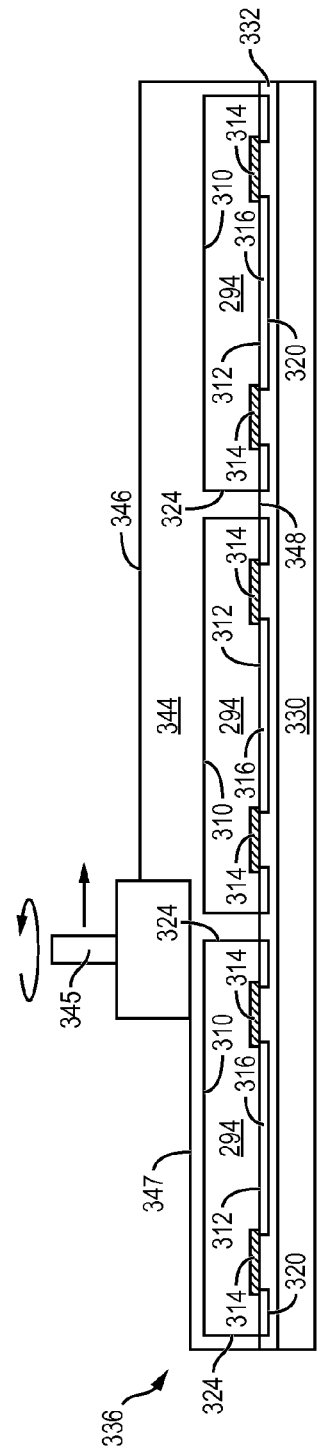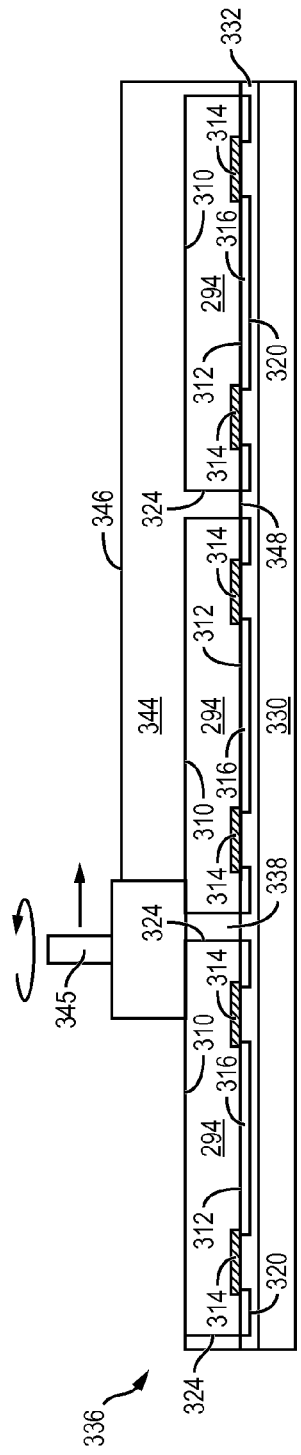

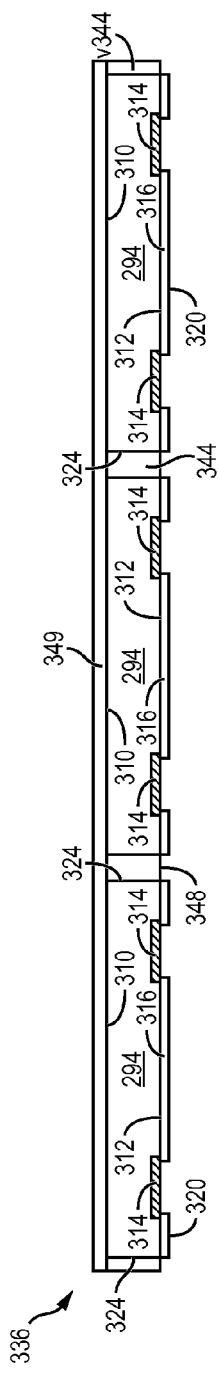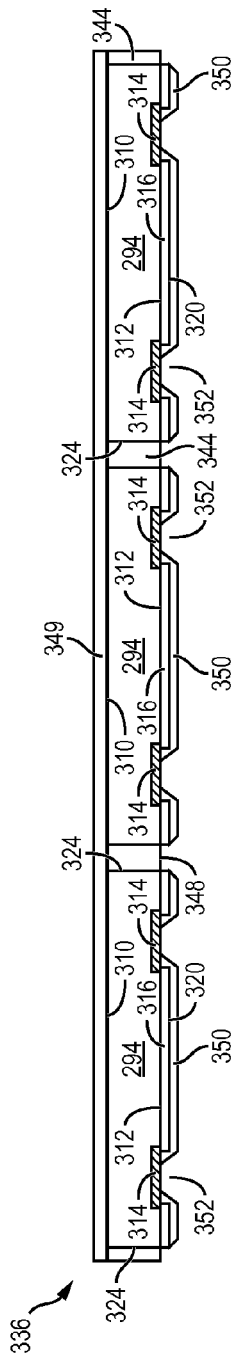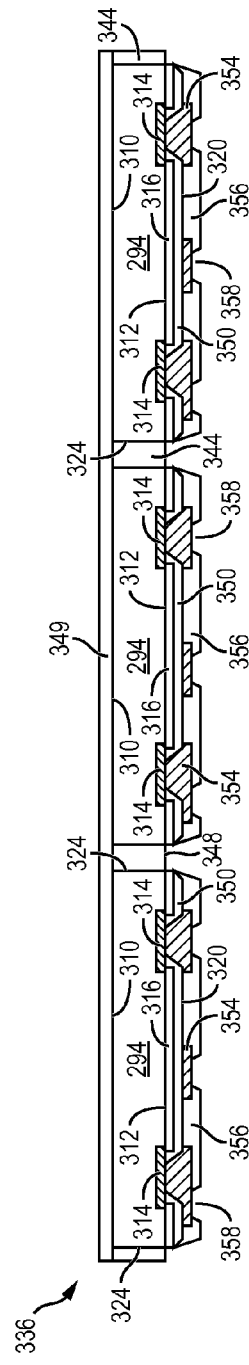

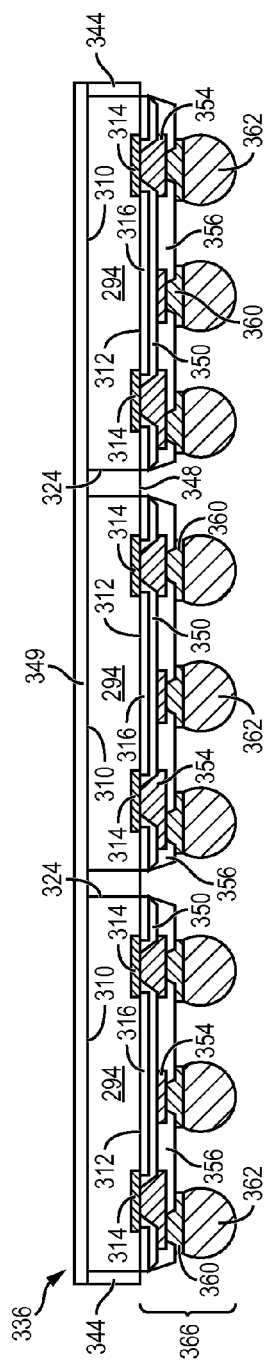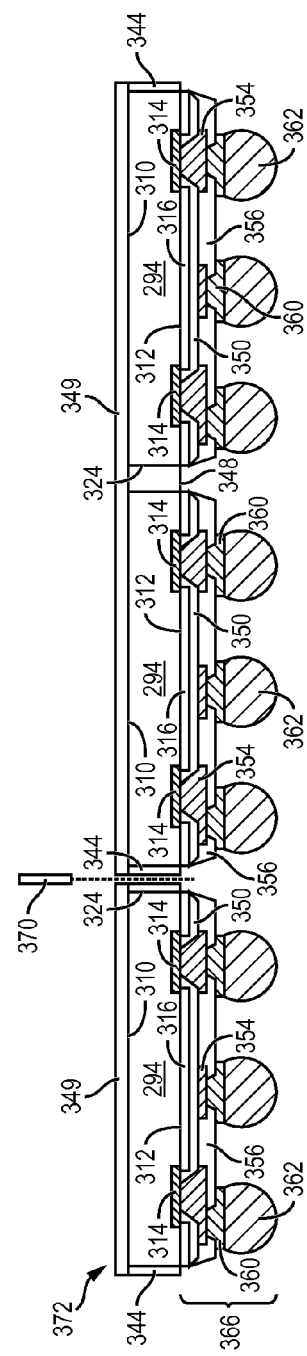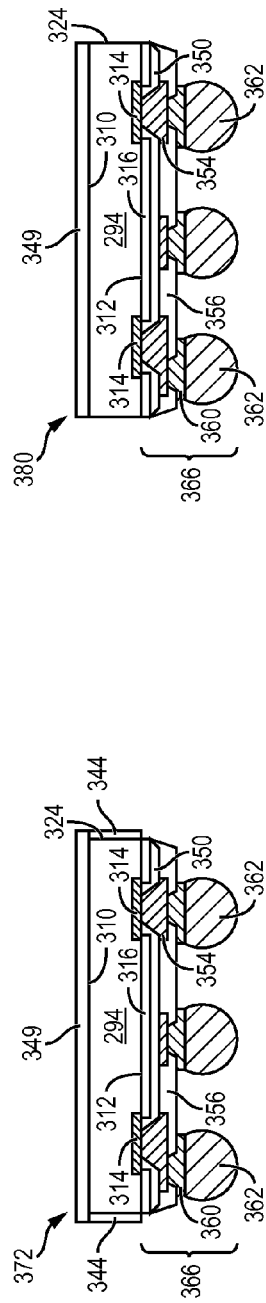
FIG. 9o
FIG. 9p
FIG. 10
FIG. 11

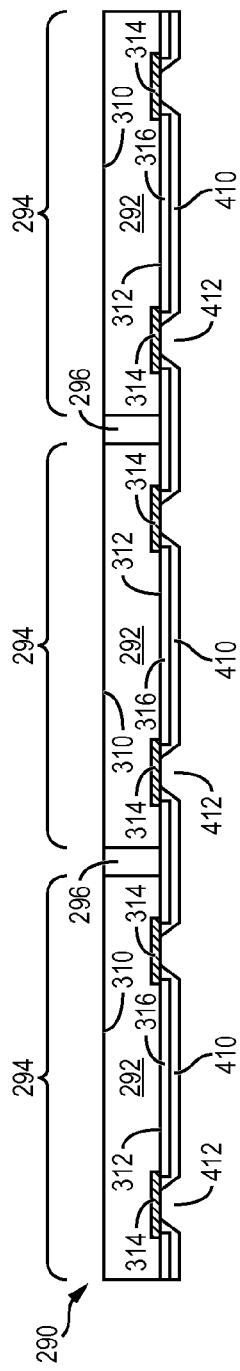
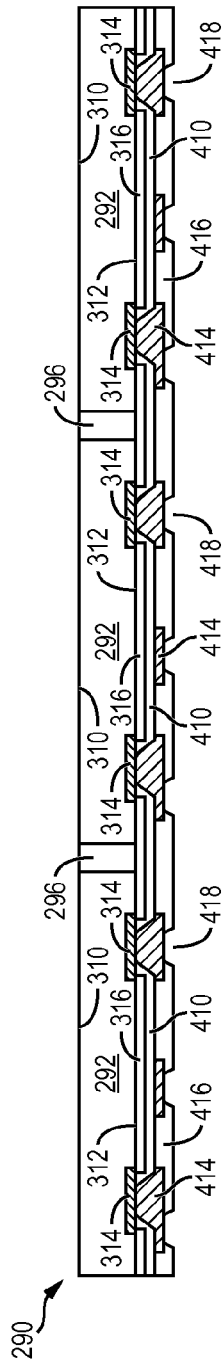
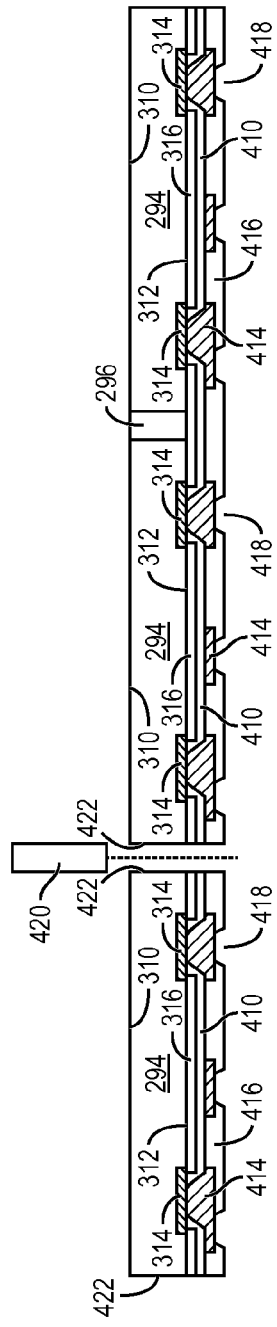
FIG. 15a
FIG. 15b
FIG. 15c

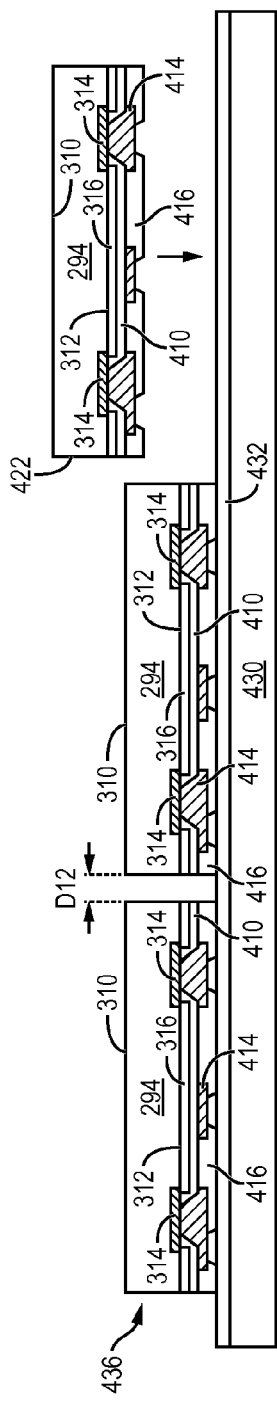
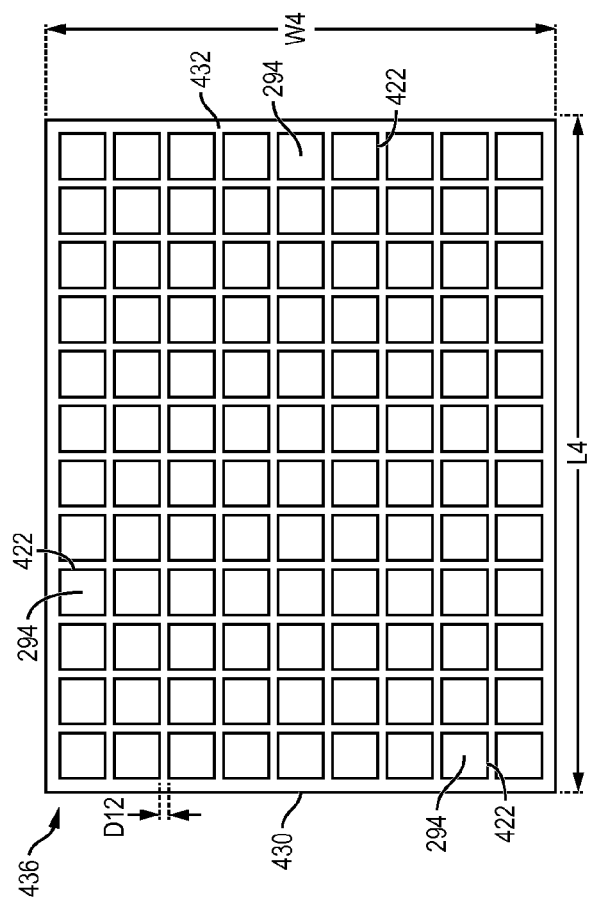
FIG. 15d
FIG. 15e

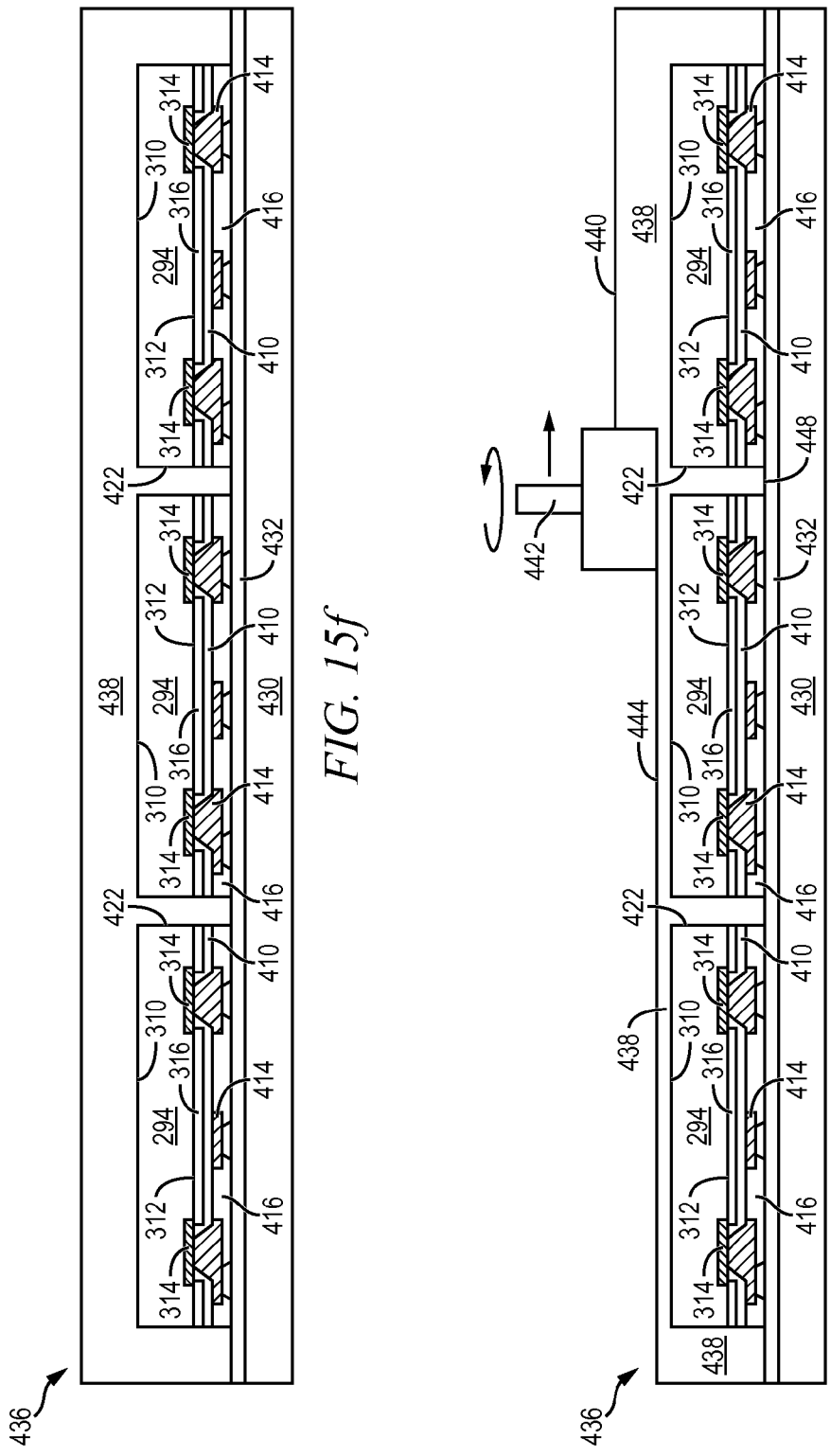

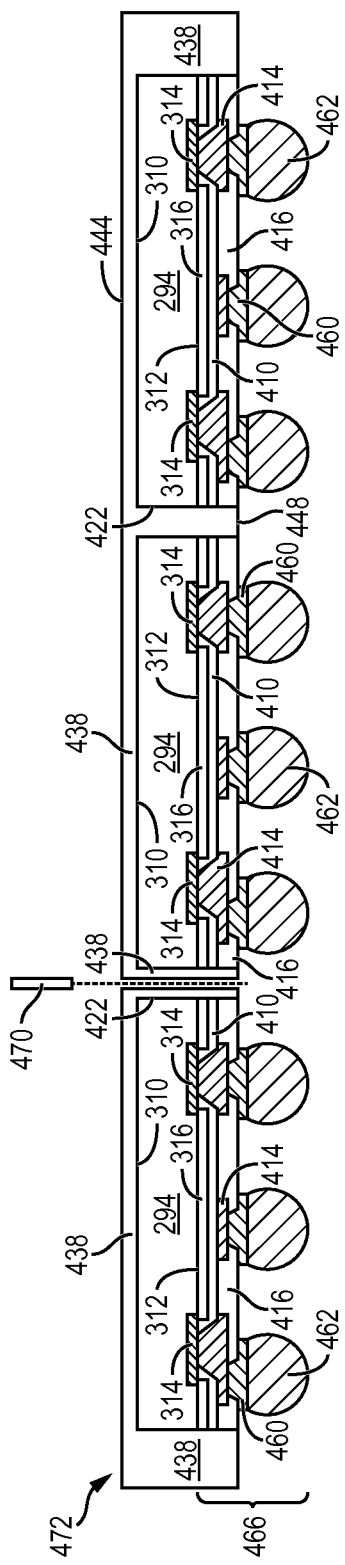
FIG. 15k
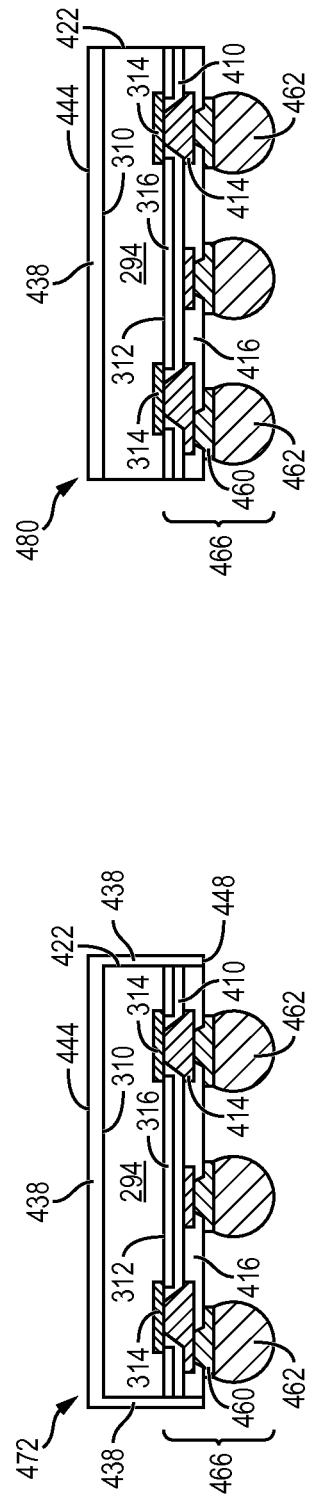
FIG. 17
FIG. 16

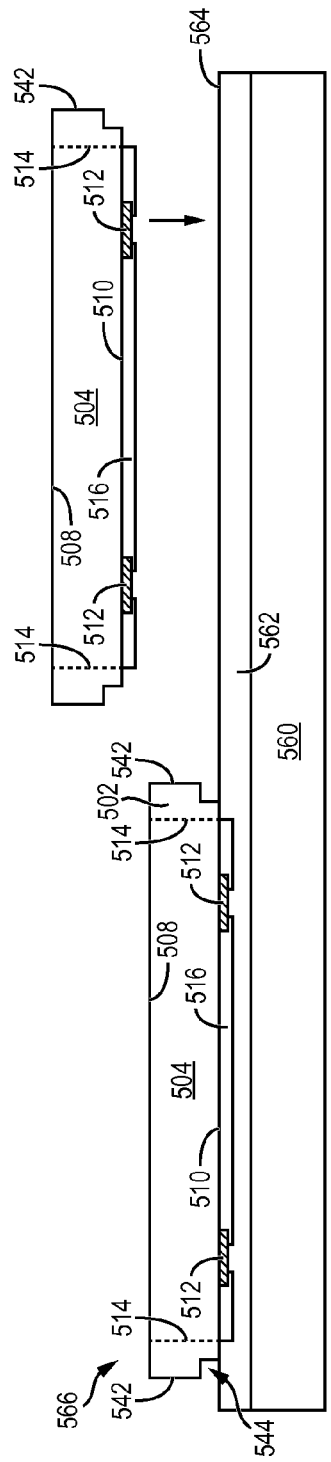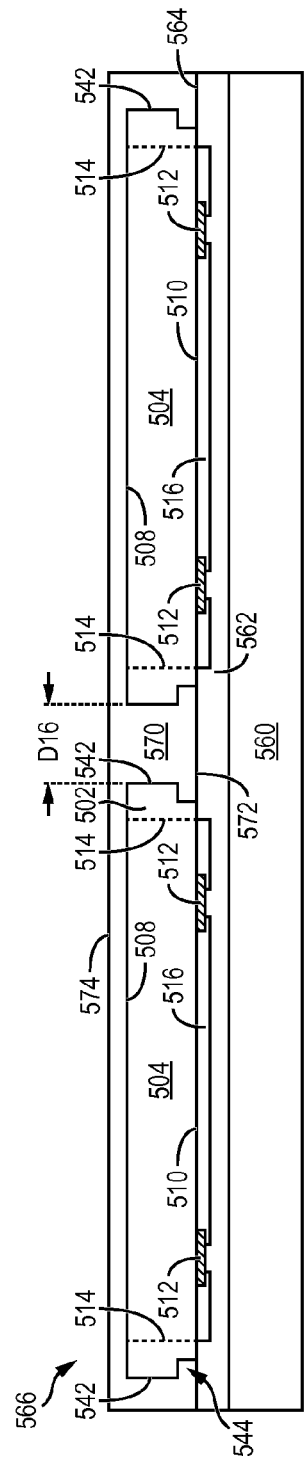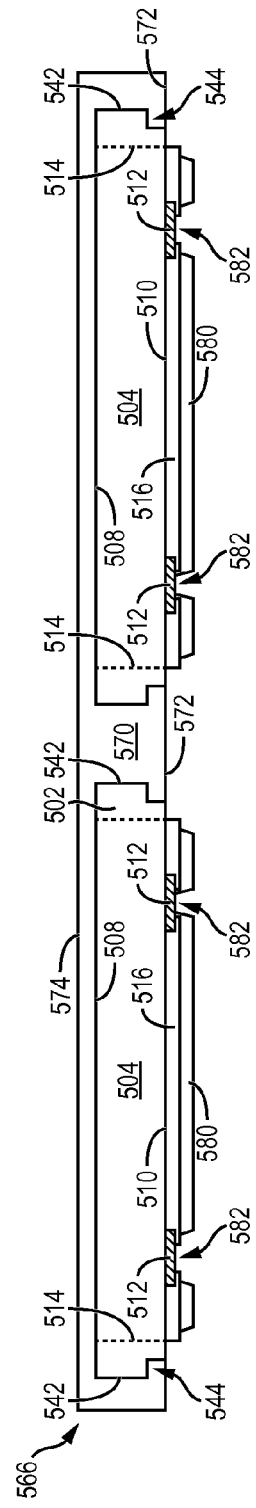

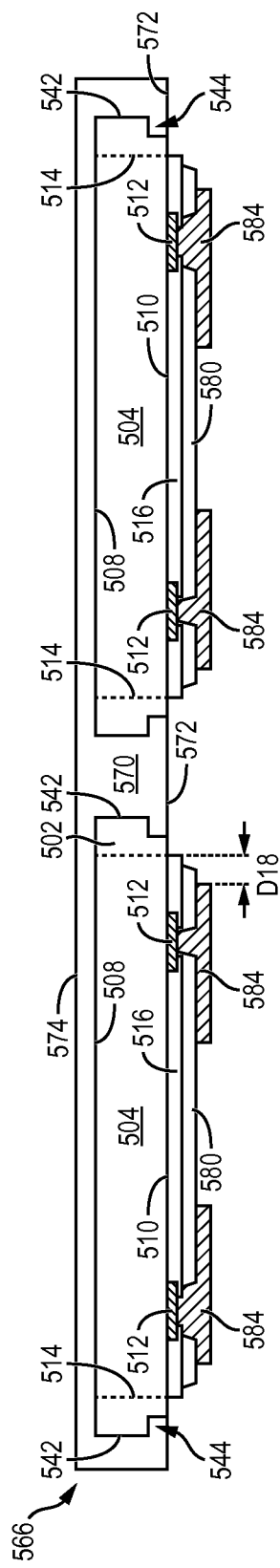
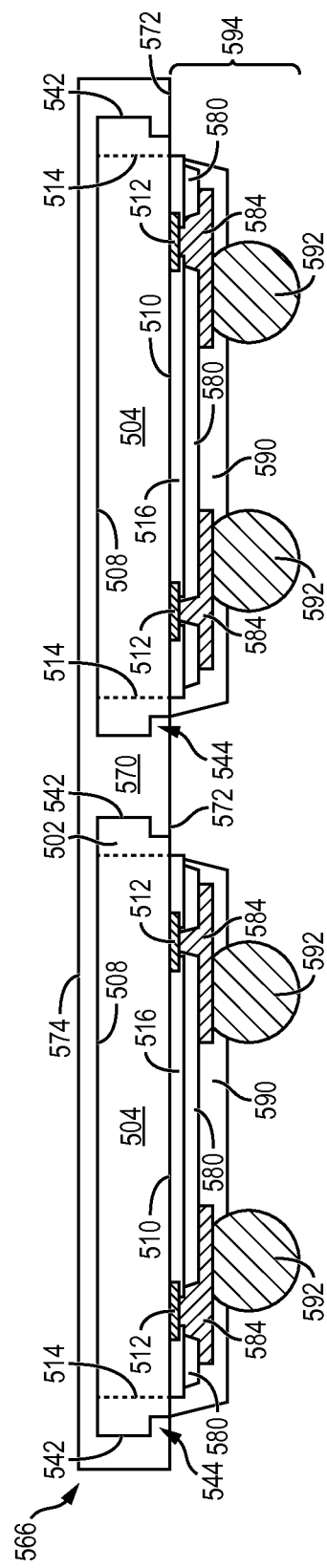

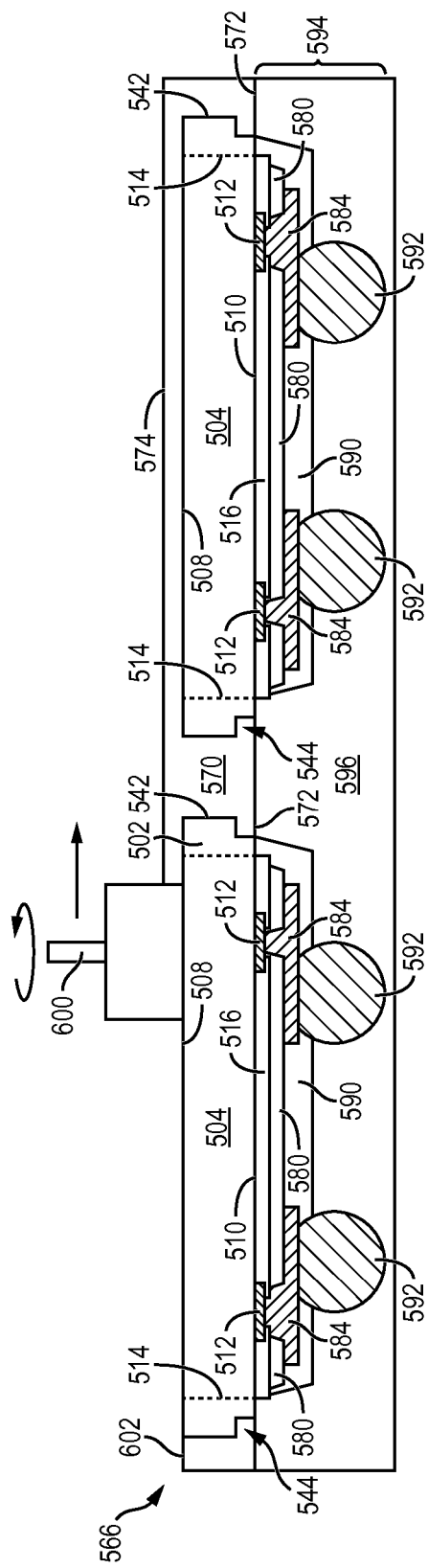
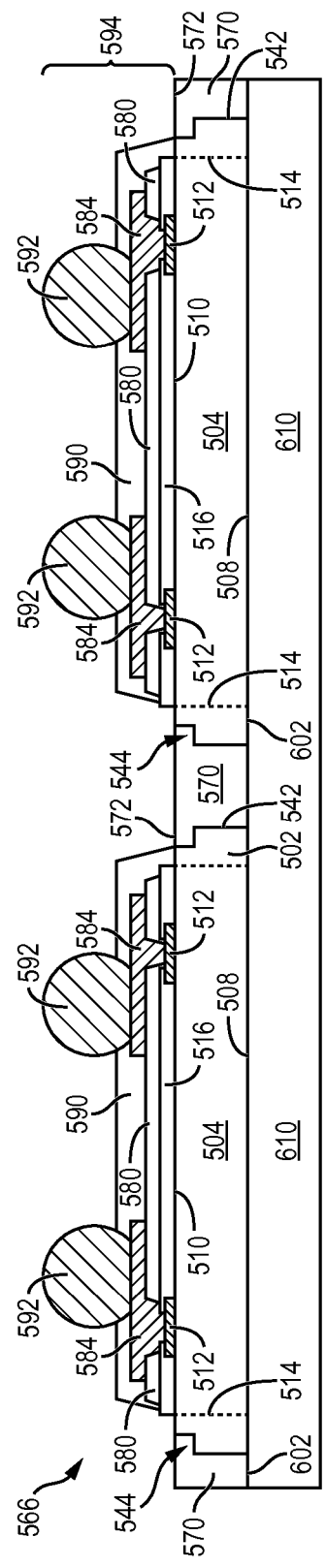
FIG. 22i
FIG. 22j

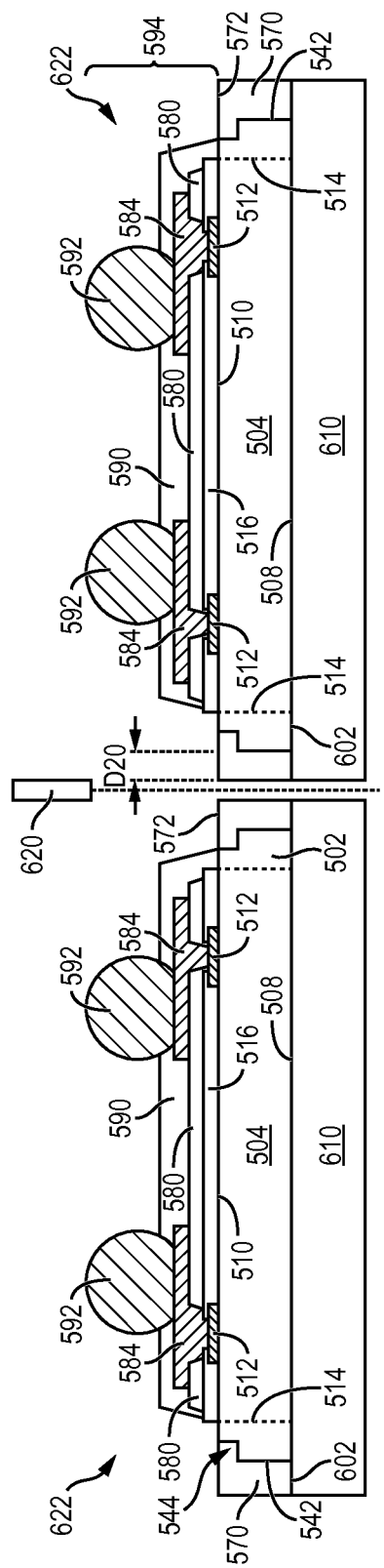
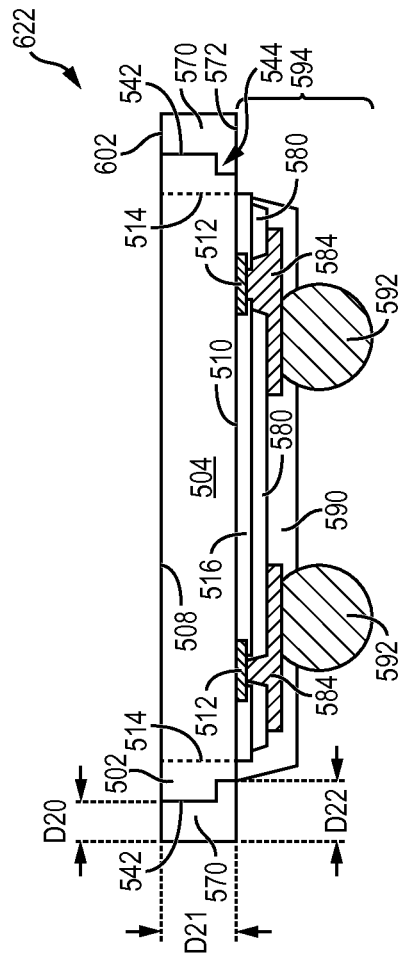
FIG. 22k
FIG. 22l

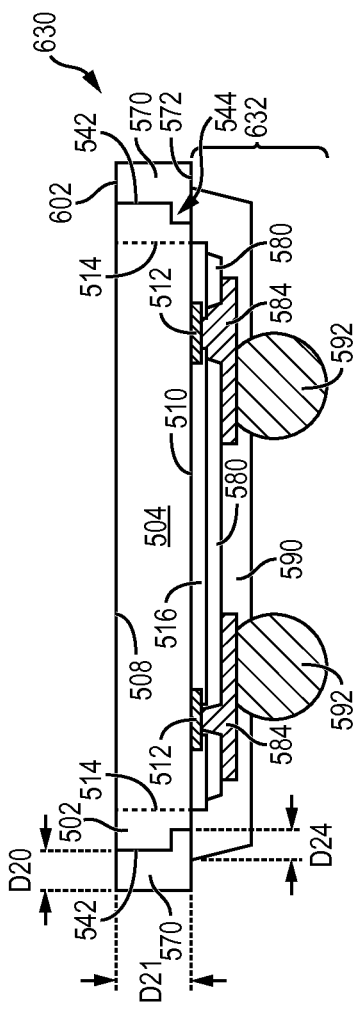
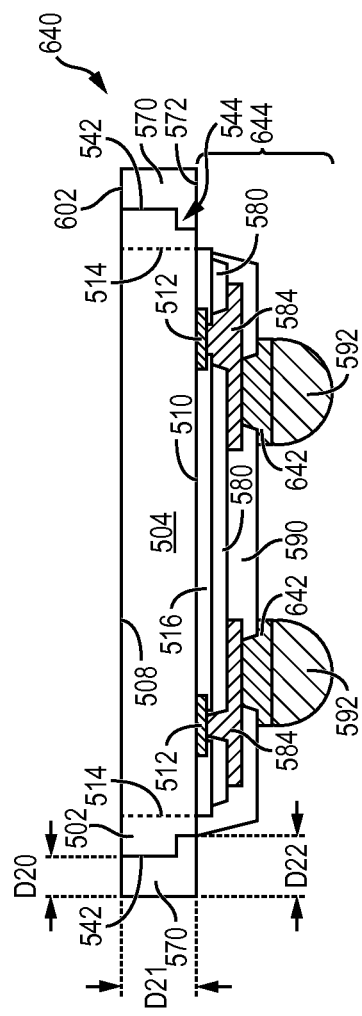

SEMICONDUCTOR DEVICE AND METHOD OF FORMING EMBEDDED WAFER LEVEL CHIP SCALE PACKAGES

CLAIM TO DOMESTIC PRIORITY

The present application is a continuation-in-part of U.S. patent application Ser. No. 14/036,525, filed Sep. 25, 2013, which claims the benefit of U.S. Provisional Application No. 61/748,742, filed Jan. 3, 2013, which applications are incorporated herein by reference.

FIELD OF THE INVENTION

The present invention relates in general to semiconductor devices and, more particularly, to a semiconductor device and method of forming wafer level chip scale packages (WLCSP).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional semiconductor wafer typically contains a plurality of semiconductor die separated by a saw street. Active and passive circuits are formed in a surface of each semiconductor die. An interconnect structure can be formed over the surface of the semiconductor die. The semiconductor wafer is singulated into individual semiconductor die for use in a variety of electronic products. An important aspect of semiconductor manufacturing is high yield and corresponding low cost.

Semiconductor wafers are fabricated having various diameters and semiconductor die sizes depending on the equipment used to produce the semiconductor wafers and semiconductor die. Semiconductor processing equipment is typically developed according to each particular semiconductor die size and incoming semiconductor wafer size. For example, a 200 millimeter (mm) wafer is processed using 200 mm equipment, and a 300 mm wafer is processed using 300 mm equipment. Semiconductor die singulated from a wafer are processed on a carrier. The size of the carrier is selected according to the size of the semiconductor die to be processed. For example, 10 mm by 10 mm semiconductor die are processed using different equipment than 5 mm by 5 mm semiconductor die. Therefore, equipment for packaging semiconductor devices is limited in processing capability to the specific semiconductor die size or semiconductor wafer size for which the equipment is designed. As incoming semiconductor die sizes and semiconductor wafer sizes change, additional investment in manufacturing equipment is necessary. Investment in equipment for a specific size semiconductor die or semiconductor wafer creates capital investment risk for semiconductor device manufacturers. As incoming semiconductor wafer sizes change, wafer-specific equipment becomes obsolete. Similarly, carriers and equipment designed for specific sizes of semiconductor die can become obsolete, because the carriers are limited in capability to handle different sized semiconductor die. Constant development and implementation of different equipment increases the cost of the final semiconductor device.

Semiconductor wafers include various diameters and are typically processed with manufacturing equipment designed for each specific size of semiconductor die. Semiconductor die are typically enclosed within a semiconductor package for electrical interconnect, structural support, and environmental protection of the die. The semiconductor can be subject to damage or degradation if a portion of the semiconductor die is exposed to external elements, particularly when surface mounting the die. For example, the semiconductor die can be damaged or degraded during handling and exposure to light. Semiconductor die are also subject to damage during singulation of semiconductor wafers and during formation of individual semiconductor packages. Singulation through semiconductor material can cause cracking or chipping of the semiconductor die.

SUMMARY OF THE INVENTION

A need exists to reduce damage to a semiconductor die during manufacturing of wafer level chip scale packages (WLCSP). Accordingly, in one embodiment, the present invention is a method of making a semiconductor device comprising the steps of providing semiconductor die, depositing an encapsulant over and around the semiconductor die, removing a portion of the encapsulant from a surface of the semiconductor die, and forming an interconnect structure over the semiconductor die while leaving the encapsulant devoid of the interconnect structure.

In another embodiment, the present invention is a method of making a semiconductor device comprising the steps of providing semiconductor die, depositing an encapsulant over and around the semiconductor die, and forming an interconnect structure over the semiconductor die while leaving the encapsulant devoid of the interconnect structure.

In another embodiment, the present invention is a semiconductor device comprising a semiconductor die and an encapsulant deposited around the semiconductor die. An interconnect structure is formed over the semiconductor die. The encapsulant is devoid of the interconnect structure.

In another embodiment, the present invention is a semiconductor device comprising a semiconductor die and an encapsulant deposited around the semiconductor die. A fan-in interconnect structure is formed over the semiconductor die.

BRIEF DESCRIPTION OF THE DRAWINGS

FIG. 3 illustrates semiconductor wafers with a plurality of semiconductor die separated by a saw street;

FIGS. 4a-4m illustrate a process of forming a reconstituted or embedded wafer level chip scale package (eWLCSP);

FIG. 5 illustrates an eWLCSP with the semiconductor die having exposed sidewalls and back surface;

FIG. 6 illustrates an eWLCSP having a backside protection layer;

FIGS. 7a-7i illustrate another process of forming an eWLCSP having thin sidewall encapsulation;

FIG. 8 illustrates an eWLCSP having a backside protection layer and thin sidewall encapsulation;

FIG. 10 illustrates an eWLCSP having encapsulant over the sidewall of the semiconductor die and a backside protection layer;

FIG. 11 illustrates an eWLCSP having a backside protection layer;

FIGS. 15a-15k illustrate an alternative process of forming an eWLCSP;

FIG. 16 illustrates an eWLCSP having an encapsulant over the sidewall and back surface of the semiconductor die;

FIG. 17 illustrates an eWLCSP having encapsulant over the back surface of the semiconductor die;

FIG. 22a-22m illustrate a process of forming an eWLCSP having encapsulant over the sidewall of the semiconductor die and having an exposed back surface;

FIG. 23 illustrates an eWLCSP having encapsulant over the sidewall of the semiconductor die and having an exposed back surface; and FIG. 24 illustrates an eWLCSP having encapsulant over the sidewall of the semiconductor die, an exposed back surface, and under bump metallization (UBM).

DETAILED DESCRIPTION OF THE DRAWINGS

Figure 1:
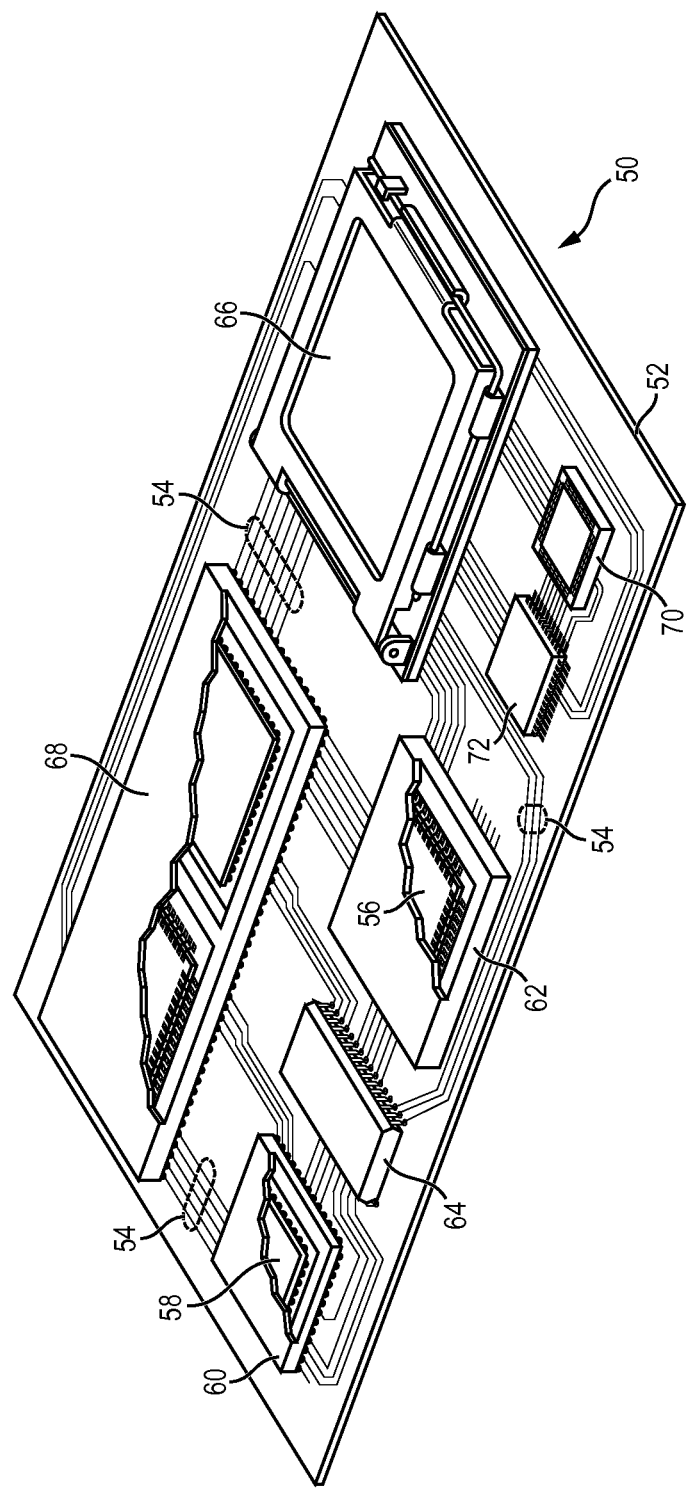
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
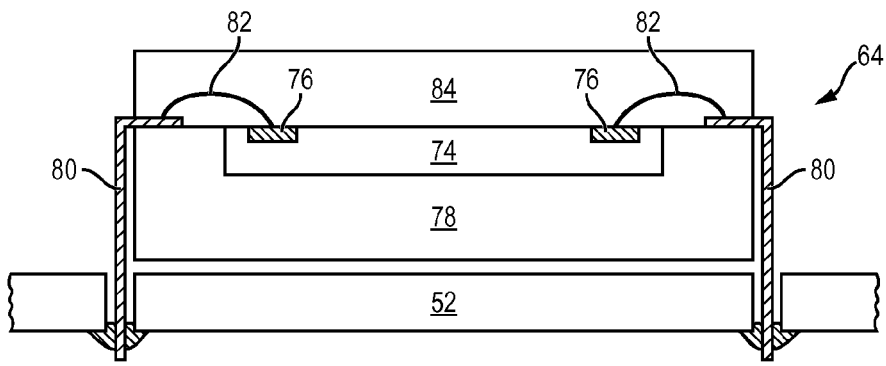
FIGS. 2a-2c illustrate further detail of the representative semiconductor packages mounted to the PCB.
Figure 2B:
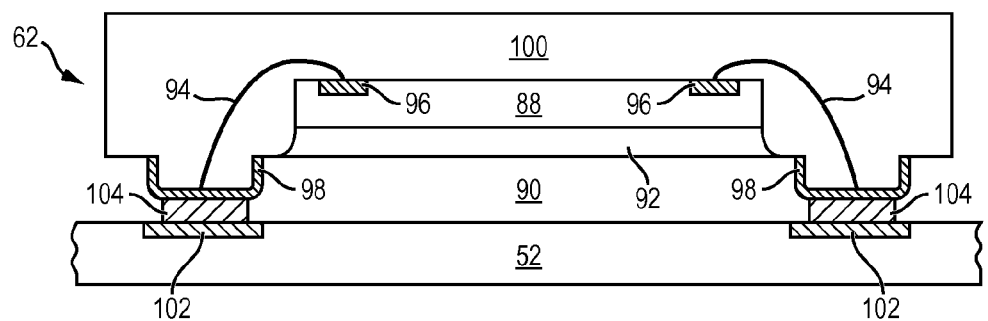
Figure 2C:
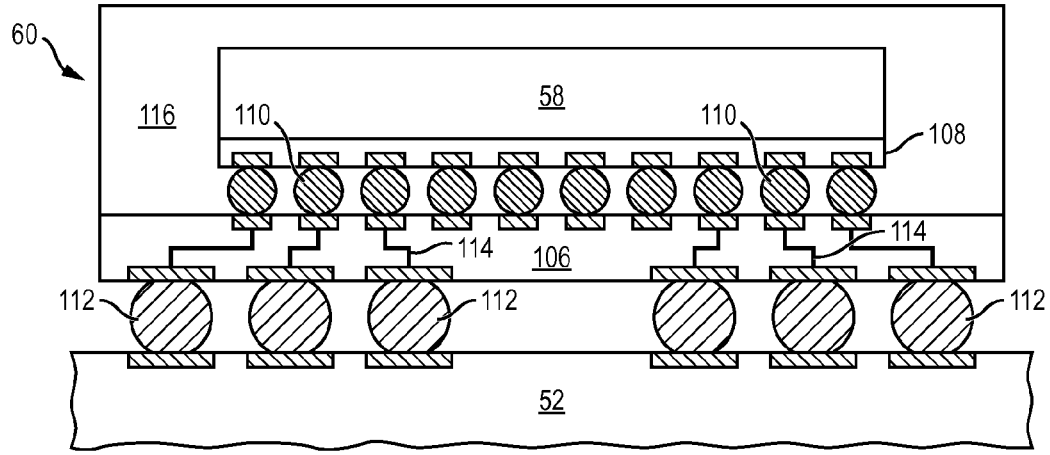

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

FIG. 3 shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124. In one embodiment, semiconductor wafer 120 is 200-300 millimeters (mm) in diameter. In another embodiment, semiconductor wafer 120 is 100-450 mm in diameter. Semiconductor wafer 120 may have any diameter prior to singulating semiconductor wafer into individual semiconductor die 124. Semiconductor die 124 may have any size, and in one embodiment, semiconductor die 124 may have dimensions of 10 mm by 10 mm.

Semiconductor wafer 128 is similar to semiconductor wafer 120 with a base substrate material 130, such as silicon, germanium, gallium arsenide, indium phosphide, or silicon carbide, for structural support. A plurality of semiconductor die or components 132 is formed on wafer 128 separated by a non-active, inter-die wafer area or saw street 134 as described above. Saw street 134 provides cutting areas to singulate semiconductor wafer 128 into individual semiconductor die 132. Semiconductor wafer 128 may have the same diameter or a different diameter from semiconductor wafer 120. Semiconductor wafer 128 may have any diameter prior to singulating semiconductor wafer into individual semiconductor die 132. In one embodiment, semiconductor wafer 128 is 200-300 mm in diameter. In another embodiment, semiconductor wafer 128 is 100-450 mm in diameter. Semiconductor die 132 may have any size, and in one embodiment, semiconductor die 132 are smaller than semiconductor die 124 and have dimensions of 5 mm by 5 mm.

Figure 4E:
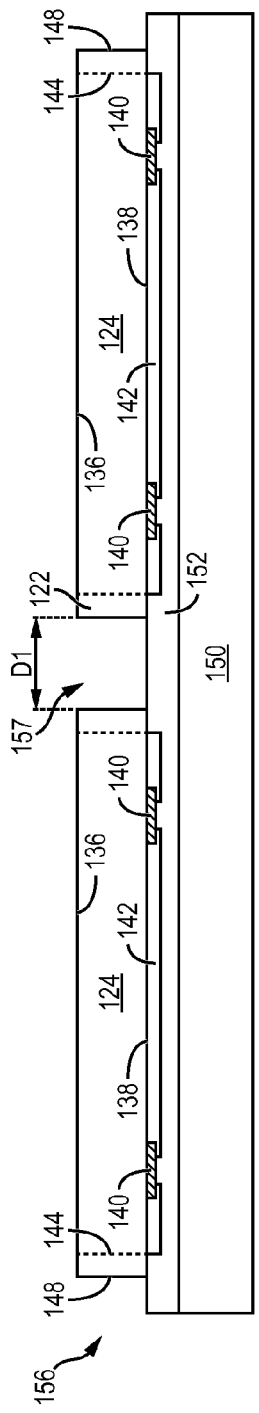

FIGS. 4a-4k illustrate, in relation to FIGS. 1 and 2a-2c, a process of forming a fan-in reconstituted or embedded wafer level chip scale packages (eWLCSP). FIG. 4a shows a cross-sectional view of a portion of semiconductor wafer 120. Each semiconductor die 124 has a back or non-active surface 136 and active surface 138 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 138 to implement analog circuits or digital circuits, such as DSP, ASIC, memory, or other signal processing circuit. Semiconductor die 124 may also contain IPDs, such as inductors, capacitors, and resistors, for RF signal processing.

An electrically conductive layer 140 is formed over active surface 138 using PVD, CVD, electrolytic plating, electroless plating process, or other suitable metal deposition process. Conductive layer 140 can be one or more layers of Al, Cu, Sn, Ni, Au, Ag, or other suitable electrically conductive material. Conductive layer 140 operates as contact pads electrically connected to the circuits on active surface 138. Conductive layer 140 can be formed as contact pads disposed side-by-side a first distance from edge or sidewall 144 of semiconductor die 124, as shown in FIG. 4a. Alternatively, conductive layer 140 can be formed as contact pads that are offset in multiple rows such that a first row of contact pads is disposed a first distance from edge 144 of semiconductor die 124, and a second row of contact pads alternating with the first row is disposed a second distance from edge 144 of semiconductor die 124.

A first insulating or passivation layer 142 is formed over semiconductor die 124 and conductive layer 140 using PVD, CVD, printing, spin coating, spray coating, sintering or thermal oxidation. Insulating layer 142 contains one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), polymer, or other dielectric material having similar structural and insulating properties. In one embodiment, insulating layer 142 is a low temperature curing photosensitive dielectric polymer with or without insulating fillers cured at less than 200 degrees Celsius (° C.). Insulating layer 142 covers and provides protection for active surface 138. Insulating layer 142 is conformally applied over conductive layer 140 and active surface 138 of semiconductor die 124 and does not extend over edges or sidewalls 144 of semiconductor die 124 or beyond a footprint of semiconductor die 124. In other words, a peripheral region of semiconductor die 124 adjacent to semiconductor die 124 is devoid of insulating layer 142. A portion of insulating layer 142 is removed by LDA using laser 145 or an etching process through a patterned photoresist layer to expose conductive layer 140 through insulating layer 142 and provides for subsequent electrical interconnect.

Semiconductor wafer 120 undergoes electrical testing and inspection as part of a quality control process. Manual visual inspection and automated optical systems are used to perform inspections on semiconductor wafer 120. Software can be used in the automated optical analysis of semiconductor wafer 120. Visual inspection methods may employ equipment such as a scanning electron microscope, high-intensity or ultra-violet light, or metallurgical microscope. Semiconductor wafer 120 is inspected for structural characteristics including warpage, thickness variation, surface particulates, irregularities, cracks, delamination, and discoloration.

The active and passive components within semiconductor die 124 undergo testing at the wafer level for electrical performance and circuit function. Each semiconductor die 124 is tested for functionality and electrical parameters using a probe or other testing device. A probe is used to make electrical contact with nodes or contact pads 140 on each semiconductor die 124 and provides electrical stimuli to the contact pads. Semiconductor die 124 responds to the electrical stimuli, which is measured and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 120 enables semiconductor die 124 that pass to be designated as known good die (KGD) for use in a semiconductor package.

In FIG. 4b, semiconductor wafer 120 is singulated through saw streets 126 using a saw blade or laser cutting tool 146 along sidewalls or side surfaces 148 of base substrate material 122 into individual semiconductor die 124. Semiconductor wafer 120 is singulated along a portion of base substrate material 122 within saw street area 126 with a thin cut along base substrate side surface 148 to allow a portion of base substrate material 122 to remain disposed on sidewalls 144 of semiconductor die 124. The thin cut slightly oversizes semiconductor die 124 by a distance D between semiconductor sidewall 144 and along base substrate side surface 148. Base substrate material 122 over sidewall 144 of semiconductor die 124 strengthens the device during reconstitution and a later singulation process by reducing dielectric material cracking.

In one embodiment, distance D between sidewall 144 and base substrate side surface 148 is at least 10 micrometers (μm). In another embodiment, distance D between sidewall 144 and base substrate side surface 148 ranges from 14-36 μm. Similarly, semiconductor wafer 128 is singulated through saw streets 134 using a saw blade or laser cutting tool 146 into individual semiconductor die 132. Individual semiconductor die 124 and 132 can be inspected and electrically tested for identification of KGD post singulation.

FIG. 4c shows a cross-sectional view of a portion of a carrier or temporary substrate 150 containing sacrificial base material such as silicon, polymer, beryllium oxide, glass, or other suitable low-cost, rigid material for structural support. An interface layer or double-sided tape 152 is formed over carrier 150 as a temporary adhesive bonding film, etch-stop layer, or thermal release layer.

Carrier 150 is a standardized carrier with capacity for multiple semiconductor die and can accommodate semiconductor die of multiple sizes singulated from semiconductor wafers having any diameter. For example, carrier 150 can be a round panel with a diameter of 305 mm or greater or can be a rectangular panel with a length of 300 mm or greater and a width of 300 mm or greater. Carrier 150 may have a larger surface area than the surface area of semiconductor wafer 120 or 128. In one embodiment, semiconductor wafer 120 has a diameter of 300 mm and contains semiconductor die 124 which have a length of 10 mm and a width of 10 mm. In one embodiment, semiconductor wafer 128 has a diameter of 200 mm and contains semiconductor 132 which have a length of 5 mm and a width of 5 mm. Carrier 150 can accommodate 10 mm by 10 mm semiconductor die 124 and 5 mm by 5 mm semiconductor die 132. Carrier 150 carries a greater quantity of 5 mm by 5 mm semiconductor die 132 than a quantity of 10 mm by 10 mm semiconductor die 124. In another embodiment, semiconductor die 124 and 132 have the same dimensions. Carrier 150 is standardized in size and shape to accommodate any size semiconductor die. A larger carrier reduces the manufacturing cost of the semiconductor package as more semiconductor die can be processed on the larger carrier thereby reducing the cost per unit.

Semiconductor packaging and processing equipment are designed and configured for the size of the semiconductor die and carrier being processed. To further reduce manufacturing costs, the size of carrier 150 is selected independent of the size of semiconductor die 124 or 132 and independent of the size of semiconductor wafers 120 and 128. That is, carrier 150 has a fixed or standardized size, which can accommodate various sizes of semiconductor die 124 and 132 singulated from one or more semiconductor wafers 120 or 128. In one embodiment, carrier 150 is circular with a diameter of 330 mm. In another embodiment, carrier 150 is rectangular with a width of 560 mm and length of 600 mm.

The size and dimensions of the standardized carrier, carrier 150, is selected during the design of the processing equipment in order to develop a manufacturing line that is uniform for all back-end semiconductor manufacturing of semiconductor devices. Carrier 150 remains constant in size regardless of the size and type of semiconductor packages to be manufactured. For example, semiconductor die 124 may have dimensions of 10 mm by 10 mm and are placed on standardized carrier 150. Alternatively, semiconductor die 124 may have dimensions of 20 mm by 20 mm and are placed on the same standardized carrier 150. Accordingly, standardized carrier 150 can handle any size semiconductor die 124 and 132, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 150 lowers manufacturing costs and capital risk by reducing or eliminating the need for specialized semiconductor processing lines based on die size or incoming wafer size. By selecting a predetermined carrier size to use for any size semiconductor die from all semiconductor wafers, a flexible manufacturing line can be implemented.

In FIG. 4d, semiconductor die 124 from FIG. 4b are mounted to carrier 150 and interface layer 152 using, for example, a pick and place operation with insulating layer 142 oriented toward carrier 150. Semiconductor die 124 are mounted to interface layer 152 of carrier 150 to form reconstituted or reconfigured wafer 156. In one embodiment, insulating layer 142 is embedded within interface layer 152. For example, active surface 138 of semiconductor die 124 may be coplanar with surface 154 of interface layer 152. In another embodiment, insulating layer 142 is mounted over interface layer 152 such that active surface 138 of semiconductor die 124 is offset from interface layer 152.

FIG. 4e shows semiconductor die 123 mounted to interface layer 152 of carrier 150 to form reconstituted or reconfigured wafer 156. Reconstituted wafer 156 can be processed into many types of semiconductor packages, including fan-in wafer level chip scale packages (WLCSP), eWLCSP, fan-out WLCSP, flipchip packages, three dimensional (3D) packages, such as package-on-package (PoP), or other semiconductor packages. In one embodiment, semiconductor die 124 are placed on carrier 150 in a high-density arrangement, i.e., 300 μm apart or less, for processing fan-in devices. Semiconductor die 124 are placed onto carrier 150 separated by a gap 157 with distance D1 between semiconductor die 124. Distance D1 between semiconductor die 124 is selected based on the design and specifications of the semiconductor package to be processed. In one embodiment, distance D1 between semiconductor die 124 is 50 μm or less. In another embodiment, distance D1 between semiconductor die 124 is 100 μm or less. Distance D1 between semiconductor die 124 on carrier 150 is optimized for manufacturing the semiconductor packages at the lowest unit cost.

Figure 4F:
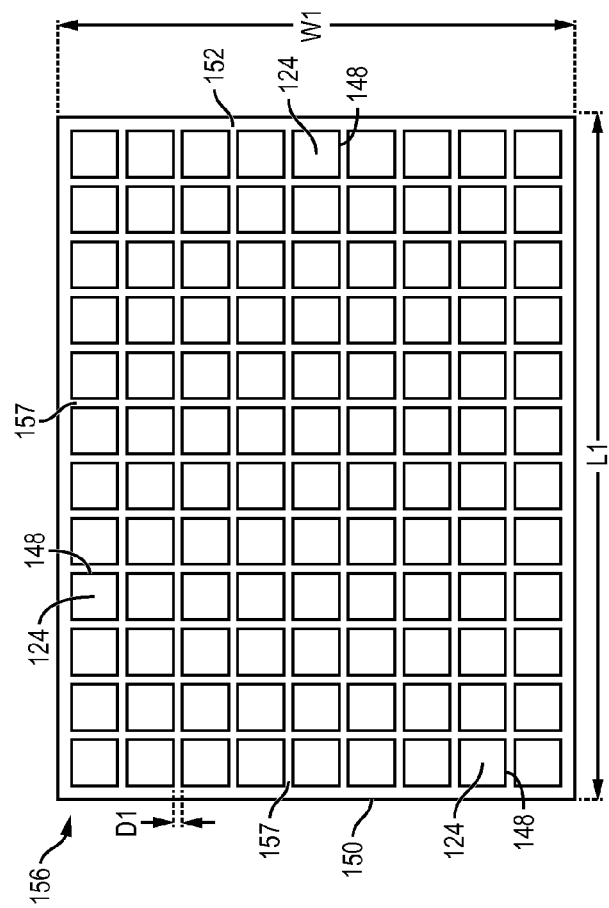

FIG. 4f shows a plan view of reconstituted wafer 156 with semiconductor die 124 mounted to or disposed over carrier 150. Carrier 150 is a standardized shape and size, and therefore constitutes a standardized carrier. Carrier 150 has capacity for various sizes and quantities of semiconductor die, which are singulated from various sizes of semiconductor wafers. In one embodiment, carrier 150 is rectangular in shape and has a width W1 of 560 mm and a length L1 of 600 mm. In another embodiment, carrier 150 is rectangular in shape and has a width W1 of 330 mm and a length L1 of 330 mm. In another embodiment, carrier 150 is round in shape and has a diameter of 330 mm.

The number of semiconductor die 124 disposed over carrier 150 depends on the size of semiconductor die 124 and distance D1 between semiconductor die 124 within the structure of reconstituted wafer 156. The number of semiconductor die 124 mounted to carrier 150 can be greater than, less than, or equal to the number of semiconductor die 124 singulated from semiconductor wafer 120. The larger surface area of carrier 150 accommodates more semiconductor die 124 and lowers manufacturing cost as more semiconductor die 124 are processed per reconstituted wafer 156. In one example, semiconductor wafer 120 has a diameter of 300 mm with a quantity of approximately 600 individual 10 mm by 10 mm semiconductor die 124 formed on semiconductor wafer 120. Semiconductor die 124 are singulated from one or more semiconductor wafers 120. Carrier 150 is prepared, for example, with a standard width W1 of 560 mm and a standard length L1 of 600 mm. Carrier 150 with a width W1 of 560 mm is sized to accommodate a quantity of approximately 54 semiconductor die 124, with dimensions of 10 mm by 10 mm and spaced a distance D1 of 200 μm apart, across width W1 of carrier 150. Carrier 150 with a length L1 of 600 mm is sized to accommodate a quantity of approximately 58 semiconductor die 124, with dimensions of 10 mm by 10 mm spaced a distance D1 of 200 μm apart, across length L1 of carrier 150. Accordingly, the surface area of carrier 150, width W1 multiplied by length L1, accommodates a quantity of approximately 3,000 semiconductor die 124 with dimensions of 10 mm by 10 mm and a gap or distance D1 of 200 μm between semiconductor die 124. Semiconductor die 124 can be placed on carrier 150 with a gap or distance D1 of less than 200 μm between semiconductor die 124 to increase the density of semiconductor die 124 on carrier 150 and further reduce the cost of processing semiconductor die 124.

Automated pick and place equipment is used to prepare reconstituted wafer 156 based on the quantity and size of semiconductor die 124 and based on the dimensions of carrier 150. For example, semiconductor die 124 is selected with dimensions of 10 mm by 10 mm. Carrier 150 has standard dimensions, for example, 560 mm width W1 and 600 mm length L1. Automated equipment is programmed with the dimensions of semiconductor die 124 and carrier 150 in order to process reconstituted wafer 156. After singulating semiconductor wafer 120, a first semiconductor die 124 is selected by the automated pick and place equipment. A first semiconductor die 124 is mounted to carrier 150 in a position on carrier 150 determined by the programmable automated pick and place equipment. A second semiconductor die 124 is selected by the automated pick and place equipment, placed on carrier 150, and positioned in a first row on carrier 150. Distance D1 between adjacent semiconductor die 124 is programmed into the automated pick and place equipment and is selected based on the design and specifications of the semiconductor package to be processed. In one embodiment, gap 157 or distance D1 between adjacent semiconductor die 124 on carrier 150 is 200 μm. A third semiconductor die 124 is selected by the automated pick and place equipment, placed on carrier 150, and positioned in the first row on carrier 150. The pick and place operation is repeated until a first row of approximately 54 semiconductor die 124 is disposed across width W1 of carrier 150.

Another semiconductor die 124 is selected by the automated pick and place equipment, placed on carrier 150, and positioned in a second row adjacent to the first row on carrier 150. Distance D1 between adjacent rows of semiconductor die 124 is preselected and programmed into the automated pick and place equipment. In one embodiment, distance D1 between a first row of semiconductor die 124 and a second row of semiconductor die 124 is 200 μm. The pick and place operation is repeated until approximately 58 rows of semiconductor die 124 are disposed across length L1 of carrier 150. The standardized carrier, carrier 150 with width W1 of 560 mm and length L1 of 600 mm, accommodates approximately 54 columns and 58 rows of 10 mm by 10 mm semiconductor die 124 for a total quantity of approximately 3,000 semiconductor die 124 disposed on carrier 150. The pick and place operation is repeated until carrier 150 is partially or completely populated with semiconductor die 124. With a standardized carrier, such as carrier 150, the automated pick and place equipment can mount any size semiconductor die 124 on carrier 150 to form reconstituted wafer 156. Reconstituted wafer 156 can subsequently be processed using back-end processing equipment that is standardized for carrier 150.

Figure 4G:
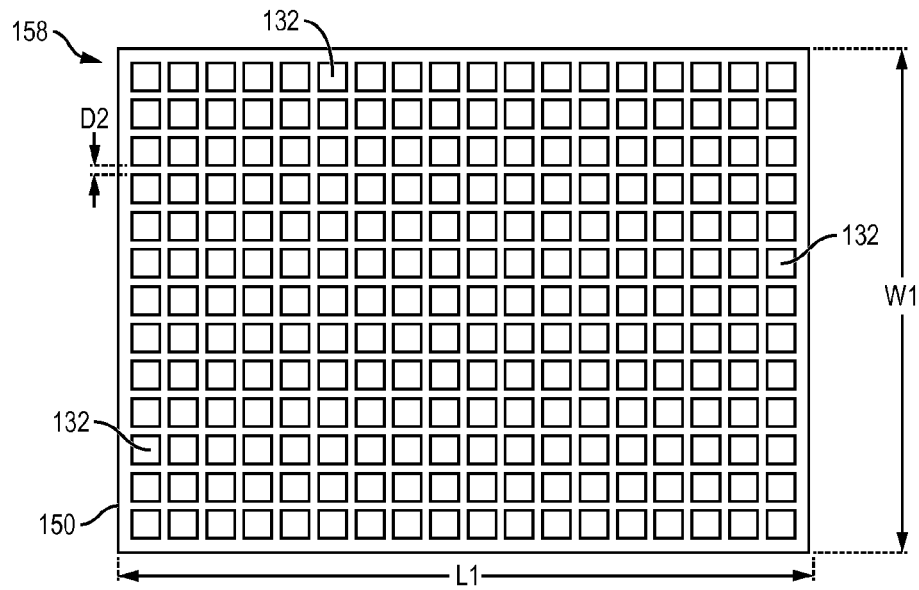

FIG. 4g shows a plan view of reconstituted wafer 158 with semiconductor die 132 mounted to or disposed over carrier 150. The same standardized carrier 150, or a standardized carrier with the same size as carrier 150, is used to process reconstituted wafer 158 as was used to process reconstituted wafer 156. Any configuration of semiconductor die on a reconstituted wafer can be supported by carrier 150. The number of semiconductor die 132 disposed over carrier 150 depends on the size of semiconductor die 132 and distance D2 between semiconductor die 132 within the structure of reconstituted wafer 158. The number of semiconductor die 132 mounted to carrier 150 can be greater than, less than, or equal to the number of semiconductor die 132 singulated from semiconductor wafer 128. The larger surface area of carrier 150 accommodates more semiconductor die 132 and lowers manufacturing cost as more semiconductor die 132 are processed per reconstituted wafer 158.

In one example, semiconductor wafer 128 has a diameter of 200 mm with a quantity of approximately 1,000 individual 5 mm by 5 mm semiconductor die 132 formed on semiconductor wafer 128. Semiconductor die 132 are singulated from one or more semiconductor wafers 128. Carrier 150 is prepared, for example, with a standard width W1 of 560 mm and a standard length L1 of 600 mm. Carrier 150 with a width W1 of 560 mm is sized to accommodate a quantity of approximately 107 semiconductor die 132, with dimensions of 5 mm by 5 mm spaced a distance D2 of 200 μm apart, across width W1 of carrier 150. Carrier 150 with a length L1 of 600 mm is sized to accommodate a quantity of approximately 115 semiconductor die 132, with dimensions of 5 mm by 5 mm spaced a distance D2 of 200 μm apart, across length L1 of carrier 150. Accordingly, the surface area of carrier 150, width W1 multiplied by length L1, accommodates approximately 12,000 semiconductor die 132 with dimensions of 5 mm by 5 mm spaced a distance D2 of 200 μm apart. Semiconductor die 132 can be placed on carrier 150 with a gap or distance D2 of less than 200 μm between semiconductor die 132 to increase the density of semiconductor die 132 on carrier 150 and further reduce the cost of processing semiconductor die 132.

Automated pick and place equipment is used to prepare reconstituted wafer 158 based on the quantity and size of semiconductor die 132 and based on the dimensions of carrier 150. For example, semiconductor die 132 is selected with dimensions of 5 mm by 5 mm. Carrier 150 has standard dimensions, for example, 560 mm width W1 and 600 mm length L1. Automated equipment is programmed with the dimensions of semiconductor die 132 and carrier 150 in order to process reconstituted wafer 158. After singulating semiconductor wafer 128, a first semiconductor die 132 is selected by the automated pick and place equipment. A first semiconductor die 132 is mounted to carrier 150 in a position on carrier 150 determined by the programmable automated pick and place equipment. A second semiconductor die 132 is selected by the automated pick and place equipment, placed on carrier 150, and positioned in a first row on carrier 150. Distance D2 between adjacent semiconductor die 132 is programmed into the automated pick and place equipment and is selected based on the design and specifications of the semiconductor package to be processed. In one embodiment, the gap or distance D2 between adjacent semiconductor die 132 on carrier 150 is 200 μm. A third semiconductor die 132 is selected by the automated pick and place equipment, placed on carrier 150, and positioned in the first row on carrier 150. The pick and place operation is repeated until a row of approximately 107 semiconductor die 132 is disposed across width W1 of carrier 150.

Another semiconductor die 132 is selected by the automated pick and place equipment, placed on carrier 150, and positioned in a second row adjacent to the first row on carrier 150. Distance D2 between adjacent rows of semiconductor die 132 is preselected and programmed into the automated pick and place equipment. In one embodiment, distance D2 between a first row of semiconductor die 132 and a second row of semiconductor die 132 is 200 μm. The pick and place operation is repeated until approximately 115 rows of semiconductor die 132 are disposed across length L1 of carrier 150. The standardized carrier, carrier 150 with width W1 of 560 mm and length L1 of 600 mm, accommodates approximately 107 columns and 115 rows of 5 mm by 5 mm semiconductor die 132 for a total quantity of approximately 12,000 semiconductor die 132 disposed on carrier 150. The pick and place operation is repeated until carrier 150 is partially or completely populated with semiconductor die 132. With a standardized carrier, such as carrier 150, the automated pick and place equipment can mount any size semiconductor die on carrier 150 to form reconstituted wafer 158. Reconstituted wafer 158 can be processed using the same carrier 150 and same back-end processing equipment as was used to process reconstituted wafer 156.

Both reconstituted wafer 156 from FIG. 4f and reconstituted wafer 158 from FIG. 4g use the same carrier 150 or use a carrier having the same standardized size for both reconstituted wafers 156 and 158. The processing equipment designed for back-end processing of the reconstituted wafers is standardized for carrier 150 and is capable of processing any configuration of reconstituted wafer formed on carrier 150 and any size semiconductor die placed on carrier 150. Because both reconstituted wafers 156 and 158 use the same standardized carrier 150, the reconstituted wafers can be processed on the same manufacturing line. Accordingly, a purpose of the standardized carrier, carrier 150, is to simplify the equipment needed to manufacture semiconductor packages.

In another example, reconstituted wafer 158 includes semiconductor die 124 and 132 where each semiconductor die 124 and 132 has the same dimensions, and the semiconductor die originate from semiconductor wafers 120 and 128 which have different diameters. Semiconductor wafer 120 has a diameter of 450 mm with a quantity of approximately 2,200 individual 8 mm by 8 mm semiconductor die 124 formed on semiconductor wafer 120. Semiconductor die 124 having dimensions of 8 mm by 8 mm singulated from one or more semiconductor wafers 120. Semiconductor wafer 128 has a diameter of 300 mm with a quantity of approximately 900 individual 8 mm by 8 mm semiconductor die 132 formed on semiconductor wafer 128. Semiconductor die 132 are singulated from semiconductor wafer 128. Carrier 150 is prepared, for example, with a standard width W1 of 560 mm and a standard length L1 of 600 mm. Carrier 150 with a width W1 of 560 mm is sized to accommodate a quantity of approximately 69 semiconductor die 124 or 132, with dimensions of 8 mm by 8 mm spaced a distance D1 or D2 of 100 μm apart, across width W1 of carrier 150. Carrier 150 with a length L1 of 560 mm is sized to accommodate a quantity of approximately 74 semiconductor die 124 or 132, with dimensions of 8 mm by 8 mm spaced a distance D1 or D2 of 100 μm apart, across length L1 of carrier 150. The surface area of carrier 150, width W1 multiplied by length L1, accommodates approximately 5,000 semiconductor die 124 or 132 with dimensions of 8 mm by 8 mm spaced a distance D1 or D2 of 100 μm apart. Semiconductor die 124 and 132 can be placed on carrier 150 with a gap or distance D1 or D2 of less than 100 μm between semiconductor die 124 or 132 to increase the density of semiconductor die 124 and 132 on carrier 150 and further reduce the cost of processing semiconductor die 124 and 132.

Automated pick and place equipment is used to prepare reconstituted wafer 158 based on the quantity and size of semiconductor die 124 and 132 and based on the dimensions of carrier 150. After singulating semiconductor wafer 128, a first semiconductor die 124 or 132 is selected by the automated pick and place equipment. 8 mm by 8 mm semiconductor die 124 or 132 can originate from either semiconductor wafer 120, having a 450 mm diameter, or from semiconductor wafer 128, having a 300 mm diameter. Alternatively, the 8 mm by 8 mm semiconductor die can originate from another semiconductor wafer having a different diameter. A first semiconductor die 124 or 132 is mounted to carrier 150 in a position on carrier 150 determined by the programmable automated pick and place equipment. A second semiconductor die 124 or 132 is selected by the automated pick and place equipment, placed on carrier 150, and positioned in a first row on carrier 150. Distance D1 or D2 between adjacent semiconductor die 124 or 132 is programmed into the automated pick and place equipment and is selected based on the design and specifications of the semiconductor package to be processed. In one embodiment, gap 157 or distance D1 or D2 between adjacent semiconductor die 124 or 132 on carrier 150 is 100 μm. The pick and place operation is repeated until a row of approximately 69 semiconductor die 124 or 132 is disposed across width W1 of carrier 150.

Another semiconductor die 124 or 132 is selected by the automated pick and place equipment, placed on carrier 150, and positioned in a second row adjacent to the first row on carrier 150. In one embodiment, distance D1 or D2 between a first row of semiconductor die 124 or 132 and a second row of semiconductor die 124 or 132 is 100 μm. The pick and place operation is repeated until approximately 74 rows of semiconductor die 124 or 132 are disposed across length L1 of carrier 150. The standardized carrier, carrier 150 with width W1 of 560 mm and length L1 of 600 mm, accommodates approximately 69 columns and 74 rows of 8 mm by 8 mm semiconductor die 124 and 132 for a total quantity of approximately 5,000 semiconductor die 124 disposed on carrier 150. The pick and place operation is repeated until carrier 150 is partially or completely populated with semiconductor die 124 or 132. Therefore, reconstituted wafer 158 may include semiconductor die 124 and 132 singulated from any size semiconductor wafer. The size of carrier 150 is independent of the size of semiconductor die 124 and 132 and is independent of the size of semiconductor wafers 120 and 128. Reconstituted wafer 158 can be processed using the same carrier 150 and same back-end processing equipment as was used to process reconstituted wafer 156. For reconstituted wafers having the same size semiconductor die singulated from different size incoming wafers, standardized carrier 150 allows the same materials to be used for each reconstituted wafer. Therefore, the bill of materials for a reconstituted wafer 156 or 158 on carrier 150 remains constant. A consistent and predictable bill of materials allows for improved cost analysis and planning for semiconductor packaging.

In another embodiment, a reconstituted wafer 158 contains a variety of semiconductor die sizes disposed on carrier 150. For example, 10 mm by 10 mm semiconductor die 124 are mounted to carrier 150, and 5 mm by 5 mm semiconductor die 132 are mounted to carrier 150 to form reconstituted wafer 158. The reconstituted wafer contains multiple sizes of semiconductor die on the same reconstituted wafer. In other words, a portion of reconstituted wafer 158 contains one size semiconductor die and another portion of the reconstituted wafer contains another size semiconductor die. Reconstituted wafer 158 containing different sizes of semiconductor die 124 and 132 simultaneously on carrier 150 is processed using the same back-end processing equipment as was used to process reconstituted wafer 156 with uniformly sized semiconductor die disposed over carrier 150.

In summary, carrier 150 has capacity for various sizes and quantities of semiconductor die, which are singulated from various sizes of semiconductor wafers. The size of carrier 150 does not vary with the size of semiconductor die being processed. The standardized carrier, carrier 150, is fixed in size and can accommodate multiple sizes of semiconductor die. The size of standardized carrier 150 is independent of the dimensions of the semiconductor die or semiconductor wafer. More small semiconductor die than larger semiconductor die can fit over carrier 150. The number of semiconductor die 124 or 132, which fit on carrier 150, varies with the size of semiconductor die 124 or 132 and space or distance D1 or D2 between semiconductor die 124 or 132. For example, carrier 150 having length L1 and width W1 accommodates a greater number of 5 mm by 5 mm semiconductor die 132 over the surface area of carrier 150 than a number of 10 mm by 10 mm semiconductor die 124 over the surface area of carrier 150. The size and shape of carrier 150 remains fixed and independent of the size of semiconductor die 124 or 132 or semiconductor wafer 120 or 128 from which semiconductor die 124 or 132 are singulated. Carrier 150 provides the flexibility to manufacture reconstituted wafers 156 and 158 into many different types of semiconductor packages with different size semiconductor die 124 and 132 from different sized semiconductor wafers 120 and 128 using a common set of processing equipment.

Figure 4H:
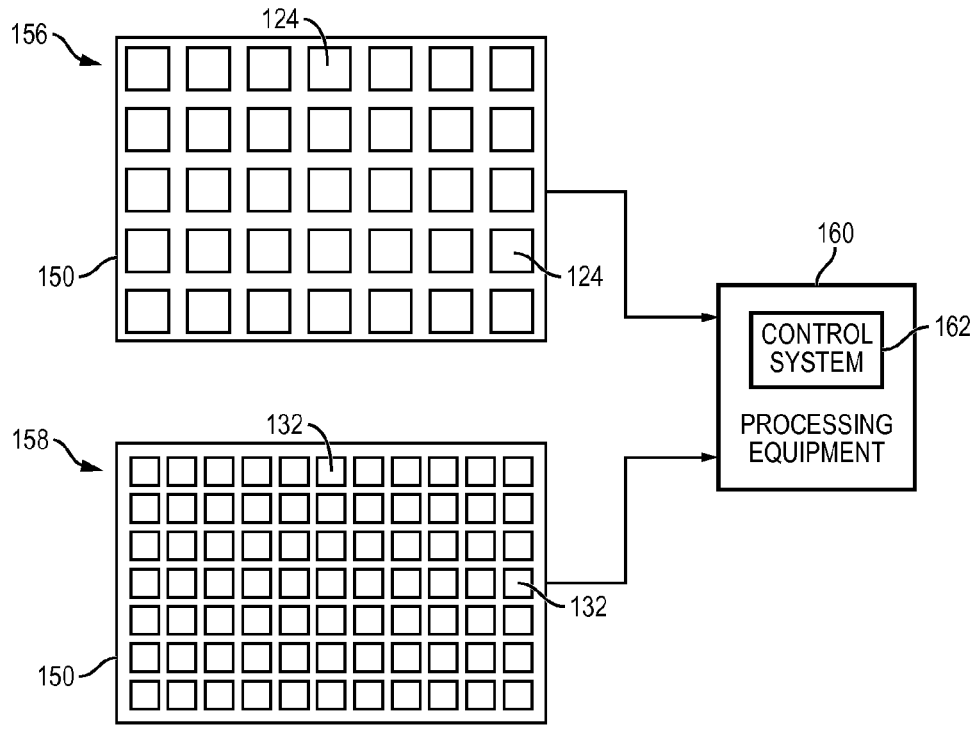

FIG. 4h shows a process of using carrier 150 to manufacture semiconductor packages. Processing equipment 160 is used to perform the back-end manufacturing processes on semiconductor die, such as deposition of encapsulant and insulating layers, deposition of conductive layers, bumping, reflowing, marking, singulation, and other back-end processes. Processing equipment 160 is designed for the size and shape of a standardized carrier, such as carrier 150. Processing equipment 160 is compatible with carrier 150, because the mechanical and electrical components of processing equipment 160 are customized for the standardized size and shape of carrier 150.

Processing equipment 160 is controlled by control system 162. Control system 162 can be a software program or algorithm used to configure processing equipment 160 according to the size and shape of the semiconductor die on carrier 150. Control system 162 is programmed and customized in order for processing equipment 160 to handle each different reconstituted wafer, such as reconstituted wafers 156 and 158, formed on standardized carrier 150.

By standardizing the dimensions of carrier 150, processing equipment 160 can remain constant, because the dimensions of carrier 150 do not change with variables of semiconductor die size and semiconductor wafer size. Control system 162 uses various algorithms for each reconstituted wafer on carrier 150. For example, control system 162 can be used to optimize the spacing during the initial pick and place operation of semiconductor die 124 on carrier 150. The specifications of reconstituted wafer 156 are inputted into control system 162. Control system 162 is programmed to control processing equipment 160 to pick individual semiconductor die 124 and place semiconductor die 124 onto carrier 150 a distance D1 apart to form reconstituted wafer 156. Reconstituted wafer 156 includes, for example, 10 mm by 10 mm semiconductor die 124 and standard dimensions of carrier 150, width W1 and length L1. Processing equipment 160 is configured with control system 162 to perform back-end processes on reconstituted wafer 156, which is on carrier 150. Control system 162 directs processing equipment 160 to perform deposition and other manufacturing steps according to the 10 mm by 10 mm size of semiconductor die 124 and standard size carrier 150.

Control system 162 allows processing equipment 160 to be customized for each reconstituted wafer on standardized carrier 150. Processing equipment 160 does not need to be re-built for a different size of semiconductor die. After processing reconstituted wafer 156, processing equipment 160 is ready to process another reconstituted wafer on carrier 150 with the same or different semiconductor die size and spacing. The specifications of reconstituted wafer 158 are inputted into control system 162. Control system 162 is programmed to control processing equipment 160 to pick individual semiconductor die 132 and place semiconductor die 132 onto carrier 150 a distance D2 apart to form reconstituted wafer 158. Reconstituted wafer 158 includes, for example, 5 mm by 5 mm semiconductor die 132 and standard dimensions of carrier 150, width W1 and length L1. Processing equipment 160 is configured with control system 162 to perform back-end processes on reconstituted wafer 158, which is on carrier 150. Control system 162 directs processing equipment 160 to perform deposition and other manufacturing steps according to the 5 mm by 5 mm size of semiconductor die 132 and standard size carrier 150.

Processing equipment 160 remains constant whether processing equipment 160 is processing reconstituted wafer 156 or 158, or other reconstituted wafer on standardized carrier 150. Control system 162 is programmable and processing equipment 160 is easily adaptable to any reconstituted wafer which uses carrier 150. Therefore, the mechanical and physical characteristics of processing equipment 160 are designed to accommodate the physical characteristics of standardized carrier 150, while processing equipment 160 is also programmable with control system 162 to perform manufacturing processes on any configuration of semiconductor die on carrier 150.

Processing equipment 160 is used for manufacturing a variety of semiconductor packages from a reconstituted wafer on carrier 150. For example, processing equipment 160 can be used to process reconstituted wafer 156 or 158 into fan-in WLCSP, reconstituted or eWLCSP, fan-out WLCSP, flipchip packages, 3D packages, such as PoP, or other semiconductor packages. Control system 162 is used to modify and control the operation of processing equipment 160 to perform back-end manufacturing steps according to the semiconductor package to be produced. Therefore, processing equipment 160 can be used to manufacture each semiconductor package described herein. Processing equipment 160 can be used across multiple product manufacturing lines which share the same size carrier 150. Accordingly, the cost associated with changes in the size of semiconductor die, the size of semiconductor wafer, and type of semiconductor package can be reduced. The risk of investment in processing equipment 160 is reduced, because the design of processing equipment 160 is simplified where carrier 150 is standardized.

In FIG. 4i, an encapsulant or molding compound 164 is deposited over semiconductor die 124 and carrier 150 using a paste printing, transfer molding, liquid encapsulant molding, vacuum lamination, spin coating, or other suitable applicator. Encapsulant 164 can be polymer composite material, such as epoxy resin with filler, epoxy acrylate with filler, or polymer with proper filler. Encapsulant 164 is non-conductive and environmentally protects the semiconductor device from external elements and contaminants. In another embodiment, encapsulant 164 is an insulating or dielectric layer which contains one or more layers of photosensitive low curing temperature dielectric resist, photosensitive composite resist, laminate compound film, insulation paste with filler, solder mask resist film, liquid or granular molding compound, polyimide, BCB, PBO, SiO2, Si3N4, SiON, Ta2O5, Al2O3, prepreg, or other dielectric material having similar insulating and structural properties deposited using printing, spin coating, spray coating, vacuum or pressure lamination with or without heat, or other suitable process. In one embodiment, encapsulant 164 is a low temperature curing photosensitive dielectric polymer with or without insulating fillers cured at less than 200° C.

In particular, encapsulant 164 is disposed along base substrate side surfaces 148. Encapsulant 164 also covers back surface 136 of semiconductor die 124. In one embodiment, encapsulant 164 is opaque and dark or black in color. Encapsulant 164 can be used for laser marking reconstituted wafer 156 for alignment and singulation. Encapsulant 164 can be thinned in a subsequent backgrinding step. Encapsulant 164 can also be deposited such that encapsulant 164 is coplanar with back surface 136 of semiconductor die 124 and does not cover back surface 136. A surface 168 of encapsulant 164 opposite backside surface 166 of encapsulant 164 is disposed over carrier 150 and interface layer 152 such that surface 168 of encapsulant 164 may be coplanar with active surface 138 of semiconductor die 124.

In FIG. 4j, carrier 150 and interface layer 152 are removed by chemical etching, mechanical peeling, chemical mechanical planarization (CMP), mechanical grinding, thermal bake, UV light, laser scanning, or wet stripping to expose insulating layer 142, conductive layer 140, and surface 168 of encapsulant 164.

An electrically conductive layer 170 is formed over insulating layer 142 and conductive layer 140 using a patterning and metal deposition process such as printing, PVD, CVD, sputtering, electrolytic plating, and electroless plating. Conductive layer 170 can be one or more layers of Al, Cu, Sn, titanium (Ti), Ni, Au, Ag, or other suitable electrically conductive material. A portion of conductive layer 170 extends horizontally along insulating layer 142 and parallel to active surface 138 of semiconductor die 124 to laterally redistribute the electrical interconnect to conductive layer 140. Conductive layer 170 operates as a redistribution layer (RDL) for the electrical signals of semiconductor die 124. Conductive layer 170 is formed over a footprint of semiconductor die 124 and does not extend beyond the footprint of semiconductor die 124 and over encapsulant 164. In other words, a peripheral region of semiconductor die 124 adjacent to semiconductor die 124 is devoid of conductive layer 170 such that encapsulant 164 remains exposed. In one embodiment, conductive layer 170 is formed a distance D3 from sidewall 144 of semiconductor die 124, and distance D3 is at least 1 μm. A portion of conductive layer 170 is electrically connected to conductive layer 140. Other portions of conductive layer 170 are electrically common or electrically isolated depending on the connectivity of semiconductor die 124.

In FIG. 4k, an insulating or passivation layer 172 is formed over insulating layer 142 and conductive layer 170 using PVD, CVD, printing, spin coating, spray coating, screen printing or lamination. Insulating layer 172 can be one or more layers of SiO2, Si3N4, SiON, Ta2O5, Al2O3, or other material having similar insulating and structural properties. In one embodiment, insulating layer 172 is a photosensitive dielectric polymer low-cured at less than 200° C. In one embodiment, insulating layer 172 is formed within the footprint of semiconductor die 124 and does not extend beyond the footprint of semiconductor die 124 over encapsulant 164. In other words, a peripheral region of semiconductor die 124 adjacent to semiconductor die 124 is devoid of insulating layer 172 such that encapsulant 164 remains exposed. In another embodiment, insulating layer 172 is formed over insulating layer 142, semiconductor die 124, and encapsulant 164. A portion of insulating layer 172 is removed by an etching process with a patterned photoresist layer or by LDA to form openings to expose conductive layer 170.

An electrically conductive bump material is deposited over conductive layer 170 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, lead (Pb), Bi, Cu, solder, and combinations thereof, with an optional flux solution. For example, the bump material can be eutectic Sn/Pb, high-lead solder, or lead-free solder. The bump material is bonded to conductive layer 170 using a suitable attachment or bonding process. In one embodiment, the bump material is reflowed by heating the material above its melting point to form balls or bumps 174. In some applications, bumps 174 are reflowed a second time to improve electrical contact to conductive layer 170. Bumps 174 can also be compression bonded or thermocompression bonded to conductive layer 170. Bumps 174 represent one type of interconnect structure that can be formed over conductive layer 170. The interconnect structure can also use bond wires, conductive paste, stud bump, micro bump, or other electrical interconnect. Laser marking can be performed before or after bump formation, or after removal of carrier 150.

Collectively, insulating layers 172, conductive layer 170 and bumps 174 constitute a build-up interconnect structure 176 formed over semiconductor die 124 and within a footprint of semiconductor die 124. A peripheral region of semiconductor die 124 adjacent to semiconductor die 124 is devoid of interconnect structure 176 such that encapsulant 164 remains exposed. Build-up interconnect structure 176 may include as few as one RDL or conductive layer, such as conductive layer 170, and one insulating layer, such as insulating layer 172. Additional insulating layers and RDLs can be formed over insulating layer 172 prior to forming bumps 174, to provide additional vertical and horizontal electrical connectivity across the package according to the design and functionality of semiconductor die 124.

In FIG. 4l, semiconductor die 124 are singulated with saw blade or laser cutting tool 180 into individual eWLCSP 182. Reconstituted wafer 156 is singulated through encapsulant 164 and base substrate material 122 along side surface 184 to remove encapsulant 164 from the sides of semiconductor die 124 and to remove a portion of base substrate material 122 from the sides of semiconductor die 124. Therefore, base substrate material 122 is cut or singulated twice during the formation of eWLCSP 182, once at the wafer-level and once at the reconstituted wafer-level. As a result, the dielectric materials are less prone to cracking and the reliability of eWLCSP 182 is improved.

A portion of base substrate material 122 remains disposed along the sides of semiconductor die 124 after singulation. The thickness of base substrate material 122 adjacent to semiconductor die 124 is at least 1 µm. In other words, a distance D4 between side surface 184 and sidewalls 144 of semiconductor die 124 is at least 1 µm. eWLCSP 182 undergoes electrical testing before or after singulation.

FIG. 4m shows eWLCSP 182 after singulation having encapsulant covering back surface 136 of semiconductor die 124. Semiconductor die 124 is electrically connected through conductive layers 140 and 170 to bumps 174 for external interconnect through interconnect structure 176. Interconnect structure 176 does not extend beyond a footprint of semiconductor die 124 and thus forms a fan-in package. Encapsulant 164 remains over back surface 136 of semiconductor die 124. Encapsulant 164 over back surface 136 of semiconductor die 124 eliminates the need for a backside protection layer or backside laminate, thereby reducing the cost of eWLCSP 182. Encapsulant 164 is completely removed from the sides of semiconductor die 124 during singulation to expose side surfaces 184 of base substrate material 122. In one embodiment, eWLCSP 182 has dimensions of approximately 4.445 mm in length×3.875 mm in width with a pitch of 0.35-0.50 mm for bumps 174. In another embodiment, eWLCSP 182 can be formed with a length of 14 mm and a width of 14 mm. eWLCSP 182 is manufactured by forming a reconstituted wafer on standardized carrier 150 using equipment designed for a single standardized carrier size, which reduces equipment and material costs for eWLCSP 182. eWLCSP 182 is manufactured at a higher volume using standardized carrier 150, thereby simplifying the manufacturing process and reducing unit cost.

FIG. 5 shows an eWLCSP 190 with exposed back surface 136 and sidewalls 184. Semiconductor die 124 is electrically connected through conductive layers 140 and 170 to bumps 174 for external interconnect through interconnect structure 176. Interconnect structure 176 does not extend beyond a footprint of semiconductor die 124 and thus forms a fan-in package. Encapsulant 164 is completely removed from back surface 136 of semiconductor die 124 during a grinding operation. Encapsulant 164 is completely removed from the sides of semiconductor die 124 during singulation to expose side surfaces 184 of base substrate material 122. In one embodiment, eWLCSP 190 has dimensions of approximately 4.4 mm in length×3.9 mm in width with a pitch of 0.35-0.50 mm for bumps 174. eWLCSP 190 is manufactured by forming a reconstituted wafer on standardized carrier 150 using equipment designed for a single standardized carrier size, which reduces equipment and material costs for eWLCSP 190. eWLCSP 190 is manufactured at a higher volume using standardized carrier 150, thereby simplifying the manufacturing process and reducing unit cost.

FIG. 6 shows an alternative eWLCSP 192 with under bump metallization (UBM) 194, backside protection layer 196, and exposed side surfaces 184. An electrically conductive layer 194 is formed over the exposed portion of conductive layer 170 and over insulating layer 172 after final repassivation using PVD, CVD, evaporation, electrolytic plating, electroless plating, or other suitable metal deposition process. Conductive layer 194 can be Al, Cu, Sn, Ni, Au, Ag, W, or other suitable electrically conductive material. Conductive layer 194 is a UBM electrically connected to conductive layers 170 and 140. UBMs 194 can be a multi-metal stack with adhesion layer, barrier layer, and seed or wetting layer. The adhesion layer is formed over conductive layer 170 and can be Ti, titanium nitride (TiN), titanium tungsten (TiW), Al, or chromium (Cr). The barrier layer is formed over the adhesion layer and can be Ni, NiV, platinum (Pt), palladium (Pd), TiW, Ti, or chromium copper (CrCu). The barrier layer inhibits the diffusion of Cu into active surface 138 of semiconductor die 124. The seed layer is formed over the barrier layer and can be Cu, Ni, NiV, Au, or Al. UBMs 194 provide a low resistive interconnect to conductive layer 170, as well as a barrier to solder diffusion and seed layer for solder wettability.

Semiconductor die 124 is electrically connected through conductive layers 140, 170, and 194 to bumps 174 for external interconnect through interconnect structure 176. Conductive layers 170 and 194 and insulating layers 142 and 172 do not extend beyond a footprint of semiconductor die 124 and thus forms a fan-in package. Backside insulating layer or backside protection layer 196 is formed over back surface 136 of semiconductor die 124 for mechanical protection and protection from degradation due to exposure to photons from light or other emissions. Backside protection layer 196 contains one or more layers of photosensitive low curing temperature dielectric resist, photosensitive composite resist, laminate compound film, resin matrix composite sheet with filler or glass fiber cloth, resin matrix composite sheet with both filler and glass fiber cloth, insulation paste with filler, solder mask resist film, liquid molding compound, granular molding compound, polyimide, BCB, PBO, SiO2, Si3N4, SiON, Ta2O5, Al2O3, prepreg, or other dielectric material having similar insulating and structural properties. Backside protection layer 196 is deposited using printing, spin coating, spray coating, vacuum or pressure lamination with or without heat, or other suitable process. In one embodiment, backside protection layer 196 is a low temperature curing photosensitive dielectric polymer with or without insulating fillers cured at less than 200° C. Backside protection layer 196 provides mechanical protection for semiconductor die 124 and protection from light. In one embodiment, backside protection layer 196 has a thickness ranging from approximately 5-150 μm. Alternatively, backside protection layer 196 is a metal layer, such as Cu foil, applied to a backside of eWLCSP 192. Backside protection layer 196 contacts back surface 136 of semiconductor die 124 to transfer heat from semiconductor die 124 and improve the thermal performance of the device.

Encapsulant 164 is completely removed from the sides of semiconductor die 124 during singulation to expose side surfaces 184 of base substrate material 122. In one embodiment, eWLCSP 192 has dimensions of approximately 4.4 mm in length×3.9 mm in width with a pitch of 0.35-0.50 mm for bumps 174. In another embodiment, eWLCSP 192 can be formed with a length of 14 mm and a width of 14 mm. eWLCSP 192 is manufactured by forming a reconstituted wafer on standardized carrier 150 using equipment designed for a single standardized carrier size, which reduces equipment and material costs for eWLCSP 192. eWLCSP 192 is manufactured at a higher volume using standardized carrier 150, thereby simplifying the manufacturing process and reducing unit cost.

Figure 7C:
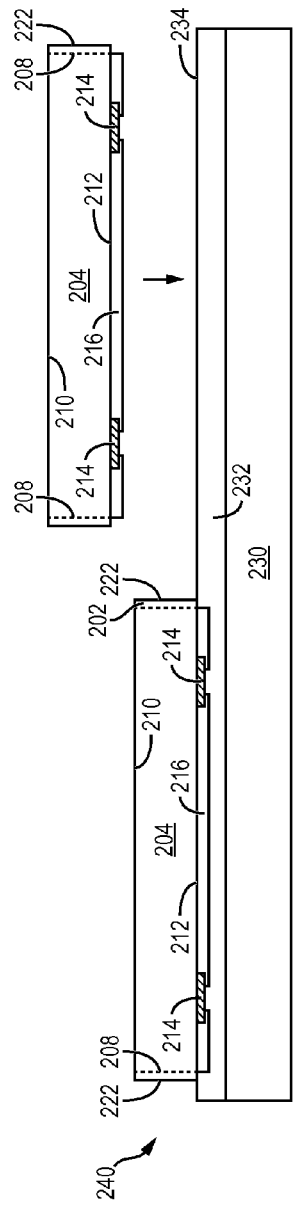

FIGS. 7a-7i illustrate, in relation to FIGS. 1 and 2a-2c, a process of forming a reconstituted or embedded fan-in WLCSP or eWLCSP having thin sidewall encapsulation. FIG. 7a shows a cross-sectional view of a portion of semiconductor wafer 200. Semiconductor wafer 200 includes a base substrate material 202, such as silicon, germanium, gallium arsenide, indium phosphide, or silicon carbide, for structural support. A plurality of semiconductor die or components 204 is formed on wafer 200 separated by a non-active, inter-die wafer area or saw street 206 as described above. Saw street 206 provides cutting areas to singulate semiconductor wafer 200 into individual semiconductor die 204. Semiconductor die 204 has edges or sidewalls 208. In one embodiment, semiconductor wafer 200 is 200-300 mm in diameter. In another embodiment, semiconductor wafer 200 is 100-450 mm in diameter. Semiconductor wafer 200 may have any diameter prior to singulating semiconductor wafer into individual semiconductor die 204.

Each semiconductor die 204 has a back or non-active surface 210 and active surface 212 containing analog or digital circuits implemented as active devices, passive devices, conductive layers, and dielectric layers formed within semiconductor die 204 and electrically interconnected according to the electrical design and function of semiconductor die 204. For example, the circuit may include one or more transistors, diodes, and other circuit elements formed within active surface 212 to implement analog circuits or digital circuits, such as DSP, ASIC, memory, or other signal processing circuit. Semiconductor die 204 may also contain IPDs, such as inductors, capacitors, and resistors, for RF signal processing.

An electrically conductive layer 214 is formed over active surface 212 using PVD, CVD, electrolytic plating, electroless plating process, or other suitable metal deposition process. Conductive layer 214 can be one or more layers of Al, Cu, Sn, Ni, Au, Ag, or other suitable electrically conductive material. Conductive layer 214 operates as contact pads electrically connected to the circuits on active surface 212. Conductive layer 214 can be formed as contact pads disposed side-by-side a first distance from edge 208 of semiconductor die 204, as shown in FIG. 7a. Alternatively, conductive layer 214 can be formed as contact pads that are offset in multiple rows such that a first row of contact pads is disposed a first distance from edge 208 of semiconductor die 204, and a second row of contact pads alternating with the first row is disposed a second distance from edge 208 of semiconductor die 204.

A first insulating or passivation layer 216 is formed over semiconductor die 204 and conductive layer 214 using PVD, CVD, printing, spin coating, spray coating, sintering or thermal oxidation. Insulating layer 216 contains one or more layers of $SiO_2$, $Si_3N_4$, SiON, $Ta_2O_5$, $Al_2O_3$, $HfO_2$, BCB, PI, PBO, polymer, or other dielectric material having similar structural and insulating properties. Insulating layer 216 covers and provides protection for active surface 212. Insulating layer 216 is conformally applied over conductive layer 214 and active surface 212 of semiconductor die 204 and does not extend over edge 208 of semiconductor die 204 or beyond a footprint of semiconductor die 204. A peripheral region of semiconductor die 204 adjacent to semiconductor die 204 is devoid of insulating layer 216. A portion of insulating layer 216 is removed by LDA using laser 218 or an etching process through a patterned photoresist layer to expose conductive layer 214 through insulating layer 216 and provides for subsequent electrical interconnect.

Semiconductor wafer 200 undergoes electrical testing and inspection as part of a quality control process. Manual visual inspection and automated optical systems are used to perform inspections on semiconductor wafer 200. Software can be used in the automated optical analysis of semiconductor wafer 200. Visual inspection methods may employ equipment such as a scanning electron microscope, high-intensity or ultra-violet light, or metallurgical microscope. Semiconductor wafer 200 is inspected for structural characteristics including warpage, thickness variation, surface particulates, irregularities, cracks, delamination, and discoloration.

The active and passive components within semiconductor die 204 undergo testing at the wafer level for electrical performance and circuit function. Each semiconductor die 204 is tested for functionality and electrical parameters using a probe or other testing device. A probe is used to make electrical contact with nodes or contact pads 214 on each semiconductor die 204 and provides electrical stimuli to the contact pads. Semiconductor die 204 responds to the electrical stimuli, which is measured and compared to an expected response to test functionality of semiconductor die 204. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 200 enables semiconductor die 204 that pass to be designated as KGD for use in a semiconductor package.

In FIG. 7b, semiconductor wafer 200 is singulated through saw streets 206 using a saw blade or laser cutting tool 220 into individual semiconductor die 204. Semiconductor wafer 200 is singulated along a portion of base substrate material 202 within saw street area 206 by cutting along base substrate side surface 222 to allow a portion of base substrate material 202 to remain disposed on sidewalls 208 of semiconductor die 204. The thickness of base substrate material 202 adjacent to semiconductor die 204 is at least 1 μm. In other words, distance D5 between sidewalls 208 and base substrate side surface 222 is at least 1 μm. Individual semiconductor die 204 can be inspected and electrically tested for identification of KGD post singulation.

FIG. 7c shows a cross-sectional view of a portion of a carrier or temporary substrate 230 containing sacrificial base material such as silicon, polymer, beryllium oxide, glass, or other suitable low-cost, rigid material for structural support.

An interface layer or double-sided tape 232 is formed over carrier 230 as a temporary adhesive bonding film, etch-stop layer, or thermal release layer. Semiconductor die 204 from FIG. 7b are mounted to carrier 230 and interface layer 232 using, for example, a pick and place operation with active surface 212 oriented toward carrier 230.

Carrier 230 can be a round or rectangular panel (greater than 300 mm) with capacity for multiple semiconductor die 204. Carrier 230 may have a larger surface area than the surface area of semiconductor wafer 200. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 230 is selected independent of the size of semiconductor die 204 or size of semiconductor wafers 200. That is, carrier 230 has fixed or standardized size, which can accommodate various size semiconductor die 204 singulated from one or more semiconductor wafers 200. In one embodiment, carrier 230 is circular with a diameter of 330 mm. In another embodiment, carrier 230 is rectangular with a width of 560 mm and length of 600 mm. Semiconductor die 204 may have dimensions of 10 mm by 10 mm, which are placed on standardized carrier 230. Alternatively, semiconductor die 204 may have dimensions of 20 mm by 20 mm, which are placed on the same standardized carrier 230. Accordingly, standardized carrier 230 can handle any size semiconductor die 204, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 230 lowers manufacturing costs and capital risk by reducing or eliminating the need for specialized semiconductor processing lines based on die size or incoming wafer size. By selecting a predetermined carrier size to use for any size semiconductor die from all semiconductor wafers, a flexible manufacturing line can be implemented.

Figure 7D:
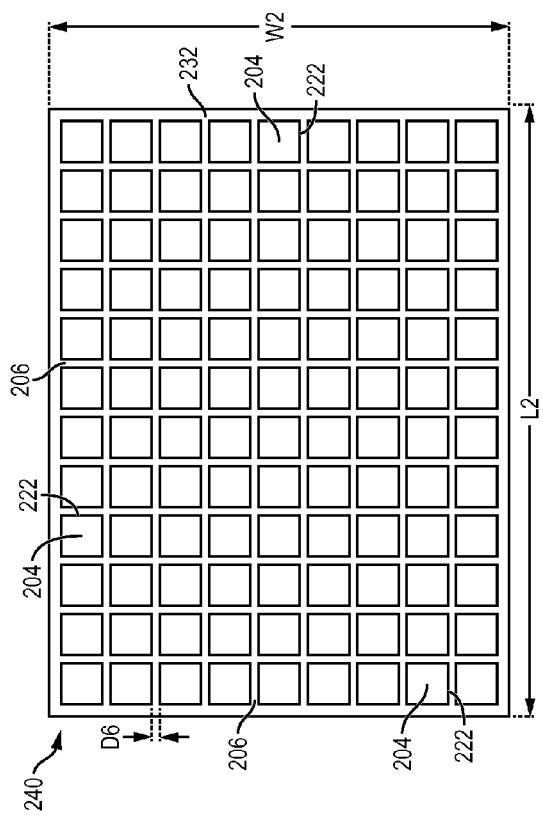

FIG. 7d shows a plan view of reconstituted wafer 240 with semiconductor die 204 disposed over carrier 230. Carrier 230 is a standardized shape and size with capacity for various sizes and quantities of semiconductor die, which are singulated from various sizes of semiconductor wafers. In one embodiment, carrier 230 is rectangular in shape and has a width W2 of 560 mm and a length L2 of 600 mm. The number of semiconductor die 204 mounted to carrier 230 can be greater than the number of semiconductor die 204 singulated from semiconductor wafer 200. The larger surface area of carrier 230 accommodates more semiconductor die 204 and lowers manufacturing cost as more semiconductor die 204 are processed per reconstituted wafer 240.

Standardized carrier 230 is fixed in size and can accommodate multiple sizes of semiconductor die. The size of standardized carrier 230 is independent of the dimensions of the semiconductor die or semiconductor wafer. More small semiconductor die than larger semiconductor die can fit over carrier 230. For example, carrier 230 accommodates a greater number of 5 mm by 5 mm die over the surface area of carrier 230 than a number of 10 mm by 10 mm die over the surface area of carrier 230.

For example, semiconductor die 204 having dimensions of 10 mm by 10 mm are placed on carrier 230 with a distance D6 of 200 μm between adjacent semiconductor die 204. The number of semiconductor die 204 singulated from semiconductor wafer 200 is approximately 600 semiconductor die, where semiconductor wafer 200 has a diameter of 300 mm. The number of 10 mm by 10 mm semiconductor die 204 which can fit on carrier 230 is over 3,000 semiconductor die. Alternatively, semiconductor die 204 having dimensions of 5 mm by 5 mm are placed on carrier 230 with a distance D6 of 200 μm between adjacent semiconductor die 204. The number of semiconductor die 204 singulated from semiconductor wafer 200, where semiconductor wafer 200 has a diameter of 200 mm, is approximately 1,000 semiconductor die. The number of 5 mm by 5 mm semiconductor die 204, which can fit on carrier 230, is over 12,000 semiconductor die.

The size of carrier 230 does not vary with the size of semiconductor die being processed. The number of semiconductor die 204, which fit on carrier 230, varies with the size of semiconductor die 204 and space or distance D6 between semiconductor die 204. The size and shape of carrier 230 remains fixed and independent of the size of semiconductor die 204 or semiconductor wafer 200 from which semiconductor die 204 are singulated. Carrier 230 and reconstituted wafer 240 provide the flexibility to manufacture many different types of semiconductor packages with different size semiconductor die 204 from different sized semiconductor wafers 200 using a common set of processing equipment, such as processing equipment 160 from FIG. 4h.

In FIG. 7e, an encapsulant or molding compound 244 is deposited over semiconductor die 204 and carrier 230 using a paste printing, transfer molding, liquid encapsulant molding, vacuum lamination, spin coating, or other suitable applicator. Encapsulant 244 can be polymer composite material, such as epoxy resin with filler, epoxy acrylate with filler, or polymer with proper filler. Encapsulant 244 is non-conductive and environmentally protects the semiconductor device from external elements and contaminants. In another embodiment, encapsulant 244 is an insulating or dielectric layer which contains one or more layers of photosensitive low curing temperature dielectric resist, photosensitive composite resist, laminate compound film, insulation paste with filler, solder mask resist film, liquid or granular molding compound, polyimide, BCB, PBO, SiO2, Si3N4, SiON, Ta2O5, Al2O3, prepreg, or other dielectric material having similar insulating and structural properties deposited using printing, spin coating, spray coating, vacuum or pressure lamination with or without heat, or other suitable process. In one embodiment, encapsulant 244 is a low temperature curing photosensitive dielectric polymer with or without insulating fillers cured at less than 200° C.

In particular, encapsulant 244 is disposed along base substrate side surfaces 222. Encapsulant 244 also covers back surface 210 of semiconductor die 204. In one embodiment, encapsulant 244 is opaque and dark or black in color. Encapsulant 244 can be used for laser marking reconstituted wafer 240 for alignment and singulation. Encapsulant 244 can be thinned in a subsequent backgrinding step. Encapsulant 244 can also be deposited such that a backside surface 246 of encapsulant is coplanar with back surface 210 of semiconductor die 204 and does not cover back surface 210. A surface 248 of encapsulant 244 opposite backside surface 246 is disposed over carrier 230 and interface layer 232 such that surface 248 of encapsulant 244 may be coplanar with active surface 212 of semiconductor die 204.

In FIG. 7f, carrier 230 and interface layer 232 are removed by chemical etching, mechanical peeling, CMP, mechanical grinding, thermal bake, UV light, laser scanning, or wet stripping to expose insulating layer 216, conductive layer 214, and surface 248 of encapsulant 244.

An electrically conductive layer 250 is formed over insulating layer 216 and conductive layer 214 using a patterning and metal deposition process such as printing, PVD, CVD, sputtering, electrolytic plating, and electroless plating. Conductive layer 250 can be one or more layers of Al, Cu, Sn, Ti, Ni, Au, Ag, or other suitable electrically conductive material. A portion of conductive layer 250 extends horizontally along insulating layer 216 and parallel to active surface 212 of semiconductor die 204 to laterally redistribute the electrical interconnect to conductive layer 214. Conductive layer 250 operates as an RDL for the electrical signals of semiconductor die 204. Conductive layer 250 is formed over a footprint of semiconductor die 204 and does not extend beyond the footprint of semiconductor die 204 and over encapsulant 244. In other words, a peripheral region of semiconductor die 204 adjacent to semiconductor die 204 is devoid of conductive layer 250. In one embodiment, conductive layer 250 is formed within a footprint of semiconductor die 204 and a distance D7 of at least 1 µm from edge or sidewall 208 of semiconductor die 204. A portion of conductive layer 250 is electrically connected to conductive layer 214. Other portions of conductive layer 250 are electrically common or electrically isolated depending on the connectivity of semiconductor die 204.

In FIG. 7g, an insulating or passivation layer 260 is formed over insulating layer 216 and conductive layer 250 using PVD, CVD, printing, spin coating, spray coating, screen printing or lamination. Insulating layer 260 can be one or more layers of $SiO_2$, $Si_3N_4$, SiON, $Ta_2O_5$, $Al_2O_3$, or other material having similar insulating and structural properties. In one embodiment, insulating layer 260 is a photosensitive dielectric polymer low-cured at less than 200° C. In one embodiment, insulating layer 260 is formed over insulating layer 216, semiconductor die 204, and extends beyond the footprint of semiconductor die 204 and over surface 248 of encapsulant 244 by a distance D8 of 1 µm or more. Insulating layer 260 covers the interface between semiconductor die 204 and encapsulant 244 to protect the interface during processing, and improve the reliability of the device. A portion of insulating layer 260 is removed by an etching process with a patterned photoresist layer or by LDA to form openings to expose conductive layer 250.

An electrically conductive bump material is deposited over conductive layer 250 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 250 using a suitable attachment or bonding process. In one embodiment, the bump material is reflowed by heating the material above its melting point to form balls or bumps 262. In some applications, bumps 262 are reflowed a second time to improve electrical contact to conductive layer 250. Bumps 262 can also be compression bonded or thermocompression bonded to conductive layer 250. Bumps 262 represent one type of interconnect structure that can be formed over conductive layer 250. The interconnect structure can also use bond wires, conductive paste, stud bump, micro bump, or other electrical interconnect. Laser marking can be performed before or after bump formation, or after removal of carrier 230.

Collectively, insulating layers 260, conductive layer 250 and bumps 262 constitute a build-up interconnect structure 264 formed over semiconductor die 204 and encapsulant 244. Alternatively, build-up interconnect structure 264 is formed completely within a footprint of semiconductor die 204. Build-up interconnect structure 264 may include as few as one RDL or conductive layer, such as conductive layer 250, and one insulating layer, such as insulating layer 260. Additional insulating layers and RDLs can be formed over insulating layer 260 prior to forming bumps 262, to provide additional vertical and horizontal electrical connectivity across the package according to the design and functionality of semiconductor die 204.

In FIG. 7h, semiconductor die 204 are singulated with saw blade or laser cutting tool 270 into individual eWLCSP 272. Reconstituted wafer 240 is singulated through encapsulant 244. A portion of encapsulant 244 remains disposed along the sides of semiconductor die 204 after singulation. eWLCSP 272 undergoes electrical testing before or after singulation.

In FIG. 7i, shows eWLCSP 272 with encapsulant formed over back surface 210 and sidewalls 208 of semiconductor die 204. Semiconductor die 204 is electrically connected through conductive layers 214 and 250 to bumps 262 for external interconnect through interconnect structure 264. Conductive layers of interconnect structure 264 do not extend beyond a footprint of semiconductor die 204 and thus forms a fan-in package. Insulating layer 260 covers the interface between semiconductor die 204 and encapsulant 244 to protect the interface during processing and improve the reliability of the device. Encapsulant 244 remains over back surface 210 of semiconductor die 204 after an optional grinding operation. Encapsulant 244 remains over base substrate side surfaces 222 for mechanical protection of semiconductor die 204 and protection from degradation due to exposure to photons from light or other emissions. Therefore, encapsulant 244 is formed over five sides of semiconductor die 204, i.e., over four base substrate side surfaces 222 and over back surface 210. Encapsulant 244 over back surface 210 of semiconductor die 204 eliminates the need for a backside protection layer or backside laminate, thereby reducing the cost of eWLCSP 272.

The thickness of encapsulant 244 over base substrate side surfaces 222 is less than 150 µm for eWLCSP 272. In one embodiment, eWLCSP 272 has dimensions of 4.595 mm in length×4.025 mm in width×0.470 mm in height with a pitch of 0.4 mm for bumps 262 where semiconductor die 204 has a length of 4.445 mm and a width of 3.875 mm. In another embodiment, the thickness of encapsulant 244 over base substrate side surfaces 222 is 75 µm or less. eWLCSP 272 has dimensions of 6.075 mm in length×6.075 mm in width× 0.8 mm in height with a pitch of 0.5 mm for bumps 262 where semiconductor die 204 has dimensions of 6.0 mm in length×6.0 mm in width×0.470 mm in height. In yet another embodiment, eWLCSP 272 has dimensions of 5.92 mm in length×5.92 mm in width×0.765 mm in height with a pitch of 0.5 mm for bumps 262 where semiconductor die 204 has dimensions of 5.75 mm in length×5.75 mm in width×0.535 mm in height. In another embodiment, the thickness of encapsulant 244 over base substrate side surface 222 is 25 µm or less. In yet another embodiment, eWLCSP 272 can be formed with a length of 14 mm and a width of 14 mm. eWLCSP 272 is manufactured by forming a reconstituted wafer on standardized carrier 230 using equipment designed for a single standardized carrier size, which reduces equipment and material costs for eWLCSP 272. eWLCSP 272 is manufactured at a higher volume using standardized carrier 230, thereby simplifying the manufacturing process and reducing unit cost.

FIG. 8 shows eWLCSP 274 after singulation having encapsulant over sidewalls 208 of semiconductor die 204 and having backside protection layer 276. Semiconductor die 204 is electrically connected through conductive layers 214 and 250 to bumps 262 for external interconnect through interconnect structure 264. Conductive layers of interconnect structure 264 do not extend beyond a footprint of semiconductor die 204 and thus forms a fan-in package. Insulating layer 260 covers the interface between semiconductor die 204 and encapsulant 244 to protect the interface during processing and improve the reliability of the device. Backside insulating layer or backside protection layer 276 is formed over back surface 210 of semiconductor die 204 for mechanical protection and protection from degradation due to exposure to photons from light or other emissions. Backside protection layer 276 contains one or more layers of photosensitive low curing temperature dielectric resist, photosensitive composite resist, laminate compound film, resin matrix composite sheet with filler or glass fiber cloth, resin matrix composite sheet with both filler and glass fiber cloth, insulation paste with filler, solder mask resist film, liquid molding compound, granular molding compound, polyimide, BCB, PBO, $SiO_2$, $Si_3N_4$, SiON, $Ta_2O_5$, $Al_2O_3$, prepreg, or other dielectric material having similar insulating and structural properties. Backside protection layer 276 is deposited using printing, spin coating, spray coating, vacuum or pressure lamination with or without heat, or other suitable process. In one embodiment, backside protection layer 276 is a low temperature curing photosensitive dielectric polymer with or without insulating fillers cured at less than 200° C. Backside protection layer 276 provides mechanical protection for semiconductor die 204 and protection from light. In one embodiment, backside protection layer 276 has a thickness ranging from approximately 5-150 μm. Alternatively, backside protection layer 276 is a metal layer, such as Cu foil, applied to a backside of reconstituted wafer 240. Backside protection layer 276 contacts back surface 210 of semiconductor die 204 to transfer heat from semiconductor die 204 and improve the thermal performance of the device.

Encapsulant 244 covers base substrate side surfaces 222 to protect semiconductor die 204 from degradation due to exposure to photons from light or other emissions. The thickness of encapsulant 244 over base substrate side surfaces 222 is less than 150 μm for eWLCSP 274. In one embodiment, eWLCSP 274 has dimensions of 4.595 mm in length×4.025 mm in width×0.470 mm in height with a pitch of 0.4 mm for bumps 262 where semiconductor die 204 has a length of 4.445 mm and a width of 3.875 mm. In another embodiment, the thickness of encapsulant 244 over base substrate side surfaces 222 is 75 μm or less. eWLCSP 274 has dimensions of 6.075 mm in length×6.075 mm in width×0.8 mm in height with a pitch of 0.5 mm for bumps 262 where semiconductor die 204 has dimensions of 6.0 mm in length×6.0 mm in width×0.470 mm in height. In yet another embodiment, eWLCSP 274 has dimensions of 5.92 mm in length×5.92 mm in width×0.765 mm in height with a pitch of 0.5 mm for bumps 262 where semiconductor die 204 has dimensions of 5.75 mm in length×5.75 mm in width×0.535 mm in height. In another embodiment, the thickness of encapsulant 244 over base substrate side surfaces 222 is 25 μm or less. In yet another embodiment, eWLCSP 274 can be formed with a length of 14 mm and a width of 14 mm. eWLCSP 274 is manufactured by forming a reconstituted wafer on standardized carrier 230 using equipment designed for a single standardized carrier size, which reduces equipment and material costs for eWLCSP 274. eWLCSP 274 is manufactured at a higher volume using standardized carrier 230, thereby simplifying the manufacturing process and reducing unit cost.

Figure 9A:
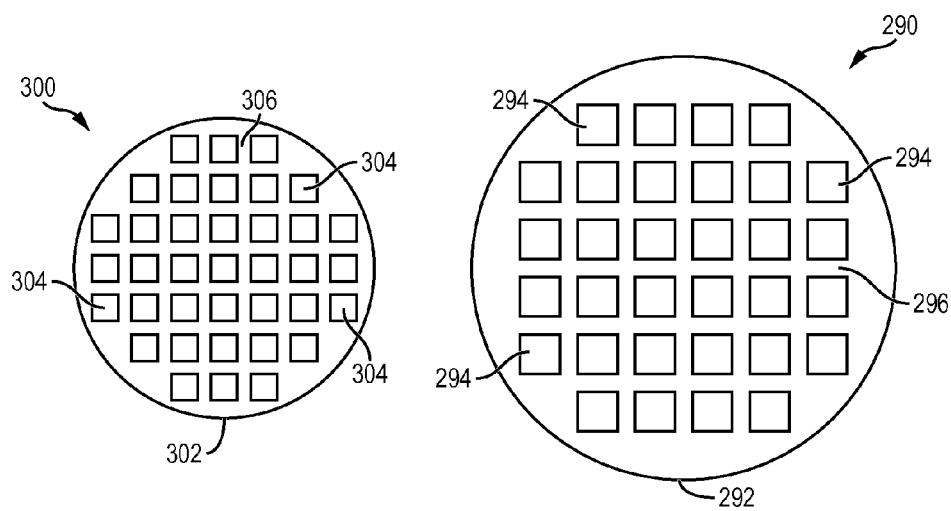
FIGS. 9a-9p illustrate a process of forming an eWLCSP.

FIGS. 9a-9p illustrate, in relation to FIGS. 1 and 2a-2c, a process of forming a reconstituted or embedded fan-in WLCSP. FIG. 9a shows a semiconductor wafer 290 with a base substrate material 292, such as silicon, germanium, gallium arsenide, indium phosphide, or silicon carbide, for structural support. A plurality of semiconductor die or components 294 is formed on wafer 290 separated by a non-active, inter-die wafer area or saw street 296 as described above. Saw street 296 provides cutting areas to singulate semiconductor wafer 290 into individual semiconductor die 294. Semiconductor wafer 290 may have any diameter prior to singulating semiconductor wafer into individual semiconductor die 294. In one embodiment, semiconductor wafer 290 is 200-300 mm in diameter. In another embodiment, semiconductor wafer 290 is 100-450 mm in diameter. Semiconductor die 294 may have any size, and in one embodiment, semiconductor die 294 have dimensions of 10 mm by 10 mm.

FIG. 9a also shows semiconductor wafer 300, which is similar to semiconductor wafer 290. Semiconductor wafer 300 includes a base substrate material 302, such as silicon, germanium, gallium arsenide, indium phosphide, or silicon carbide, for structural support. A plurality of semiconductor die or components 304 is formed on wafer 300 separated by a non-active, inter-die wafer area or saw street 306 as described above. Saw street 306 provides cutting areas to singulate semiconductor wafer 300 into individual semiconductor die 304. Semiconductor wafer 300 may have the same diameter or a different diameter from semiconductor wafer 290. Semiconductor wafer 300 may have any diameter prior to singulating semiconductor wafer into individual semiconductor die 304. In one embodiment, semiconductor wafer 300 is 200-300 mm in diameter. In another embodiment, semiconductor wafer 300 is 100-450 mm in diameter. Semiconductor die 304 may have any size, and in one embodiment, semiconductor die 304 are smaller than semiconductor die 294 and have dimensions of 5 mm by 5 mm.

Figure 9B:
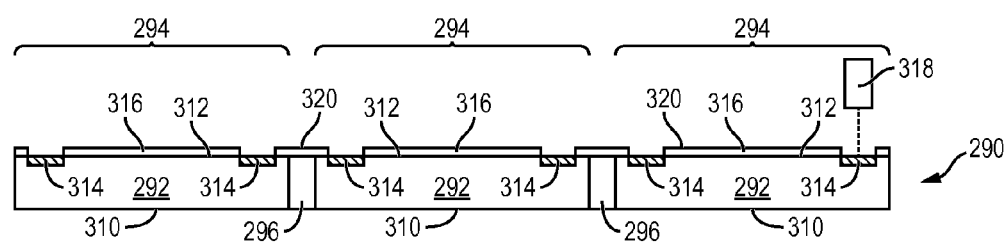

FIG. 9b shows a cross-sectional view of a portion of semiconductor wafer 290. Each semiconductor die 294 has a back or non-active surface 310 and active surface 312 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 312 to implement analog circuits or digital circuits, such as DSP, ASIC, memory, or other signal processing circuit. Semiconductor die 294 may also contain IPDs, such as inductors, capacitors, and resistors, for RF signal processing.

An electrically conductive layer 314 is formed over active surface 312 using PVD, CVD, electrolytic plating, electroless plating process, or other suitable metal deposition process. Conductive layer 314 can be one or more layers of Al, Cu, Sn, Ni, Au, Ag, or other suitable electrically conductive material. Conductive layer 314 operates as contact pads electrically connected to the circuits on active surface 312. Conductive layer 314 can be formed as contact pads disposed side-by-side a first distance from the edge of semiconductor die 294, as shown in FIG. 9*b*. Alternatively, conductive layer 314 can be formed as contact pads that are offset in multiple rows such that a first row of contact pads is disposed a first distance from the edge of semiconductor die 294, and a second row of contact pads alternating with the first row is disposed a second distance from the edge of semiconductor die 294.

A first insulating or passivation layer 316 is formed over semiconductor die 294 and conductive layer 314 using PVD, CVD, printing, spin coating, spray coating, sintering or thermal oxidation. Insulating layer 316 contains one or more layers of SiO2, Si3N4, SiON, Ta2O5, Al2O3, HfO2, BCB, PI, PBO, polymer, or other dielectric material having similar structural and insulating properties. In one embodiment, insulating layer 316 is a low temperature curing photosensitive dielectric polymer with or without insulating fillers cured at less than 200° C. Insulating layer 316 covers and provides protection for active surface 312. A portion of insulating layer 316 is removed by LDA using laser 318 or an etching process through a patterned photoresist layer to expose conductive layer 314 through surface 320 of insulating layer 316 and provides for subsequent electrical interconnect.

Semiconductor wafer 290 undergoes electrical testing and inspection as part of a quality control process. Manual visual inspection and automated optical systems are used to perform inspections on semiconductor wafer 290. Software can be used in the automated optical analysis of semiconductor wafer 290. Visual inspection methods may employ equipment such as a scanning electron microscope, high-intensity or ultra-violet light, or metallurgical microscope. Semiconductor wafer 290 is inspected for structural characteristics including warpage, thickness variation, surface particulates, irregularities, cracks, delamination, and discoloration.

The active and passive components within semiconductor die 294 undergo testing at the wafer level for electrical performance and circuit function. Each semiconductor die 294 is tested for functionality and electrical parameters using a probe or other testing device. A probe is used to make electrical contact with nodes or contact pads 314 on each semiconductor die 294 and provides electrical stimuli to the contact pads. Semiconductor die 294 respond to the electrical stimuli, which is measured and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 290 enables semiconductor die 294 that pass to be designated as KGD for use in a semiconductor package.

Figure 9C:
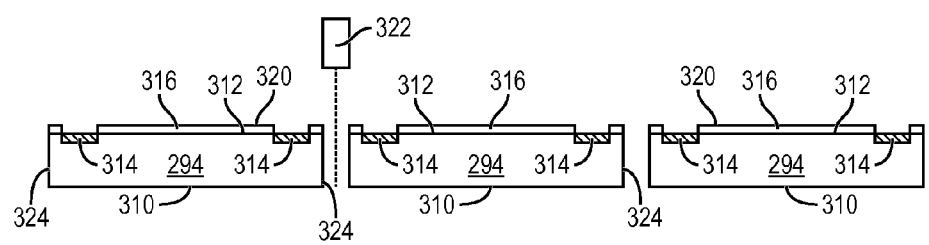

In FIG. 9*c*, semiconductor wafer 290 is singulated through saw streets 296 using a saw blade or laser cutting tool 322 into individual semiconductor die 294 having sidewalls or side surfaces 324. Similarly, semiconductor wafer 300 from FIG. 9*a* is singulated through saw streets 306 using a saw blade or laser cutting tool 322 into individual semiconductor die 304. Individual semiconductor die 294 and 304 can be inspected and electrically tested for identification of KGD post singulation.

FIG. 9*d* shows a cross-sectional view of a portion of a carrier or temporary substrate 330 containing sacrificial base material such as silicon, polymer, beryllium oxide, glass, or other suitable low-cost, rigid material for structural support. An interface layer or double-sided tape 332 is formed over carrier 330 as a temporary adhesive bonding film, etch-stop layer, or thermal release layer.

Carrier 330 is a standardized carrier with capacity for multiple semiconductor die and can accommodate semiconductor die of multiple sizes singulated from semiconductor wafers having any diameter. For example, carrier 330 can be a round panel with a diameter of 305 mm or greater or can be a rectangular panel with a length of 300 mm or greater and a width of 300 mm or greater. Carrier 330 may have a larger surface area than the surface area of semiconductor wafer 290 or 300. In one embodiment, semiconductor wafer 290 has a diameter of 300 mm and contains semiconductor die 294 which have a length of 10 mm and a width of 10 mm. In one embodiment, semiconductor wafer 300 has a diameter of 200 mm and contains semiconductor 304 which have a length of 5 mm and a width of 5 mm. Carrier 330 can accommodate 10 mm by 10 mm semiconductor die 294 and 5 mm by 5 mm semiconductor die 304. Carrier 330 carries a greater quantity of 5 mm by 5 mm semiconductor die 304 than a quantity of 10 mm by 10 mm semiconductor die 294. In another embodiment, semiconductor die 294 and 304 have the same dimensions. Carrier 330 is standardized in size and shape to accommodate any size semiconductor die. A larger carrier reduces the manufacturing cost of the semiconductor package as more semiconductor die can be processed on the larger carrier thereby reducing the cost per unit.

Semiconductor packaging and processing equipment are designed and configured for the size of the semiconductor die and carrier being processed. To further reduce manufacturing costs, the size of carrier 330 is selected independent of the size of semiconductor die 294 or 304 and independent of the size of semiconductor wafers 290 and 300. That is, carrier 330 has a fixed or standardized size, which can accommodate various sizes of semiconductor die 294 and 304 singulated from one or more semiconductor wafers 290 or 300. In one embodiment, carrier 330 is circular or round with a diameter of 330 mm. In another embodiment, carrier 330 is rectangular with a width of 560 mm and length of 600 mm.

The size and dimensions of the standardized carrier, carrier 330, is selected during the design of the processing equipment in order to develop a manufacturing line that is uniform for all back-end semiconductor manufacturing of semiconductor devices. Carrier 330 remains constant in size regardless of the size and type of semiconductor packages to be manufactured. For example, semiconductor die 294 may have dimensions of 10 mm by 10 mm and are placed on standardized carrier 330. Alternatively, semiconductor die 294 may have dimensions of 20 mm by 20 mm and are placed on the same standardized carrier 330. Accordingly, standardized carrier 330 can handle any size semiconductor die 294 and 304, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 330 lowers manufacturing costs and capital risk by reducing or eliminating the need for specialized semiconductor processing lines based on die size or incoming wafer size. By selecting a predetermined carrier size to use for any size semiconductor die from all semiconductor wafers, a flexible manufacturing line can be implemented.

In FIG. 9e, semiconductor die 294 from FIG. 9c are mounted to carrier 330 and interface layer 332 using, for example, a pick and place operation with insulating layer 316 oriented toward carrier 330. Semiconductor die 294 are mounted to interface layer 332 of carrier 330 to form reconstituted or reconfigured wafer 336. In one embodiment, insulating layer 316 is embedded within interface layer 332. For example, active surface 312 of semiconductor die 294 may be coplanar with surface 334 of interface layer 332. In another embodiment, insulating layer 316 is mounted over interface layer 332 such that active surface 312 of semiconductor die 294 is offset from interface layer 332.

Reconstituted wafer 336 can be processed into many types of semiconductor packages, including fan-in WLCSP, reconstituted or eWLCSP, fan-out WLCSP, flipchip packages, 3D packages, such as PoP, or other semiconductor packages. Reconstituted wafer 336 is configured according to the specifications of the resulting semiconductor package. In one embodiment, semiconductor die 294 are placed on carrier 330 in a high-density arrangement, i.e., 300 μm apart or less, for processing fan-in devices. Semiconductor die 294 are placed onto carrier 330 separated by a gap or distance D9 between semiconductor die 294. Distance D9 between semiconductor die 294 is selected based on the design and specifications of the semiconductor package to be processed. In one embodiment, distance D9 between semiconductor die 294 is 50 μm or less. In another embodiment, distance D9 between semiconductor die 294 is 100 μm or less. Distance D9 between semiconductor die 294 on carrier 330 is optimized for manufacturing the semiconductor packages at the lowest unit cost.

FIG. 9f shows a plan view of reconstituted wafer 336 with semiconductor die 294 mounted to or disposed over carrier 330. Carrier 330 is a standardized shape and size, and therefore constitutes a standardized carrier. Carrier 330 has capacity for various sizes and quantities of semiconductor die, which are singulated from various sizes of semiconductor wafers. In one embodiment, carrier 330 is rectangular in shape and has a width W3 of 560 mm and a length L3 of 600 mm. In another embodiment, carrier 330 is rectangular in shape and has a width W3 of 330 mm and a length L3 of 330 mm. In another embodiment, carrier 330 is round in shape and has a diameter of 330 mm.

The number of semiconductor die 294 disposed over carrier 330 depends on the size of semiconductor die 294 and distance D9 between semiconductor die 294 within the structure of reconstituted wafer 336. The number of semiconductor die 294 mounted to carrier 330 can be greater than, less than, or equal to the number of semiconductor die 294 singulated from semiconductor wafer 290. The larger surface area of carrier 330 accommodates more semiconductor die 294 and lowers manufacturing cost as more semiconductor die 294 are processed per reconstituted wafer 336. In one example, semiconductor wafer 290 has a diameter of 300 mm with a quantity of approximately 600 individual 10 mm by 10 mm semiconductor die 294 formed on semiconductor wafer 290. Semiconductor die 294 are singulated from one or more semiconductor wafers 290. Carrier 330 is prepared, for example, with a standard width W3 of 560 mm and a standard length L3 of 600 mm. Carrier 330 with a width W3 of 560 mm is sized to accommodate a quantity of approximately 54 semiconductor die 294, with dimensions of 10 mm by 10 mm and spaced a distance D9 of 200 μm apart, across width W3 of carrier 330. Carrier 330 with a length L3 of 600 mm is sized to accommodate a quantity of approximately 58 semiconductor die 294, with dimensions of 10 mm by 10 mm spaced a distance D9 of 200 μm apart, across length L3 of carrier 330. Accordingly, the surface area of carrier 330, width W3 multiplied by length L3, accommodates a quantity of approximately 3,000 semiconductor die 294 with dimensions of 10 mm by 10 mm and a gap or distance D9 of 200 μm between semiconductor die 294. Semiconductor die 294 can be placed on carrier 330 with a gap or distance D9 of less than 200 μm between semiconductor die 294 to increase the density of semiconductor die 294 on carrier 330 and further reduce the cost of processing semiconductor die 294.

Automated pick and place equipment is used to prepare reconstituted wafer 336 based on the quantity and size of semiconductor die 294 and based on the dimensions of carrier 330. For example, semiconductor die 294 is selected with dimensions of 10 mm by 10 mm. Carrier 330 has standard dimensions, for example, 560 mm width W3 and 600 mm length L3. Automated equipment is programmed with the dimensions of semiconductor die 294 and carrier 330 in order to process reconstituted wafer 336. After singulating semiconductor wafer 290, a first semiconductor die 294 is selected by the automated pick and place equipment. A first semiconductor die 294 is mounted to carrier 330 in a position on carrier 330 determined by the programmable automated pick and place equipment. A second semiconductor die 294 is selected by the automated pick and place equipment, placed on carrier 330, and positioned in a first row on carrier 330. Distance D9 between adjacent semiconductor die 294 is programmed into the automated pick and place equipment and is selected based on the design and specifications of the semiconductor package to be processed. In one embodiment, the gap or distance D9 between adjacent semiconductor die 294 on carrier 330 is 200 μm. A third semiconductor die 294 is selected by the automated pick and place equipment, placed on carrier 330, and positioned in the first row on carrier 330 a distance D9 of 200 μm from an adjacent semiconductor die 294. The pick and place operation is repeated until a first row of approximately 54 semiconductor die 294 is disposed across width W3 of carrier 330.

Another semiconductor die 294 is selected by the automated pick and place equipment, placed on carrier 330, and positioned in a second row adjacent to the first row on carrier 330. Distance D9 between adjacent rows of semiconductor die 294 is preselected and programmed into the automated pick and place equipment. In one embodiment, distance D9 between a first row of semiconductor die 294 and a second row of semiconductor die 294 is 200 μm. The pick and place operation is repeated until approximately 58 rows of semiconductor die 294 are disposed across length L3 of carrier 330. The standardized carrier, carrier 330 with width W3 of 560 mm and length L3 of 600 mm, accommodates approximately 54 columns and 58 rows of 10 mm by 10 mm semiconductor die 294 for a total quantity of approximately 3,000 semiconductor die 294 disposed on carrier 330. The pick and place operation is repeated until carrier 330 is partially or completely populated with semiconductor die 294. With a standardized carrier, such as carrier 330, the automated pick and place equipment can mount any size semiconductor die 294 on carrier 330 to form reconstituted wafer 336. Reconstituted wafer 336 can subsequently be processed using back-end processing equipment that is standardized for carrier 330.

Figure 9G:
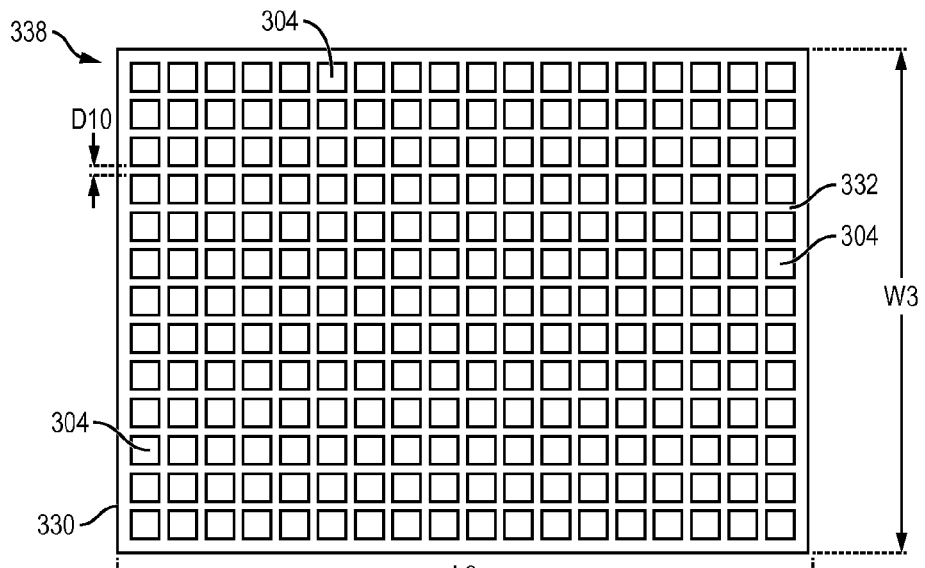

FIG. 9g shows a plan view of reconstituted wafer 338 with semiconductor die 304 mounted to or disposed over carrier 330. The same standardized carrier 330, or a standardized carrier with the same size as carrier 330, is used to process reconstituted wafer 338 as was used to process reconstituted wafer 336. Any configuration of semiconductor die on a reconstituted wafer can be supported by carrier 330. The number of semiconductor die 304 disposed over carrier 330 depends on the size of semiconductor die 304 and distance D10 between semiconductor die 304 within the structure of reconstituted wafer 338. The number of semiconductor die 304 mounted to carrier 330 can be greater than, less than, or equal to the number of semiconductor die 304 singulated from semiconductor wafer 300. The larger surface area of carrier 330 accommodates more semiconductor die 304 and lowers manufacturing cost as more semiconductor die 304 are processed per reconstituted wafer 338.

In one example, semiconductor wafer 300 has a diameter of 200 mm with a quantity of approximately 1,000 individual 5 mm by 5 mm semiconductor die 304 formed on semiconductor wafer 300. Semiconductor die 304 are singulated from one or more semiconductor wafers 300. Carrier 330 is prepared, for example, with a standard width W3 of 560 mm and a standard length L3 of 600 mm. Carrier 330 with a width W3 of 560 mm is sized to accommodate a quantity of approximately 107 semiconductor die 304, with dimensions of 5 mm by 5 mm spaced a distance D10 of 200 µm apart, across width W3 of carrier 330. Carrier 330 with a length L3 of 600 mm is sized to accommodate a quantity of approximately 115 semiconductor die 304, with dimensions of 5 mm by 5 mm spaced a distance D10 of 200 µm apart, across length L3 of carrier 330. Accordingly, the surface area of carrier 330, width W3 multiplied by length L3, accommodates approximately 12,000 semiconductor die 304 with dimensions of 5 mm by 5 mm spaced a distance D10 of 200 µm apart. Semiconductor die 304 can be placed on carrier 330 with a gap or distance D10 of less than 200 µm between semiconductor die 304 to increase the density of semiconductor die 304 on carrier 330 and further reduce the cost of processing semiconductor die 304.

Automated pick and place equipment is used to prepare reconstituted wafer 338 based on the quantity and size of semiconductor die 304 and based on the dimensions of carrier 330. For example, semiconductor die 304 is selected with dimensions of 5 mm by 5 mm. Carrier 330 has standard dimensions, for example, 560 mm width W3 and 600 mm length L3. Automated equipment is programmed with the dimensions of semiconductor die 304 and carrier 330 in order to process reconstituted wafer 338. After singulating semiconductor wafer 300, a first semiconductor die 304 is selected by the automated pick and place equipment. A first semiconductor die 304 is mounted to carrier 330 in a position on carrier 330 determined by the programmable automated pick and place equipment. A second semiconductor die 304 is selected by the automated pick and place equipment, placed on carrier 330, and positioned in a first row on carrier 330 a distance D10 from first semiconductor die 304. Distance D10 between adjacent semiconductor die 304 is programmed into the automated pick and place equipment and is selected based on the design and specifications of the semiconductor package to be processed. In one embodiment, the gap or distance D10 between adjacent semiconductor die 304 on carrier 330 is 200 µm. A third semiconductor die 304 is selected by the automated pick and place equipment, placed on carrier 330, and positioned in the first row on carrier 330. The pick and place operation is repeated until a row of approximately 107 semiconductor die 304 is disposed across width W3 of carrier 330.

Another semiconductor die 304 is selected by the automated pick and place equipment, placed on carrier 330, and positioned in a second row adjacent to the first row on carrier 330. Distance D10 between adjacent rows of semiconductor die 304 is preselected and programmed into the automated pick and place equipment. In one embodiment, distance D10 between a first row of semiconductor die 304 and a second row of semiconductor die 304 is 200 µm. The pick and place operation is repeated until approximately 115 rows of semiconductor die 304 are disposed across length L3 of carrier 330. The standardized carrier, carrier 330 with width W3 of 560 mm and length L3 of 600 mm, accommodates approximately 107 columns and 115 rows of 5 mm by 5 mm semiconductor die 304 for a total quantity of approximately 12,000 semiconductor die 304 disposed on carrier 330. The pick and place operation is repeated until carrier 330 is partially or completely populated with semiconductor die 304. With a standardized carrier, such as carrier 330, the automated pick and place equipment can mount any size semiconductor die on carrier 330 to form reconstituted wafer 338. Reconstituted wafer 338 can be processed using the same carrier 330 and same back-end processing equipment as was used to process reconstituted wafer 336.

Both reconstituted wafer 336 from FIG. 9f and reconstituted wafer 338 from FIG. 9g use the same carrier 330 or use a carrier having the same standardized size for both reconstituted wafers 336 and 338. The processing equipment designed for back-end processing of the reconstituted wafers is standardized for carrier 330 and is capable of processing any configuration of reconstituted wafer formed on carrier 330 and any size semiconductor die placed on carrier 330. Because both reconstituted wafers 336 and 338 use the same standardized carrier 330, the reconstituted wafers can be processed on the same manufacturing line. Accordingly, a purpose of standardized carrier 330 is to simplify the equipment needed to manufacture semiconductor packages.

In another example, reconstituted wafer 338 includes semiconductor die 294 and 304 where each semiconductor die 294 and 304 has the same dimensions, and the semiconductor die originate from semiconductor wafers 290 and 300 which have different diameters. Semiconductor wafer 290 has a diameter of 450 mm with a quantity of approximately 2,200 individual 8 mm by 8 mm semiconductor die 294 formed on semiconductor wafer 290. Semiconductor die 294 having dimensions of 8 mm by 8 mm are singulated from one or more semiconductor wafers 290. Additionally, semiconductor wafer 300 has a diameter of 300 mm with a quantity of approximately 900 individual 8 mm by 8 mm semiconductor die 304 formed on semiconductor wafer 300. Semiconductor die 304 having dimensions of 8 mm by 8 mm are singulated from one or more semiconductor wafers 300. Carrier 330 is prepared, for example, with a standard width W3 of 560 mm and a standard length L3 of 600 mm. Carrier 330 with a width W3 of 560 mm is sized to accommodate a quantity of approximately 69 semiconductor die 294 or 304, with dimensions of 8 mm by 8 mm spaced a distance D9 or D10 of 100 µm apart, across width W3 of carrier 330. Carrier 330 with a length L3 of 560 mm is sized to accommodate a quantity of approximately 74 semiconductor die 294 or 304, with dimensions of 8 mm by 8 mm spaced a distance D9 or D10 of 100 µm apart, across length L3 of carrier 330. The surface area of carrier 330, width W3 multiplied by length L3, accommodates approximately 5,000 semiconductor die 294 or 304 with dimensions of 8 mm by 8 mm spaced a distance D9 or D10 of 100 µm apart. Semiconductor die 294 and 304 can be placed on carrier 330 with a gap or distance D9 or D10 of less than 100 µm between semiconductor die 294 or 304 to increase the density of semiconductor die 294 and 304 on carrier 330 and further reduce the cost of processing semiconductor die 294 and 304.

Automated pick and place equipment is used to prepare reconstituted wafer 338 based on the quantity and size of semiconductor die 294 and 304 and based on the dimensions of carrier 330. After singulating semiconductor wafer 300, a first semiconductor die 294 or 304 is selected by the automated pick and place equipment. 8 mm by 8 mm semiconductor die 294 or 304 can originate from either semiconductor wafer 290, having a 450 mm diameter, or from semiconductor wafer 300, having a 300 mm diameter. Alternatively, the 8 mm by 8 mm semiconductor die originate from another semiconductor wafer having a different diameter. A first semiconductor die 294 or 304 is mounted to carrier 330 in a position on carrier 330 determined by the programmed automated pick and place equipment. A second semiconductor die 294 or 304 is selected by the automated pick and place equipment, placed on carrier 330, positioned in a first row on carrier 330. Distance D9 or D10 between adjacent semiconductor die 294 or 304 is programmed into the automated pick and place equipment and is selected based on the design and specifications of the semiconductor package to be processed. In one embodiment, the gap or distance D9 or D10 between adjacent semiconductor die 294 or 304 on carrier 330 is 100 µm. The pick and place operation is repeated until a row of approximately 69 semiconductor die 294 or 304 is disposed across width W3 of carrier 330.

Another semiconductor die 294 or 304 is selected by the automated pick and place equipment, placed on carrier 330, and positioned in a second row adjacent to the first row on carrier 330. In one embodiment, distance D9 or D10 between a first row of semiconductor die 294 or 304 and a second row of semiconductor die 294 or 304 is 100 µm. The pick and place operation is repeated until approximately 74 rows of semiconductor die 294 or 304 are disposed across length L3 of carrier 330. The standardized carrier, carrier 330 with width W3 of 560 mm and length L3 of 600 mm, accommodates approximately 69 columns and 74 rows of 8 mm by 8 mm semiconductor die 294 and 304 for a total quantity of approximately 5,000 semiconductor die 294 disposed on carrier 330. The pick and place operation is repeated until carrier 330 is partially or completely populated with semiconductor die 294 or 304. Therefore, reconstituted wafer 338 may include semiconductor die 294 and 304 singulated from any size semiconductor wafer. The size of carrier 330 is independent of the size of semiconductor die 294 and 304 and is independent of the size of semiconductor wafers 290 and 300. Reconstituted wafer 338 can be processed using the same carrier 330 and same back-end processing equipment as was used to process reconstituted wafer 336. For reconstituted wafers having the same size semiconductor die singulated from different size incoming wafers, standardized carrier 330 allows the same materials to be used for each reconstituted wafer. Therefore, the bill of materials for a reconstituted wafer 336 or 338 on carrier 330 remains constant. A consistent and predictable bill of materials allows for improved cost analysis and planning for semiconductor packaging.

In another embodiment, a reconstituted wafer 338 contains a variety of semiconductor die sizes disposed on carrier 330. For example, 10 mm by 10 mm semiconductor die 294 are mounted to carrier 330, and 5 mm by 5 mm semiconductor die 304 are mounted to carrier 330 to form reconstituted wafer 338. The reconstituted wafer contains multiple sizes of semiconductor die on the same reconstituted wafer. In other words, a portion of reconstituted wafer 338 contains one size semiconductor die and another portion of the reconstituted wafer contains another size semiconductor die. Reconstituted wafer 338 containing different sizes of semiconductor die 294 and 304 simultaneously on carrier 330 is processed using the same back-end processing equipment as was used to process another reconstituted wafer 336 having uniformly sized semiconductor die disposed over carrier 330.

In summary, carrier 330 has capacity for various sizes and quantities of semiconductor die, which are singulated from various sizes of semiconductor wafers. The size of carrier 330 does not vary with the size of semiconductor die being processed. The standardized carrier, carrier 330, is fixed in size and can accommodate multiple sizes of semiconductor die. The size of standardized carrier 330 is independent of the dimensions of the semiconductor die or semiconductor wafer. More small semiconductor die than larger semiconductor die can fit over carrier 330. The number of semiconductor die 294 or 304, which fit on carrier 330, varies with the size of semiconductor die 294 or 304 and space or distance D9 or D10 between semiconductor die 294 or 304. For example, carrier 330 having length L3 and width W3 accommodates a greater number of 5 mm by 5 mm semiconductor die 304 over the surface area of carrier 330 than a number of 10 mm by 10 mm semiconductor die 294 over the surface area of carrier 330. For example, carrier 330 holds approximately 3,000 10 mm by 10 mm semiconductor die or approximately 12,000 5 mm by 5 mm semiconductor die. The size and shape of carrier 330 remains fixed and independent of the size of semiconductor die 294 or 304 or semiconductor wafer 290 or 300 from which semiconductor die 294 or 304 are singulated. Carrier 330 provides the flexibility to manufacture reconstituted wafers 336 and 338 into many different types of semiconductor packages with different size semiconductor die 294 and 304 from different sized semiconductor wafers 290 and 300 using a common set of processing equipment.

Figure 9H:
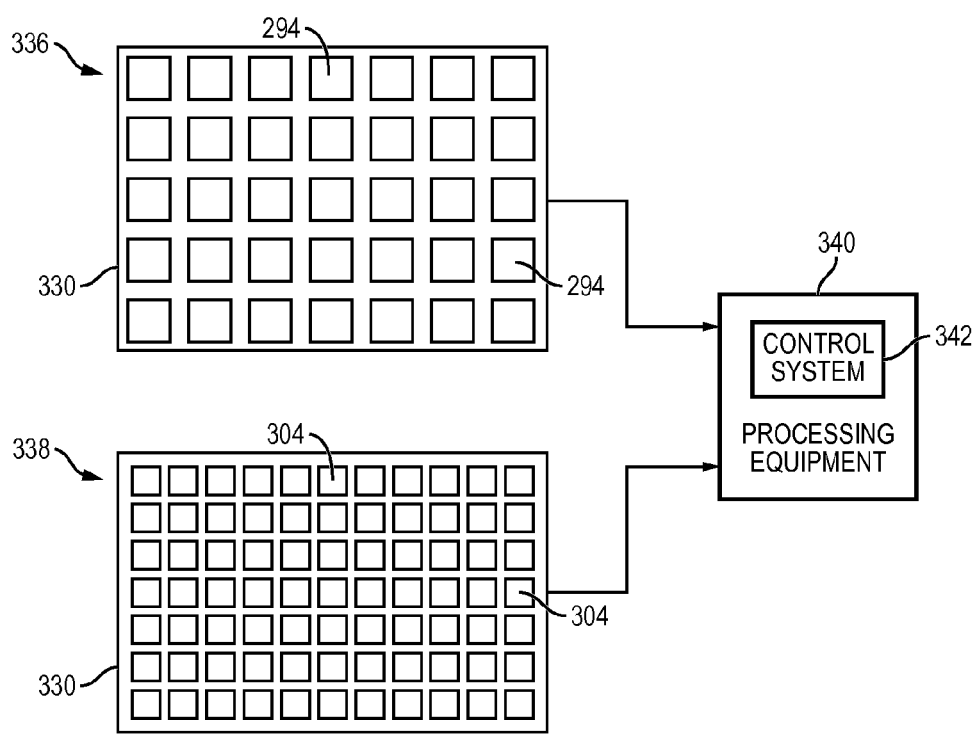

FIG. 9h shows a process of using carrier 330 to manufacture semiconductor packages. Processing equipment 340 is used to perform the back-end manufacturing processes on semiconductor die, such as deposition of encapsulant and insulating layers, deposition of conductive layers, bumping, reflowing, marking, singulation, and other back-end processes. Processing equipment 340 is designed for the size and shape of a standardized carrier, such as carrier 330. Processing equipment 340 is compatible with carrier 330, because the mechanical and electrical components of processing equipment 340 are customized for the standardized size and shape of carrier 330.

Processing equipment 340 is controlled by control system 342. Control system 342 can be a software program or algorithm used to configure processing equipment 340 according to the size and shape of the semiconductor die on carrier 330. Control system 342 is programmed and customized in order for processing equipment 340 to handle each different reconstituted wafer, such as reconstituted wafers 336 and 338, formed on standardized carrier 330.

By standardizing the dimensions of carrier 330, processing equipment 340 can remain constant, because the dimensions of carrier 330 do not change with variables of semiconductor die size and semiconductor wafer size. Control system 342 uses various algorithms for each reconstituted wafer on carrier 330. For example, control system 342 can be used to optimize the spacing during the initial pick and place operation of semiconductor die 294 on carrier 330. The specifications of reconstituted wafer 336 are inputted into control system 342. Control system 342 is programmed to control processing equipment 340 to pick individual semiconductor die 294 and place semiconductor die 294 onto carrier 330 a distance D9 apart to form reconstituted wafer 336. Reconstituted wafer 336 includes, for example, 10 mm by 10 mm semiconductor die 294 and standard dimensions of carrier 330, width W3 and length L3. Processing equipment 340 is configured with control system 342 to perform back-end processes on reconstituted wafer 336, which is on carrier 330. Control system 342 directs processing equipment 340 to perform deposition and other manufacturing steps according to the 10 mm by 10 mm size of semiconductor die 294 and standard size carrier 330.

Control system 342 allows processing equipment 340 to be customized for each reconstituted wafer on standardized carrier 330. Processing equipment 340 does not need to be re-built for a different size of semiconductor die. After processing reconstituted wafer 336, processing equipment 340 is ready to process another reconstituted wafer on carrier 330 with the same or different semiconductor die size and spacing. The specifications of reconstituted wafer 338 are inputted into control system 342. Control system 342 is programmed to control processing equipment 340 to pick individual semiconductor die 304 and place semiconductor die 304 onto carrier 330 a distance D10 apart to form reconstituted wafer 338. Reconstituted wafer 338 includes, for example, 5 mm by 5 mm semiconductor die 304 and standard dimensions of carrier 330, width W3 and length L3. Processing equipment 340 is configured with control system 342 to perform back-end processes on reconstituted wafer 338, which is on carrier 330. Control system 342 directs processing equipment 340 to perform deposition and other manufacturing steps according to the 5 mm by 5 mm size of semiconductor die 304 and standard size carrier 330.

Processing equipment 340 remains constant whether processing equipment 340 is processing reconstituted wafer 336 or 338, or other reconstituted wafer on standardized carrier 330. Control system 342 is programmable and processing equipment 340 is easily adaptable to any reconstituted wafer which uses carrier 330. Therefore, the mechanical and physical characteristics of processing equipment 340 are designed to accommodate the physical characteristics of standardized carrier 330, while processing equipment 340 is also programmable with control system 342 to perform manufacturing processes on any configuration of semiconductor die on carrier 330.

Processing equipment 340 is used for manufacturing a variety of semiconductor packages from a reconstituted wafer on carrier 330. For example, processing equipment 340 can be used to process reconstituted wafer 336 or 338 into fan-in WLCSP, reconstituted or eWLCSP, fan-out WLCSP, flipchip packages, 3D packages, such as PoP, or other semiconductor packages. Control system 342 is used to modify and control the operation of processing equipment 340 to perform back-end manufacturing steps according to the semiconductor package to be produced. Therefore, processing equipment 340 can be used to manufacture each semiconductor package described herein. Processing equipment 340 can be used across multiple product manufacturing lines which share the same size carrier 330. Accordingly, the cost associated with changes in the size of semiconductor die, the size of semiconductor wafer, and type of semiconductor package can be reduced. The risk of investment in processing equipment 340 is reduced, because the design of processing equipment 340 is simplified where carrier 330 is standardized.

In FIG. 9i, an encapsulant or molding compound 344 is deposited over semiconductor die 294 and carrier 330 using a paste printing, transfer molding, liquid encapsulant molding, vacuum lamination, spin coating, or other suitable applicator. Encapsulant 344 can be polymer composite material, such as epoxy resin with filler, epoxy acrylate with filler, or polymer with proper filler. Encapsulant 344 is non-conductive and environmentally protects the semiconductor device from external elements and contaminants. In another embodiment, encapsulant 344 is an insulating or dielectric layer which contains one or more layers of photosensitive low curing temperature dielectric resist, photosensitive composite resist, laminate compound film, insulation paste with filler, solder mask resist film, liquid or granular molding compound, polyimide, BCB, PBO, SiO2, Si3N4, SiON, Ta2O5, Al2O3, prepreg, or other dielectric material having similar insulating and structural properties deposited using printing, spin coating, spray coating, vacuum or pressure lamination with or without heat, or other suitable process. In one embodiment, encapsulant 344 is a low temperature curing photosensitive dielectric polymer with or without insulating fillers cured at less than 200° C.

In particular, encapsulant 344 is disposed along side surfaces 324 of semiconductor die 294 and thus covers each side surface 324 of semiconductor die 294. Accordingly, encapsulant 344 covers or contacts at least four surfaces of semiconductor die 294, i.e., four side surfaces 324 of semiconductor die 294. Encapsulant 344 also covers back surface 310 of semiconductor die 294. Encapsulant 344 protects semiconductor die 294 from degradation due to exposure to photons from light or other emissions. In one embodiment, encapsulant 344 is opaque and dark or black in color. FIG. 9i shows composite substrate or reconstituted wafer 336 covered by encapsulant 344. Encapsulant 344 can be used for laser marking reconstituted wafer 336 for alignment and singulation. Encapsulant 344 is formed over back surface 310 of semiconductor die 294, and can be thinned in a subsequent backgrinding step. Encapsulant 344 can also be deposited such that encapsulant 344 is coplanar with back surface 310 and does not cover back surface 310 of semiconductor die 294.

In FIG. 9j, a backside surface 346 of encapsulant 344 undergoes a grinding operation with grinder 345 to planarize and reduce a thickness of encapsulant 344. A chemical etch can also be used to remove and planarize encapsulant 344 and to form planar backside surface 347. In one embodiment, a thickness of encapsulant 344 maintains coverage over back surface 310 of semiconductor die 294. In one embodiment, the thickness of encapsulant 344 remaining over back surface 310 of semiconductor die 294 after deposition or backgrinding ranges from approximately 170-230 μm or less. In another embodiment, the thickness of encapsulant 344 remaining over back surface 310 of semiconductor die 294 ranges from approximately 5-150 μm. A surface 348 of encapsulant 344 opposite backside surface 346 is disposed over carrier 330 and interface layer 332 such that surface 348 of encapsulant 344 may be coplanar with active surface 312 of semiconductor die 294.

FIG. 9k illustrates an alternative backgrinding step where encapsulant 344 is completely removed from back surface 310 of semiconductor die 294. After the grinding operation in FIG. 9k is completed, back surface 310 of semiconductor die 294 is exposed. A thickness of semiconductor die 294 can also be reduced by the backgrinding operation. In one embodiment, semiconductor die 294 has a thickness of 225-305 μm or less. After the backgrinding step, a cleaning process is performed to remove contamination from back surface 310 of semiconductor die 294 and from the back surface of reconstituted wafer 336. The cleaning process is a wet or a dry clean process performed prior to application of a backside protection layer. The cleaning process improves adhesion of the backside protection layer to reconstituted wafer 336.

In FIG. 9l, an insulating layer, passivation layer, or backside protection layer 349 is formed over encapsulant 344 and back surface 310 of semiconductor die 294 after completion of the backgrinding step in FIG. 9k. Backside protection layer 349 contains one or more layers of photosensitive low curing temperature dielectric resist, photosensitive composite resist, laminate compound film, resin matrix composite sheet with filler or glass fiber cloth, resin matrix composite sheet with both filler and glass fiber cloth, insulation paste with filler, solder mask resist film, liquid molding compound, granular molding compound, polyimide, BCB, PBO, SiO2, Si3N4, SiON, Ta2O5, Al2O3, prepreg, or other dielectric material having similar insulating and structural properties. Backside protection layer 349 is deposited using printing, spin coating, spray coating, vacuum or pressure lamination with or without heat, or other suitable process. In one embodiment, backside protection layer 349 is a low temperature curing photosensitive dielectric polymer with or without insulating fillers cured at less than 200° C. Backside protection layer 349 is a backside protection layer and provides mechanical protection for semiconductor die 294 and protection from light. In one embodiment, backside protection layer 349 has a thickness ranging from approximately 5-150 μm. Alternatively, backside protection layer 349 is a metal layer, such as Cu foil, applied to a backside of reconstituted wafer 336. Backside protection layer 349 contacts back surface 310 of semiconductor die 294 to transfer heat from semiconductor die 294 and improve the thermal performance of the device.

Carrier 330 and interface layer 332 are removed by chemical etching, mechanical peeling, CMP, mechanical grinding, thermal bake, UV light, laser scanning, or wet stripping to expose insulating layer 316, conductive layer 314, and surface 348 of encapsulant 344.

In FIG. 9m, an insulating or passivation layer 350 is formed over insulating layer 316 and conductive layer 314 using PVD, CVD, printing, spin coating, spray coating, screen printing or lamination. Insulating layer 350 can be one or more layers of SiO2, Si3N4, SiON, Ta2O5, Al2O3, or other material having similar insulating and structural properties. In one embodiment, insulating layer 350 is a photosensitive dielectric polymer low-cured at less than 200° C. In one embodiment, insulating layer 350 is formed within the footprint of semiconductor die 294 and does not extend beyond the footprint of semiconductor die 294 and over surface 348 of encapsulant 344. In other words, a peripheral region of semiconductor die 294 adjacent to semiconductor die 294 is devoid of insulating layer 350. In another embodiment, insulating layer 350 is formed over insulating layer 316, semiconductor die 294, and surface 348 of encapsulant 344, and a portion of insulating layer 350 over surface 348 of encapsulant 344 is removed by an etching process with a patterned photoresist layer or by LDA. A portion of insulating layer 350 is removed by an etching process with a patterned photoresist layer or by LDA to form openings 352 to expose conductive layer 314.

In FIG. 9n, an electrically conductive layer 354 is formed over insulating layer 350 and conductive layer 314 using a patterning and metal deposition process such as printing, PVD, CVD, sputtering, electrolytic plating, and electroless plating. Conductive layer 354 can be one or more layers of Al, Cu, Sn, Ti, Ni, Au, Ag, or other suitable electrically conductive material. A portion of conductive layer 354 extends horizontally along insulating layer 350 and parallel to active surface 312 of semiconductor die 294 to laterally redistribute the electrical interconnect to conductive layer 314. Conductive layer 354 operates as an RDL for the electrical signals of semiconductor die 294. Conductive layer 354 is formed over a footprint of semiconductor die 294 and does not extend beyond the footprint of semiconductor die 294 and over surface 348 of encapsulant 344. In other words, a peripheral region of semiconductor die 294 adjacent to semiconductor die 294 is devoid of conductive layer 354 such that a surface 348 of encapsulant 344 remains exposed from conductive layer 354. A portion of conductive layer 354 is electrically connected to conductive layer 314. Other portions of conductive layer 354 are electrically common or electrically isolated depending on the connectivity of semiconductor die 294.

An insulating or passivation layer 356 is formed over insulating layer 350 and conductive layer 354 using PVD, CVD, printing, spin coating, spray coating, screen printing or lamination. Insulating layer 356 can be one or more layers of SiO2, Si3N4, SiON, Ta2O5, Al2O3, or other material having similar insulating and structural properties. In one embodiment, insulating layer 356 is a photosensitive dielectric polymer low-cured at less than 200° C. In one embodiment, insulating layer 356 is formed within the footprint of semiconductor die 294 and does not extend beyond the footprint of semiconductor die 294 over encapsulant 344. In other words, a peripheral region of semiconductor die 294 adjacent to semiconductor die 294 is devoid of insulating layer 356 such that surface 348 of encapsulant 344 remains exposed from insulating layer 356. In another embodiment, insulating layer 356 is formed over insulating layer 316, semiconductor die 294, and encapsulant 344 and a portion of insulating layer 350 over encapsulant 344 is removed by an etching process with a patterned photoresist layer or by LDA. A portion of insulating layer 350 is removed by an etching process with a patterned photoresist layer or by LDA to form openings 358 to expose conductive layer 354.

In FIG. 9o, an electrically conductive layer 360 is formed over the exposed portion of conductive layer 354 and over insulating layer 356 after final repassivation using PVD, CVD, evaporation, electrolytic plating, electroless plating, or other suitable metal deposition process. Conductive layer 360 can be Al, Cu, Sn, Ni, Au, Ag, W, or other suitable electrically conductive material. Conductive layer 360 is a UBM electrically connected to conductive layers 354 and 314. UBMs 360 can be a multi-metal stack with adhesion layer, barrier layer, and seed or wetting layer. The adhesion layer is formed over conductive layer 354 and can be Ti, TiN, TiW, Al, or Cr. The barrier layer is formed over the adhesion layer and can be Ni, NiV, Pt, Pd, TiW, Ti, or CrCu. The barrier layer inhibits the diffusion of Cu into active surface 312 of semiconductor die 294. The seed layer is formed over the barrier layer and can be Cu, Ni, NiV, Au, or Al. UBMs 360 provide a low resistive interconnect to conductive layer 354, as well as a barrier to solder diffusion and seed layer for solder wettability.

An electrically conductive bump material is deposited over conductive layer 360 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 360 using a suitable attachment or bonding process. In one embodiment, the bump material is reflowed by heating the material above its melting point to form balls or bumps 362. In some applications, bumps 362 are reflowed a second time to improve electrical contact to conductive layer 360. Bumps 362 can also be compression bonded or thermocompression bonded to conductive layer 360. Bumps 362 represent one type of interconnect structure that can be formed over conductive layer 360. The interconnect structure can also use bond wires, conductive paste, stud bump, micro bump, or other electrical interconnect. Laser marking can be performed before or after bump formation, or after removal of carrier 330.

Collectively, insulating layers 350 and 356, conductive layers 354 and 360, and bumps 362 constitute a build-up interconnect structure 366 formed over semiconductor die 294 and within a footprint of semiconductor die 294. A peripheral region of semiconductor die 294 adjacent to semiconductor die 294 is devoid of interconnect structure 366 such that surface 348 of encapsulant 344 remains exposed from interconnect structure 366. Build-up interconnect structure 366 may include as few as one RDL or conductive layer, such as conductive layer 354, and one insulating layer, such as insulating layer 350. Additional insulating layers and RDLs can be formed over insulating layer 356 prior to forming bumps 362, to provide additional vertical and horizontal electrical connectivity across the package according to the design and functionality of semiconductor die 294.

In FIG. 9p, semiconductor die 294 are singulated through encapsulant 344 with saw blade or laser cutting tool 370 into individual eWLCSP 372. eWLCSP 372 undergoes electrical testing before or after singulation. Reconstituted wafer 336 is singulated into eWLCSP 372 to leave a thin layer of encapsulant 344 over side surfaces 324 of semiconductor die 294. Alternatively, reconstituted wafer 336 is singulated to completely remove encapsulant 344 from side surfaces 324.

FIG. 10 shows eWLCSP 372 after singulation having encapsulant over sidewall 324 of semiconductor die 294 and backside protection layer 349 over back surface 310 of semiconductor die 294. Semiconductor die 294 is electrically connected through conductive layers 314, 354 and 360 to bumps 362 for external interconnect through interconnect structure 366. Interconnect structure 366 does not extend beyond a footprint of semiconductor die 294 and thus forms a fan-in package. Backside protection layer 349 is formed over back surface 310 of semiconductor die 294 for mechanical protection and protection from degradation due to exposure to photons from light or other emissions.

Encapsulant 344 covers side surfaces 324 of semiconductor die 294 to protect semiconductor die 294 from degradation due to exposure to photons from light or other emissions. The thickness of encapsulant 344 over side surfaces 324 is less than 150 μm for eWLCSP 372. In one embodiment, eWLCSP 372 has dimensions of 4.595 mm in length×4.025 mm in width×0.470 mm in height with a pitch of 0.4 mm for bumps 362 where semiconductor die 294 has a length of 4.445 mm and a width of 3.875 mm. In another embodiment, the thickness of encapsulant 344 over side surfaces 324 of semiconductor die 294 is 75 μm or less. eWLCSP 372 has dimensions of 6.075 mm in length×6.075 mm in width×0.8 mm in height with a pitch of 0.5 mm for bumps 362 where semiconductor die 294 has dimensions of 6.0 mm in length×6.0 mm in width×0.470 mm in height. In yet another embodiment, eWLCSP 372 has dimensions of 5.92 mm in length×5.92 mm in width×0.765 mm in height with a pitch of 0.5 mm for bumps 362 where semiconductor die 294 has dimensions of 5.75 mm in length×5.75 mm in width×0.535 mm in height. In another embodiment, the thickness of encapsulant 344 over side surface 324 of semiconductor die 294 is 25 μm or less. In yet another embodiment, eWLCSP 372 can be formed with a length of 14 mm and a width of 14 mm. eWLCSP 372 is manufactured by forming a reconstituted wafer on standardized carrier 330 using equipment designed for a single standardized carrier size, which reduces equipment and material costs for eWLCSP 372. eWLCSP 372 is manufactured at a higher volume using standardized carrier 330, thereby simplifying the manufacturing process and reducing unit cost.

FIG. 11 shows an alternative eWLCSP 380 with backside protection layer 349 over back surface 310 of semiconductor die 294 and with exposed sidewalls 324 of semiconductor die 294. Semiconductor die 294 is electrically connected through conductive layers 314, 354 and 360 to bumps 362 for external interconnect through interconnect structure 366. Interconnect structure 366 does not extend beyond a footprint of semiconductor die 294 and thus forms a fan-in package. Backside protection layer 349 is formed over back surface 310 of semiconductor die 294 for mechanical protection and protection from degradation due to exposure to photons from light or other emissions. Encapsulant 344 is completely removed from side surfaces 324 of semiconductor die 294 during singulation to expose side surfaces 324. The length and width of eWLCSP 380 is the same as the length and width of semiconductor die 294. In one embodiment, eWLCSP 380 has dimensions of approximately 4.4 mm in length×3.9 mm in width with a pitch of 0.35-0.50 mm for bumps 362. In another embodiment, eWLCSP 380 can be formed with a length of 14 mm and a width of 14 mm. eWLCSP 380 is manufactured by forming a reconstituted wafer on standardized carrier 330 using equipment designed for a single standardized carrier size, which reduces equipment and material costs for eWLCSP 380. eWLCSP 380 is manufactured at a higher volume using standardized carrier 330, thereby simplifying the manufacturing process and reducing unit cost.

Figure 12:
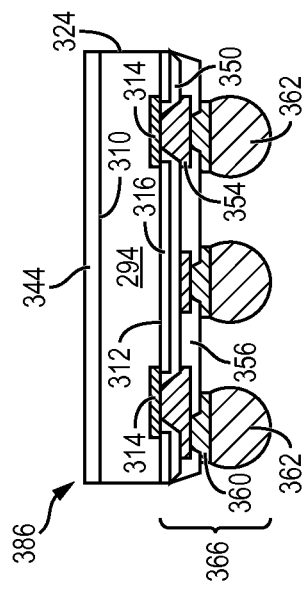
FIG. 12 illustrates an eWLCSP having an encapsulant over the sidewall and back surface of the semiconductor die.

FIG. 12 shows another eWLCSP 384 with encapsulant formed over back surface 310 and sidewalls 324 of semiconductor die 294. Semiconductor die 294 is electrically connected through conductive layers 314, 354 and 360 to bumps 362 for external interconnect through interconnect structure 366. Interconnect structure 366 does not extend beyond a footprint of semiconductor die 294 and thus forms a fan-in package. Encapsulant 344 remains over back surface 310 of semiconductor die 294 after the grinding operation shown in FIG. 9j. After singulation, encapsulant 344 remains over side surfaces 324 of semiconductor die 294 for mechanical protection and protection from degradation due to exposure to photons from light or other emissions. Therefore, encapsulant 344 is formed over five sides of semiconductor die 294, i.e., over four side surfaces 324 and over back surface 310. Encapsulant 344 over back surface 310 of semiconductor die 294 eliminates the need for a backside protection layer or backside laminate, thereby reducing the cost of eWLCSP 384.

The thickness of encapsulant 344 over side surfaces 324 is less than 150 μm for eWLCSP 384. In one embodiment, eWLCSP 384 has dimensions of 4.595 mm in length×4.025 mm in width×0.470 mm in height with a pitch of 0.4 mm for bumps 362 where semiconductor die 294 has a length of 4.445 mm and a width of 3.875 mm. In another embodiment, the thickness of encapsulant 344 over side surfaces 324 of semiconductor die 294 is 75 μm or less. eWLCSP 384 has dimensions of 6.075 mm in length×6.075 mm in width×0.8 mm in height with a pitch of 0.5 mm for bumps 362 where semiconductor die 294 has dimensions of 6.0 mm in length× 6.0 mm in width×0.470 mm in height. In yet another embodiment, eWLCSP 384 has dimensions of 5.92 mm in length×5.92 mm in width×0.765 mm in height with a pitch of 0.5 mm for bumps 362 where semiconductor die 294 has dimensions of 5.75 mm in length×5.75 mm in width×0.535 mm in height. In another embodiment, the thickness of encapsulant 344 over side surface 324 of semiconductor die 294 is 25 µm or less. In yet another embodiment, eWLCSP 384 can be formed with a length of 14 mm and a width of 14 mm. eWLCSP 384 is manufactured by forming a reconstituted wafer on standardized carrier 330 using equipment designed for a single standardized carrier size, which reduces equipment and material costs for eWLCSP 384. eWLCSP 384 is manufactured at a higher volume using standardized carrier 330, thereby simplifying the manufacturing process and reducing unit cost.

Figure 13:
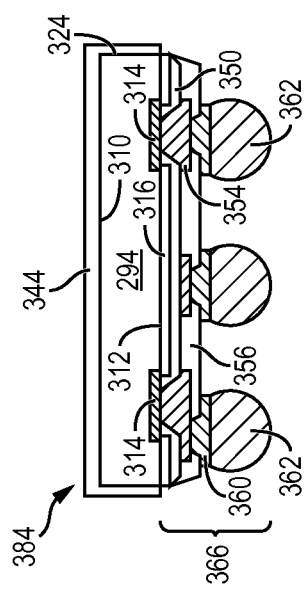
FIG. 13 illustrates an eWLCSP having encapsulant over the back surface of the semiconductor die.

FIG. 13 shows another eWLCSP 386 with backside encapsulant and exposed sidewalls. Semiconductor die 294 is electrically connected through conductive layers 314, 354 and 360 to bumps 362 for external interconnect through interconnect structure 366. Interconnect structure 366 does not extend beyond a footprint of semiconductor die 294 and thus forms a fan-in package. Encapsulant 344 remains over back surface 310 of semiconductor die 294 after the grinding operation shown in FIG. 9j. Encapsulant 344 over back surface 310 of semiconductor die 294 eliminates the need for a backside protection layer or backside laminate, thereby reducing the cost of eWLCSP 386. Encapsulant 344 is completely removed from side surfaces 324 of semiconductor die 294 during singulation to expose side surfaces 324. The length and width of eWLCSP 386 is the same as the length and width of semiconductor die 294. In one embodiment, eWLCSP 386 has dimensions of approximately 4.445 mm in length×3.875 mm in width with a pitch of 0.35-0.50 mm for bumps 362. In another embodiment, eWLCSP 386 can be formed with a length of 14 mm and a width of 14 mm. eWLCSP 386 is manufactured by forming a reconstituted wafer on standardized carrier 330 using equipment designed for a single standardized carrier size, which reduces equipment and material costs for eWLCSP 386. eWLCSP 386 is manufactured at a higher volume using standardized carrier 330, thereby simplifying the manufacturing process and reducing unit cost.

Figure 14:
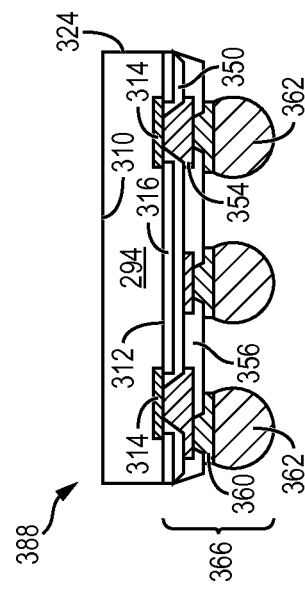
FIG. 14 illustrates an eWLCSP with the semiconductor die having exposed sidewalls and back surface.

FIG. 14 shows another eWLCSP 388 with exposed back surface 310 and sidewalls 324 of semiconductor die 294. Semiconductor die 294 is electrically connected through conductive layers 314, 354 and 360 to bumps 362 for external interconnect through interconnect structure 366. Interconnect structure 366 does not extend beyond a footprint of semiconductor die 294 and thus forms a fan-in package. Encapsulant 344 is completely removed from back surface 310 of semiconductor die 294 during the grinding operation shown in FIG. 9k. Encapsulant 344 is completely removed from side surfaces 324 of semiconductor die 294 during singulation to expose side surfaces 324. No encapsulant 344 remains covering a surface of semiconductor die 294 in eWLCSP 388. The length and width of eWLCSP 388 is the same as the length and width of semiconductor die 294. In one embodiment, eWLCSP 388 has dimensions of approximately 4.4 mm in length×3.9 mm in width with a pitch of 0.35-0.50 mm for bumps 362. eWLCSP 388 is manufactured by forming a reconstituted wafer on standardized carrier 330 using equipment designed for a single standardized carrier size, which reduces equipment and material costs for eWLCSP 388. eWLCSP 388 is manufactured at a higher volume using standardized carrier 330, thereby simplifying the manufacturing process and reducing unit cost.

Figure 15H:
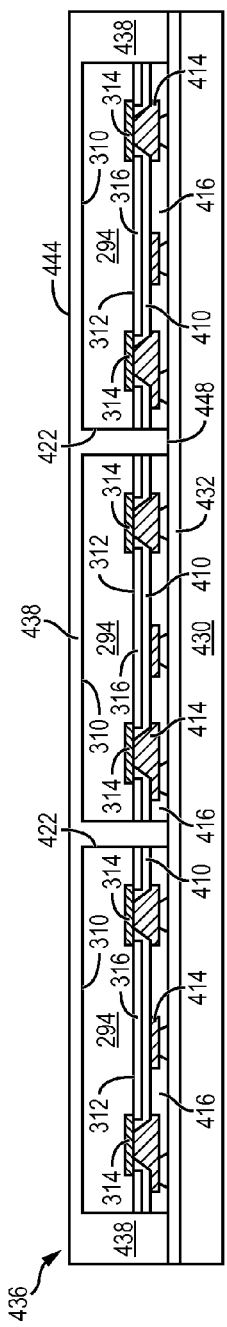

FIGS. 15a-15k illustrate, in relation to FIGS. 1 and 2a-2c, a process of forming a reconstituted or embedded fan-in WLCSP. Continuing from FIG. 9b, FIG. 15a shows a cross-sectional view of a portion of semiconductor wafer 290. Conductive layer 314 is formed over active surface 312 of semiconductor die 294. Insulating layer 316 is formed over active surface 312 and conductive layer 314 with openings formed through insulating layer 316 to expose conductive layer 314.

In FIG. 15a, an insulating layer 410 formed over insulating layer 316 and conductive layer 314. Insulating layer 410 contains one or more layers of SiO2, Si3N4, SiON, Ta2O5, Al2O3, or other material having similar insulating and structural properties. Insulating layer 410 is deposited using PVD, CVD, printing, spin coating, spray coating, sintering, thermal oxidation, or other suitable process. In one embodiment, insulating layer 410 is a photosensitive dielectric polymer low-cured at less than 200° C. In one embodiment, insulating layer 410 is formed over insulating layer 316, semiconductor die 294 and outside a footprint of semiconductor die 294 over base semiconductor material 292. In other words, a peripheral region of semiconductor die 294 adjacent to semiconductor die 294 includes insulating layer 410. A portion of insulating layer 410 is removed by an exposure or development process, LDA, etching, or other suitable process to form openings 412 to expose conductive pads 314.

In FIG. 15b, an electrically conductive layer 414 is formed over insulating layer 410 and conductive layer 314 using a patterning and metal deposition process such as printing, PVD, CVD, sputtering, electrolytic plating, and electroless plating. Conductive layer 414 can be one or more layers of Al, Cu, Sn, Ti, Ni, Au, Ag, or other suitable electrically conductive material. A portion of conductive layer 414 extends horizontally along insulating layer 410 and parallel to active surface 312 of semiconductor die 294 to laterally redistribute the electrical interconnect to conductive layer 314. Conductive layer 414 operates as an RDL for the electrical signals of semiconductor die 294. Conductive layer 414 is formed over a footprint of semiconductor die 294 and does not extend beyond the footprint of semiconductor die 294. In other words, a peripheral region of semiconductor die 294 adjacent to semiconductor die 294 is devoid of conductive layer 414. A portion of conductive layer 414 is electrically connected to conductive layer 314. Other portions of conductive layer 414 are electrically common or electrically isolated depending on the connectivity of semiconductor die 294.

An insulating or passivation layer 416 is formed over insulating layer 410 and conductive layer 414 using PVD, CVD, printing, spin coating, spray coating, screen printing or lamination. Insulating layer 416 can be one or more layers of SiO2, Si3N4, SiON, Ta2O5, Al2O3, or other material having similar insulating and structural properties. In one embodiment, insulating layer 416 is a photosensitive dielectric polymer low-cured at less than 200° C. In one embodiment, insulating layer 416 is formed over semiconductor die 294 and outside a footprint of semiconductor die 294 over base semiconductor material 292. In another embodiment, insulating layer 416 is formed within the footprint of semiconductor die 294 and does not extend beyond the footprint of semiconductor die 294. A portion of insulating layer 416 is removed by an etching process with a patterned photoresist layer or by LDA to form openings 418 to expose conductive layer 414.

In FIG. 15c, semiconductor wafer 290 is singulated through saw street 296 using a saw blade or laser cutting tool 420 into individual semiconductor die 294. Semiconductor wafer 290 is also singulated through insulating layer 316, insulating layer 410, and insulating layer 416 to form side walls or side surfaces 422. Side surfaces 422 include sides of semiconductor die 294 and insulating layers 316, 410, and 416. Individual semiconductor die 294 can be inspected and electrically tested for identification of KGD post singulation.

In FIG. 15d, semiconductor die 294 from FIG. 15c are mounted to carrier 430 and interface layer 432 using, for example, a pick and place operation with active surface 312 oriented toward carrier 430. Semiconductor die 294 mounted to interface layer 432 of carrier 430 to form reconstituted or reconfigured wafer 436.

Carrier 430 can be a round or rectangular panel (greater than 300 mm) with capacity for multiple semiconductor die 294. Carrier 430 may have a larger surface area than the surface area of semiconductor wafer 290 or 300. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 430 is selected independent of the size of semiconductor die 294 or size of semiconductor wafers 290 and 300. That is, carrier 430 has fixed or standardized size, which can accommodate various size semiconductor die 294 singulated from one or more semiconductor wafers 290 and 300. In one embodiment, carrier 430 is circular with a diameter of 330 mm. In another embodiment, carrier 430 is rectangular with a width of 560 mm and length of 600 mm. Semiconductor die 294 may have dimensions of 10 mm by 10 mm, which are placed on standardized carrier 430. Alternatively, semiconductor die 294 may have dimensions of 20 mm by 20 mm, which are placed on the same standardized carrier 430. Accordingly, standardized carrier 430 can handle any size semiconductor die 294, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 430 lowers manufacturing costs and capital risk by reducing or eliminating the need for specialized semiconductor processing lines based on die size or incoming wafer size. By selecting a predetermined carrier size to use for any size semiconductor die from all semiconductor wafers, a flexible manufacturing line can be implemented.

Reconstituted wafer 436 can be processed into many types of semiconductor packages, including fan-in WLCSP, reconstituted or eWLCSP, fan-out WLCSP, flipchip packages, 3D packages, such as PoP, or other semiconductor packages. Reconstituted wafer 436 is configured according to the specifications of the resulting semiconductor package. In one embodiment, semiconductor die 294 are placed on carrier 430 in a high-density arrangement, i.e., 300 µm apart or less, for processing fan-in devices. Semiconductor die 294 are placed onto carrier 430 separated by a gap or distance D12 between semiconductor die 294. Distance D12 between semiconductor die 294 is selected based on the design and specifications of the semiconductor package to be processed. In one embodiment, distance D12 between semiconductor die 294 is 50 µm or less. In another embodiment, distance D12 between semiconductor die 294 is 100 µm or less. Distance D12 between semiconductor die 294 on carrier 430 is optimized for manufacturing the semiconductor packages at the lowest unit cost.

FIG. 15e shows a plan view of reconstituted wafer 436 with semiconductor die 294 disposed over carrier 430. Carrier 430 is a standardized shape and size with capacity for various sizes and quantities of semiconductor die, which are singulated from various sizes of semiconductor wafers. In one embodiment, carrier 430 is rectangular in shape and has a width W4 of 560 mm and a length L4 of 600 mm. The number of semiconductor die 294 mounted to carrier 430 can be greater than, less than, or equal to the number of semiconductor die 294 singulated from semiconductor wafer 290. The larger surface area of carrier 430 accommodates more semiconductor die 294 and lowers manufacturing cost as more semiconductor die 294 are processed per reconstituted wafer 436.

The standardized carrier, carrier 430, is fixed in size and can accommodate multiple sizes of semiconductor die. The size of standardized carrier 430 is independent of the dimensions of the semiconductor die or semiconductor wafer. More small semiconductor die than larger semiconductor die can fit over carrier 430. For example, carrier 430 accommodates a greater number of 5 mm by 5 mm die over the surface area of carrier 430 than a number of 10 mm by 10 mm die over the surface area of carrier 430.

For example, semiconductor die 294 having dimensions of 10 mm by 10 mm are placed on carrier 430 with a distance D12 of 200 µm between adjacent semiconductor die 294. The number of semiconductor die 294 singulated from semiconductor wafer 290 is approximately 600 semiconductor die, where semiconductor wafer 290 has a diameter of 300 mm. The number of 10 mm by 10 mm semiconductor die 294 which can fit on carrier 430 is approximately 3,000 semiconductor die. Alternatively, semiconductor die 294 having dimensions of 5 mm by 5 mm are placed on carrier 430 with a distance D12 of 200 µm between adjacent semiconductor die 294. The number of semiconductor die 294 singulated from semiconductor wafer 290, where semiconductor wafer 290 has a diameter of 200 mm, is approximately 1,000 semiconductor die. The number of 5 mm by 5 mm semiconductor die 294, which can fit on carrier 430, is approximately 12,000 semiconductor die.

The size of carrier 430 does not vary with the size of semiconductor die being processed. The number of semiconductor die 294, which fit on carrier 430, varies with the size of semiconductor die 294 and space or distance D12 between semiconductor die 294. The size and shape of carrier 430 remains fixed and independent of the size of semiconductor die 294 or semiconductor wafer 290 from which semiconductor die 294 are singulated. Carrier 430 and reconstituted wafer 436 provide the flexibility to manufacture many different types of semiconductor packages with different size semiconductor die 294 from different sized semiconductor wafers 290 using a common set of processing equipment, such as processing equipment 340 from FIG. 9h.

In FIG. 15f, an encapsulant or molding compound 438 is deposited over semiconductor die 294 and carrier 430 using a paste printing, transfer molding, liquid encapsulant molding, vacuum lamination, spin coating, or other suitable applicator. Encapsulant 438 can be polymer composite material, such as epoxy resin with filler, epoxy acrylate with filler, or polymer with proper filler. Encapsulant 438 is non-conductive and environmentally protects the semiconductor device from external elements and contaminants. In another embodiment, encapsulant 438 is an insulating or dielectric layer which contains one or more layers of photosensitive low curing temperature dielectric resist, photosensitive composite resist, laminate compound film, insulation paste with filler, solder mask resist film, liquid or granular molding compound, polyimide, BCB, PBO, SiO2, Si3N4, SiON, Ta2O5, Al2O3, prepreg, or other dielectric material having similar insulating and structural properties deposited using printing, spin coating, spray coating, vacuum or pressure lamination with or without heat, or other suitable process. In one embodiment, encapsulant 438 is a low temperature curing photosensitive dielectric polymer with or without insulating fillers cured at less than 200° C.

In particular, encapsulant 438 is disposed along side surfaces 422 of semiconductor die 294 and thus covers each side surface 422 of semiconductor die 294 and insulating layers 316, 410, and 416. Accordingly, encapsulant 438 covers or contacts at least four surfaces of semiconductor die 294, i.e., four side surfaces 422 of semiconductor die 294. Encapsulant 438 also covers back surface 310 of semiconductor die 294. Encapsulant 438 protects semiconductor die 294 from degradation due to exposure to photons from light or other emissions. In one embodiment, encapsulant 438 is opaque and dark or black in color. Encapsulant 438 can be used for laser marking reconstituted wafer 436 for alignment and singulation. In another embodiment, encapsulant 438 is deposited such that encapsulant 438 is coplanar with back surface 310 of semiconductor die 294 and does not cover back surface 310.

In FIG. 15g, a backside surface 440 of encapsulant 344 undergoes a grinding operation with grinder 442 to planarize and reduce a thickness of encapsulant 438. A chemical etch can also be used to remove and planarize encapsulant 438 and to form planar backside surface 444. In one embodiment, a thickness of encapsulant 438 maintains coverage over back surface 310 of semiconductor die 294. In another embodiment, back surface 310 of semiconductor die 294 is exposed during the backgrinding step. A thickness of semiconductor die 294 can also be reduced by the grinding operation. In one embodiment, semiconductor die 294 has a thickness of 225-305 µm or less.

FIG. 15h shows reconstituted wafer 436 covered by encapsulant 438. In one embodiment, the thickness of encapsulant 438 remaining over back surface 310 of semiconductor die 294 after deposition or backgrinding ranges from approximately 170-230 µm or less. In another embodiment, the thickness of encapsulant 438 remaining over back surface 310 of semiconductor die 294 ranges from approximately 5-150 µm. A surface 448 of encapsulant 438 opposite backside surface 440 is disposed over carrier 430 and interface layer 432.

Figure 15I:
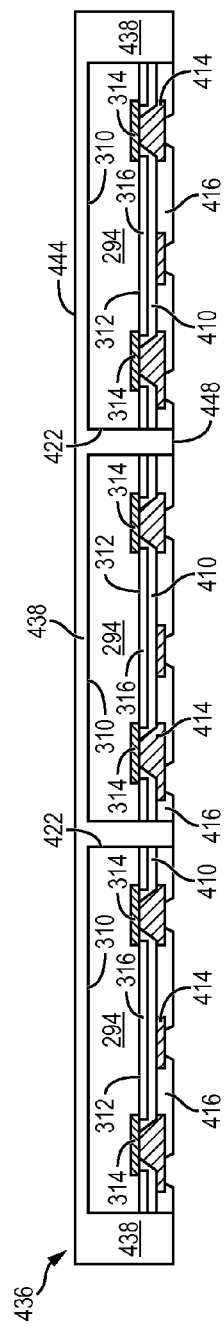

In FIG. 15i, carrier 430 and interface layer 432 are removed by chemical etching, mechanical peeling, CMP, mechanical grinding, thermal bake, UV light, laser scanning, or wet stripping to expose insulating layer 416, conductive layer 414, and surface 448 of encapsulant 438.

Figure 15J:
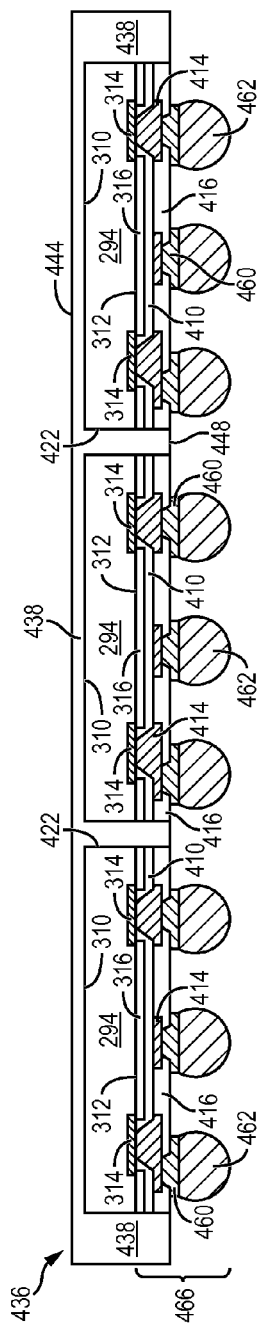

In FIG. 15j, an electrically conductive layer 460 is formed over the exposed portion of conductive layer 414 and over insulating 416 after final repassivation using PVD, CVD, evaporation, electrolytic plating, electroless plating, or other suitable metal deposition process. Conductive layer 460 can be Al, Cu, Sn, Ni, Au, Ag, W, or other suitable electrically conductive material. Conductive layer 460 is a UBM electrically connected to conductive layers 414 and 314. UBMs 460 can be a multi-metal stack with adhesion layer, barrier layer, and seed or wetting layer. The adhesion layer is formed over conductive layer 414 and can be Ti, TiN, TiW, Al, or Cr. The barrier layer is formed over the adhesion layer and can be Ni, NiV, Pt, Pd, TiW, Ti, or CrCu. The barrier layer inhibits the diffusion of Cu into active surface 312 of semiconductor die 294. The seed layer is formed over the barrier layer and can be Cu, Ni, NiV, Au, or Al. UBMs 460 provide a low resistive interconnect to conductive layer 414, as well as a barrier to solder diffusion and seed layer for solder wettability.

An electrically conductive bump material is deposited over conductive layer 460 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 460 using a suitable attachment or bonding process. In one embodiment, the bump material is reflowed by heating the material above its melting point to form balls or bumps 462. In some applications, bumps 462 are reflowed a second time to improve electrical contact to conductive layer 460. Bumps 462 can also be compression bonded or thermocompression bonded to conductive layer 460. Bumps 462 represent one type of interconnect structure that can be formed over conductive layer 460. The interconnect structure can also use bond wires, conductive paste, stud bump, micro bump, or other electrical interconnect. Laser marking can be performed before or after bump formation, or after removal of carrier 430.

Collectively, insulating layers 410 and 416, conductive layers 414 and 460, and bumps 462 constitute a build-up interconnect structure 466 formed over semiconductor die 294 and within a footprint of semiconductor die 294. A peripheral region of semiconductor die 294 adjacent to semiconductor die 294 is devoid of interconnect structure 466, and surface 448 of encapsulant 438 remains exposed from interconnect structure 466. Build-up interconnect structure 466 may include as few as one RDL or conductive layer, such as conductive layer 414, and one insulating layer, such as insulating layer 410. Additional insulating layers and RDLs can be formed over insulating layer 416 prior to forming bumps 462, to provide additional vertical and horizontal electrical connectivity across the package according to the design and functionality of semiconductor die 294.

In FIG. 15k, semiconductor die 294 are singulated through encapsulant 438 with saw blade or laser cutting tool 470 into individual eWLCSP 472. Reconstituted wafer 436 is singulated into eWLCSP 472 to leave a thin layer of encapsulant 438 over side surfaces 422 of semiconductor die 294 and insulating layers 316, 410, and 416. Alternatively, reconstituted wafer 436 is singulated to completely remove encapsulant 438 from side surfaces 422. eWLCSP 472 undergoes electrical testing before or after singulation.

FIG. 16 shows eWLCSP 472 with encapsulant formed over back surface 310 and sidewalls 422 of semiconductor die 294. Semiconductor die 294 is electrically connected through conductive layers 314, 414, and 460 to bumps 462 for external interconnect through interconnect structure 466. Interconnect structure 466 does not extend beyond a footprint of semiconductor die 294 and thus forms a fan-in package. Encapsulant 438 remains over back surface 310 of semiconductor die 294 after the grinding operation shown in FIG. 15g. Encapsulant 438 remains over side surfaces 422 of semiconductor die 294 and insulating layers 316, 410, and 416 for mechanical protection and protection from degradation due to exposure to photons from light or other emissions. Therefore, encapsulant 438 is formed over five sides of semiconductor die 294, i.e., over four side surfaces 422 and over back surface 310. Encapsulant 438 over back surface 310 of semiconductor die 294 eliminates the need for a backside protection layer or backside laminate, thereby reducing the cost of eWLCSP 472.

The thickness of encapsulant 438 over side surfaces 422 is less than 150 μm for eWLCSP 472. In one embodiment, eWLCSP 472 has dimensions of 4.595 mm in length×4.025 mm in width×0.470 mm in height with a pitch of 0.4 mm for bumps 462 where semiconductor die 294 has a length of 4.445 mm and a width of 3.875 mm. In another embodiment, the thickness of encapsulant 438 over side surfaces 324 of semiconductor die 294 is 75 μm or less. eWLCSP 472 has dimensions of 6.075 mm in length×6.075 mm in width×0.8 mm in height with a pitch of 0.5 mm for bumps 462 where semiconductor die 294 has dimensions of 6.0 mm in length×6.0 mm in width×0.470 mm in height. In yet another embodiment, eWLCSP 472 has dimensions of 5.92 mm in length×5.92 mm in width×0.765 mm in height with a pitch of 0.5 mm for bumps 462 where semiconductor die 294 has dimensions of 5.75 mm in length×5.75 mm in width×0.535 mm in height. In another embodiment, the thickness of encapsulant 438 over side surface 422 is 25 μm or less. In yet another embodiment, eWLCSP 472 can be formed with a length of 14 mm and a width of 14 mm. eWLCSP 472 is manufactured by forming a reconstituted wafer on standardized carrier 430 using equipment designed for a single standardized carrier size, which reduces equipment and material costs for eWLCSP 472. eWLCSP 472 is manufactured at a higher volume using standardized carrier 430, thereby simplifying the manufacturing process and reducing unit cost.

FIG. 17 shows another eWLCSP 480 with encapsulant 438 over back surface 310 of semiconductor die 294 and with exposed sidewalls 422 of semiconductor die 294. Semiconductor die 294 is electrically connected through conductive layers 314, 414, and 460 to bumps 462 for external interconnect through interconnect structure 466. Interconnect structure 466 does not extend beyond a footprint of semiconductor die 294 and thus forms a fan-in package. Encapsulant 438 remains over back surface 310 of semiconductor die 294 after the grinding operation shown in FIG. 15g. Encapsulant 438 over back surface 310 of semiconductor die 294 eliminates the need for a backside protection layer or backside laminate, thereby reducing the cost of eWLCSP 480. Encapsulant 438 is completely removed from side surfaces 422 of semiconductor die 294 and insulating layers 316, 410, and 416 during singulation to expose side surfaces 422. The length and width of eWLCSP 480 is the same as the length and width of semiconductor die 294. In one embodiment, eWLCSP 480 has dimensions of approximately 4.445 mm in length×3.875 mm in width with a pitch of 0.35-0.50 mm for bumps 462. In another embodiment, eWLCSP 480 can be formed with a length of 14 mm and a width of 14 mm. eWLCSP 480 is manufactured by forming a reconstituted wafer on standardized carrier 430 using equipment designed for a single standardized carrier size, which reduces equipment and material costs for eWLCSP 480. eWLCSP 480 is manufactured at a higher volume using standardized carrier 430, thereby simplifying the manufacturing process and reducing unit cost.

Figure 18:
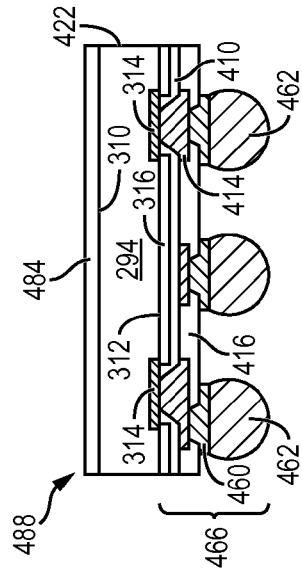
FIG. 18 illustrates an eWLCSP having encapsulant over the sidewall and a backside protection layer.

FIG. 18 shows eWLCSP 482 after singulation having encapsulant over sidewalls 422 of semiconductor die 294 and backside protection layer 484. Semiconductor die 294 is electrically connected through conductive layers 314, 414, and 460 to bumps 462 for external interconnect through interconnect structure 466. Interconnect structure 466 does not extend beyond a footprint of semiconductor die 294 and thus forms a fan-in package. Encapsulant 438 is completely removed from back surface 310 of semiconductor die 294. Backside insulating layer or backside protection layer 484 is formed over back surface 310 of semiconductor die 294 for mechanical protection and protection from degradation due to exposure to photons from light or other emissions. Backside protection layer 484 contains one or more layers of photosensitive low curing temperature dielectric resist, photosensitive composite resist, laminate compound film, resin matrix composite sheet with filler or glass fiber cloth, resin matrix composite sheet with both filler and glass fiber cloth, insulation paste with filler, solder mask resist film, liquid molding compound, granular molding compound, polyimide, BCB, PBO, SiO2, Si3N4, SiON, Ta2O5, Al2O3, prepreg, or other dielectric material having similar insulating and structural properties. Backside protection layer 484 is deposited using printing, spin coating, spray coating, vacuum or pressure lamination with or without heat, or other suitable process. In one embodiment, backside protection layer 484 is a low temperature curing photosensitive dielectric polymer with or without insulating fillers cured at less than 200° C. Backside protection layer 484 provides mechanical protection for semiconductor die 294 and protection from light. In one embodiment, backside protection layer 484 has a thickness ranging from approximately 5-150 μm. Alternatively, backside protection layer 484 is a metal layer, such as Cu foil, applied to a backside of reconstituted wafer 436. Backside protection layer 484 contacts back surface 310 of semiconductor die 294 to transfer heat from semiconductor die 294 and improve the thermal performance of the device.

Encapsulant 438 covers side surfaces 422 of semiconductor die 294 to protect semiconductor die 294 from degradation due to exposure to photons from light or other emissions. The thickness of encapsulant 438 over side surfaces 422 is less than 150 μm for eWLCSP 482. In one embodiment, eWLCSP 482 has dimensions of 4.595 mm in length× 4.025 mm in width×0.470 mm in height with a pitch of 0.4 mm for bumps 462 where semiconductor die 294 has a length of 4.445 mm and a width of 3.875 mm. In another embodiment, the thickness of encapsulant 438 over side surfaces 422 is 75 μm or less. eWLCSP 482 has dimensions of 6.075 mm in length×6.075 mm in width×0.8 mm in height with a pitch of 0.5 mm for bumps 462 where semiconductor die 294 has dimensions of 6.0 mm in length×6.0 mm in width×0.470 mm in height. In yet another embodiment, eWLCSP 482 has dimensions of 5.92 mm in length×5.92 mm in width×0.765 mm in height with a pitch of 0.5 mm for bumps 462 where semiconductor die 294 has dimensions of 5.75 mm in length×5.75 mm in width×0.535 mm in height. In another embodiment, the thickness of encapsulant 438 over side surface 422 is 25 μm or less. In yet another embodiment, eWLCSP 482 can be formed with a length of 14 mm and a width of 14 mm. eWLCSP 482 is manufactured by forming a reconstituted wafer on standardized carrier 430 using equipment designed for a single standardized carrier size, which reduces equipment and material costs for eWLCSP 482. eWLCSP 482 is manufactured at a higher volume using standardized carrier 430, thereby simplifying the manufacturing process and reducing unit cost.

Figure 19:
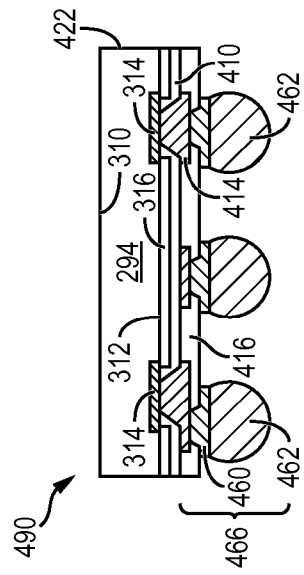
FIG. 19 illustrates an eWLCSP having a backside protection layer.

FIG. 19 shows an alternative eWLCSP 488 with backside protection layer 484 and exposed sidewalls 422. Semiconductor die 294 is electrically connected through conductive layers 314, 414 and 460 to bumps 462 for external interconnect through interconnect structure 466. Interconnect structure 466 does not extend beyond a footprint of semiconductor die 294 and thus forms a fan-in package. Encapsulant 438 is completely removed from back surface 310 of semiconductor die 294. Backside insulating layer or backside protection layer 484 is formed over back surface 310 of semiconductor die 294 for mechanical protection and protection from degradation due to exposure to photons from light or other emissions. Encapsulant 438 is completely removed from side surfaces 324 of semiconductor die 294 during singulation to expose side surfaces 422. The length and width of eWLCSP 488 is the same as the length and width of semiconductor die 294. In one embodiment, eWLCSP 488 has dimensions of approximately 4.4 mm in length×3.9 mm in width with a pitch of 0.35-0.50 mm for bumps 462. In another embodiment, eWLCSP 488 can be formed with a length of 14 mm and a width of 14 mm. eWLCSP 488 is manufactured by forming a reconstituted wafer on standardized carrier 430 using equipment designed for a single standardized carrier size, which reduces equipment and material costs for eWLCSP 488. eWLCSP 488 is manufactured at a higher volume using standardized carrier 430, thereby simplifying the manufacturing process and reducing unit cost.

Figure 20:
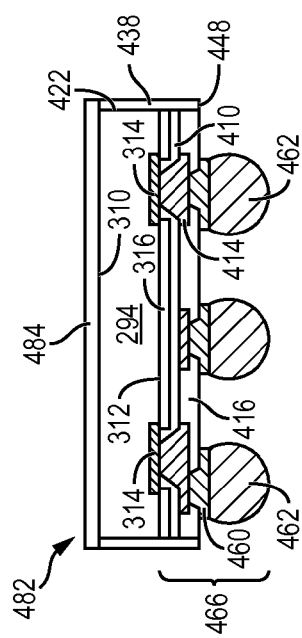
FIG. 20 illustrates another eWLCSP having encapsulant over the sidewall and a backside protection layer.

FIG. 20 shows an eWLCSP 486, similar to eWLCSP 482, but without conductive layer 460. Bumps 462 are formed directly on conductive layer 414. The bump material is bonded to conductive layer 414 using a suitable attachment or bonding process. In one embodiment, the bump material is reflowed by heating the material above its melting point to form balls or bumps 462. In some applications, bumps 462 are reflowed a second time to improve electrical contact to conductive layer 414. Bumps 462 can also be compression bonded or thermocompression bonded to conductive layer 414. Bumps 462 represent one type of interconnect structure that can be formed over conductive layer 414. The interconnect structure can also use bond wires, conductive paste, stud bump, micro bump, or other electrical interconnect.

Semiconductor die 294 is electrically connected through conductive layers 314 and 414 to bumps 462 for external interconnect through interconnect structure 466. Interconnect structure 466 does not extend beyond a footprint of semiconductor die 294 and thus forms a fan-in package. Encapsulant 438 is completely removed from back surface 310 of semiconductor die 294. Backside protection layer 484 is formed over back surface 310 of semiconductor die 294 for mechanical protection and protection from degradation due to exposure to photons from light or other emissions. Encapsulant 438 covers side surfaces 422 of semiconductor die 294 to protect semiconductor die 294 from degradation due to exposure to photons from light or other emissions. The thickness of encapsulant 438 over side surfaces 422 is less than 150 μm for eWLCSP 486. eWLCSP 486 is manufactured by forming a reconstituted wafer on standardized carrier 430 using equipment designed for a single standardized carrier size, which reduces equipment and material costs for eWLCSP 486. eWLCSP 486 is manufactured at a higher volume using standardized carrier 430, thereby simplifying the manufacturing process and reducing unit cost.

Figure 21:
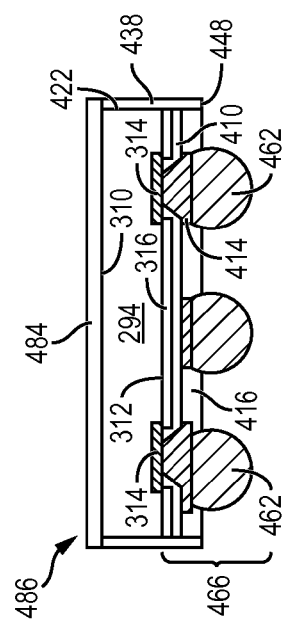
FIG. 21 illustrates an eWLCSP with a semiconductor die having exposed sidewalls and back surface.

FIG. 21 shows another eWLCSP 490 with exposed back surface 310 and sidewalls 422 of semiconductor die 294. Semiconductor die 294 is electrically connected through conductive layers 314, 414, and 460 to bumps 462 for external interconnect through interconnect structure 466. Interconnect structure 466 does not extend beyond a footprint of semiconductor die 294 and thus forms a fan-in package. Encapsulant 438 is completely removed from back surface 310 of semiconductor die 294 during the grinding operation shown in FIG. 15g. Encapsulant 438 is completely removed from side surfaces 422 of semiconductor die 294 during singulation to expose side surfaces 422. The length and width of eWLCSP 490 is the same as the length and width of semiconductor die 294. In one embodiment, eWLCSP 490 has dimensions of approximately 4.4 mm in length×3.9 mm in width with a pitch of 0.35-0.50 mm for bumps 462. eWLCSP 490 is manufactured by forming a reconstituted wafer on standardized carrier 430 using equipment designed for a single standardized carrier size, which reduces equipment and material costs for eWLCSP 490. eWLCSP 490 is manufactured at a higher volume using standardized carrier 430, thereby simplifying the manufacturing process and reducing unit cost.

Figure 22A:
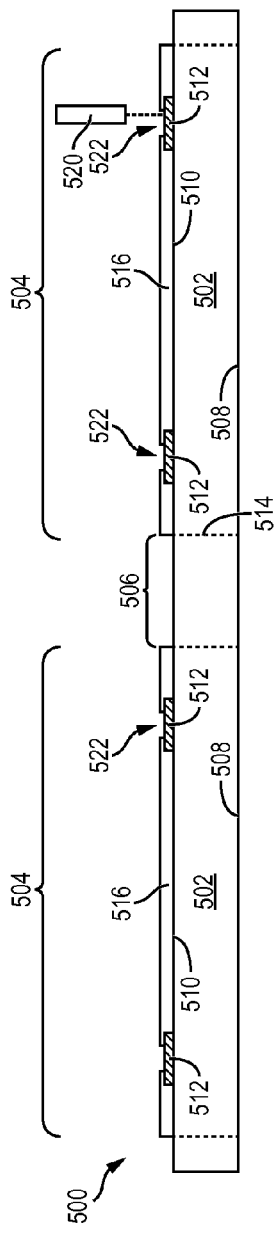

FIGS. 22a-22m illustrate, in relation to FIGS. 1 and 2a-2c, a process of forming a fan-in eWLCSP having encapsulant over the sidewall of the semiconductor die and having an exposed back surface. FIG. 22a shows a cross-sectional view of a portion of semiconductor wafer 500 with a base substrate material 502, such as silicon, germanium, gallium arsenide, indium phosphide, or silicon carbide, for structural support. A plurality of semiconductor die or components 504 is formed on wafer 500 separated by a non-active, inter-die wafer area or saw street 506. Saw street 506 provides cutting areas to singulate semiconductor wafer 500 into individual semiconductor die 504. In one embodiment, semiconductor wafer 500 is 200-300 mm in diameter. In another embodiment, semiconductor wafer 500 is 100-450 mm in diameter. Semiconductor wafer 500 may have any diameter prior to singulating semiconductor wafer 500 into individual semiconductor die 504.

Each semiconductor die 504 has a back or non-active surface 508 and an active surface 510 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 510 to implement analog circuits or digital circuits, such as DSP, ASIC, memory, or other signal processing circuit. Semiconductor die 504 may also contain IPDs, such as inductors, capacitors, and resistors, for RF signal processing.

An electrically conductive layer 512 is formed over active surface 510 using PVD, CVD, electrolytic plating, electroless plating process, or other suitable metal deposition process. Conductive layer 512 can be one or more layers of Al, Cu, Sn, Ni, Au, Ag, or other suitable electrically conductive material. Conductive layer 512 operates as contact pads electrically connected to the circuits on active surface 510. Conductive layer 512 can be formed as contact pads disposed side-by-side a first distance from edge or sidewall 514 of semiconductor die 504, as shown in FIG. 22a. Alternatively, conductive layer 512 can be formed as contact pads that are offset in multiple rows such that a first row of contact pads is disposed a first distance from edges 514 of semiconductor die 504, and a second row of contact pads alternating with the first row is disposed a second distance from edges 514 of semiconductor die 504.

A first insulating or passivation layer 516 is formed over semiconductor die 504 and conductive layer 512 using PVD, CVD, printing, spin coating, spray coating, sintering or thermal oxidation. Insulating layer 516 contains one or more layers of SiO2, Si3N4, SiON, Ta2O5, Al2O3, Hf02, BCB, PI, PBO, polymer, or other dielectric material having similar structural and insulating properties. In one embodiment, insulating layer 516 is a low temperature curing photosensitive dielectric polymer with or without insulating fillers cured at less than 200° C. Insulating layer 516 covers and provides protection for active surface 510. Insulating layer 516 is conformally applied over conductive layer 512 and active surface 510 of semiconductor die 504 and does not extend over edges 514 of semiconductor die 504 or beyond a footprint of semiconductor die 504. A peripheral region of semiconductor die 504 adjacent to semiconductor die 504 is devoid of insulating layer 516. A portion of insulating layer 516 is removed by LDA using laser 520 or by an etching process through a patterned photoresist layer to form openings 522 in insulating layer 516. Openings 522 expose conductive layer 512 through insulating layer 516 and provide for subsequent electrical interconnect.

Semiconductor wafer 500 undergoes electrical testing and inspection as part of a quality control process. Manual visual inspection and automated optical systems are used to perform inspections on semiconductor wafer 500. Software can be used in the automated optical analysis of semiconductor wafer 500. Visual inspection methods may employ equipment such as a scanning electron microscope, high-intensity or ultra-violet light, or metallurgical microscope. Semiconductor wafer 500 is inspected for structural characteristics including warpage, thickness variation, surface particulates, irregularities, cracks, delamination, and discoloration.

The active and passive components within semiconductor die 504 undergo testing at the wafer level for electrical performance and circuit function. Each semiconductor die 504 is tested for functionality and electrical parameters using a probe or other testing device. A probe is used to make electrical contact with nodes or contact pads 512 on each semiconductor die 504 and provides electrical stimuli to the contact pads. Semiconductor die 504 responds to the electrical stimuli, which is measured and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 500 enables semiconductor die 504 that pass to be designated as KGD for use in a semiconductor package.

Figure 22B:
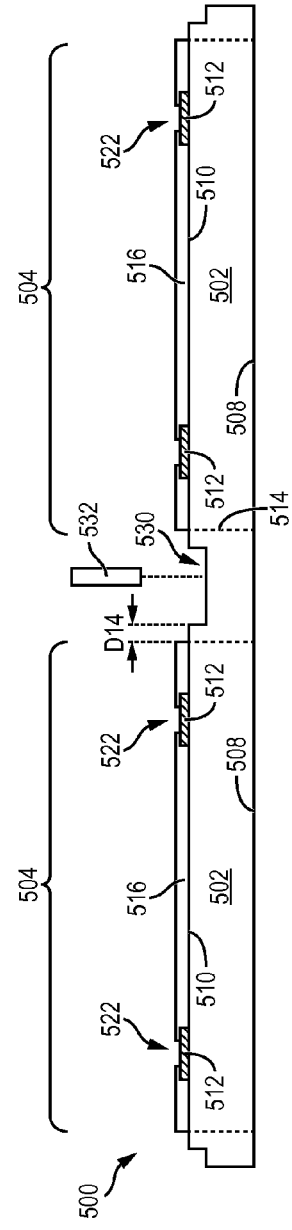

In FIG. 22b, a groove or channel 530 is cut into base substrate material 502 within saw streets 506 using saw blade or laser cutting tool 532. Grooves 530 extend around a peripheral region of semiconductor die 504. The width of grooves 530 is less than the width of saw streets 506. In one embodiment, saw blade 532 is selected with a width less than a width of saw streets 506. Saw blade 532 has a width that is approximately 1 µm less than the width of saw streets 506. The width of saw blade 532 allows grooves 530 to be formed a distance D14 from edges 514 of semiconductor die 504. In one embodiment, distance D14 between groove 530 and edges 514 is 0.5 µm or greater. In another embodiment, saw streets 506 are more than 1 µm wider than grooves 530 or saw blade 532. Grooves 530 are formed partially through base substrate material 502 and have a depth of 150 µm or less. In one embodiment, grooves 530 have a depth of 60 µm or less. Saw blade 532 is selected with a grit size ranging from 1,500 to 3,500. The formation of groove 530 constitutes a first cut in a stepped singulation process for semiconductor wafer 500.

Figure 22C:
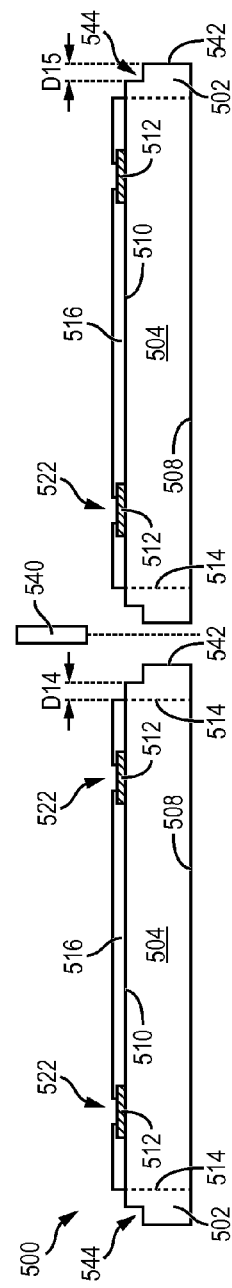

In FIG. 22c, semiconductor wafer 500 is singulated through saw streets 506 using a saw blade or laser cutting tool 540 to separate semiconductor wafer 500 into individual semiconductor die 504. Semiconductor wafer 500 is singulated through grooves 530 and through base substrate material 502 within saw streets 506. In one embodiment, saw blade 540 is selected with a similar grit size as saw blade 532, i.e., with a grit size ranging from 1,500 to 3,500. In another embodiment, saw blade 540 is selected with a coarser grit size than saw blade 532. A portion of base substrate material 502 is removed by saw blade 540 while leaving a portion of grooves 530 and base substrate material 502 within saw streets 506. A portion of base substrate material 502 remains disposed on sidewalls 514 of semiconductor die 504. Base substrate material 502 forms a seal ring around semiconductor die 504.

In one embodiment, saw blade 540 has a width less than the width of saw blade 532 or less than the width of grooves 530. A width of saw blade 540 is at least 5 µm less than a width of saw blade 532 and a portion of grooves 530 remain in a peripheral region of semiconductor die 504 after singulation. Singulation of semiconductor wafer 500 with a second, thinner cut results in a step cut or notch 544 formed in base substrate material 502. Notch 544 remains in base substrate material 502 in a peripheral region of semiconductor die 504 by nature of singulating through groove 530 using saw blade 540, which is thinner than saw blade 532. In one embodiment, a distance D15 between the edge of grooves 530 and side surface 542 is approximately 2.5 µm. In another embodiment, distance D15 is at least 0.5-1 µm. Notch 544 extends along the four sides of semiconductor die 504. In yet another embodiment, groove 530 is completely removed such that distance D15 is 0 µm. A full laser cut or stealth laser dicing is used to singulate through groove 530 across the entire width of groove 530. Singulation through groove 530 constitutes a second cut in the stepped singulation process for semiconductor wafer 500.

In an alternative embodiment, grooves 530 are used for alignment inspection during singulation. Saw blade 540 has a width similar to the width of saw blade 532 or similar to the width of grooves 530. During singulation with saw blade or laser cutting tool 540, a portion of base substrate material 502 is removed within saw streets 506 and within grooves 530. Singulation of semiconductor wafer 500 with saw blade 540 having a similar with as saw blade 532 results in a planar sidewall 542. Grooves 530 are completely removed during the singulation, because saw blade 540 removes the base substrate material 502 under grooves 530. The surface of base substrate material 502 can be visually inspected to check the alignment of the singulation cut. A step or notch remaining in base substrate material 502 after singulation with similar size saw blade 540 indicates alignment offset of saw blade 540.

FIG. 22d shows carrier or temporary substrate 560 containing sacrificial base material such as silicon, polymer, beryllium oxide, glass, or other suitable low-cost, rigid material for structural support. An interface layer or double-sided tape 562 is formed over carrier 560 as a temporary adhesive bonding film, etch-stop layer, or thermal release layer. Semiconductor die 504 are mounted to carrier 560 and interface layer 562 using, for example, a pick and place operation with insulating layer 516 oriented toward carrier 560. Semiconductor die 504 are disposed over surface 564 of interface layer 562 and over carrier 560 to form reconstituted or reconfigured wafer 566. In one embodiment, insulating layer 516 is embedded within interface layer 562. For example, active surface 510 of semiconductor die 504 is coplanar with surface 564 of interface layer 562. In another embodiment, insulating layer 516 is mounted over interface layer 562 such that active surface 510 of semiconductor die 504 is offset from interface layer 562.

Carrier 560 can be a round or rectangular panel with capacity for multiple semiconductor die 504. In one embodiment, carrier 560 is a 12-inch wafer. In another embodiment, carrier 560 is a panel having a width of 300 mm and a length of 300 mm. Carrier 560 may have a larger surface area than the surface area of semiconductor wafer 500. A larger carrier reduces the manufacturing cost of the semiconductor package as more semiconductor die can be processed on the larger carrier thereby reducing the cost per unit. In another embodiment, carrier 560 is a standardized shape and size with capacity for various sizes and quantities of semiconductor die, which are singulated from various sizes of semiconductor wafers. Standardized carrier 560 is fixed in size and can accommodate multiple sizes of semiconductor die. Standardized carrier 560, for example, is rectangular in shape and has a width of 560 mm and a length of 600 mm. The size of standardized carrier 560 is independent of the dimensions of semiconductor die 504 or semiconductor wafer 500. More small semiconductor die than larger semiconductor die can fit over carrier 560. For example, carrier 560 accommodates a greater number of 5 mm by 5 mm die over the surface area of carrier 560 than a number of 10 mm by 10 mm die over the surface area of carrier 560. Accordingly, standardized carrier 560 can handle any size semiconductor die 504, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 560 lowers manufacturing costs and capital risk by reducing or eliminating the need for specialized semiconductor processing lines based on die size or incoming wafer size. By selecting a predetermined carrier size to use for any size semiconductor die from all semiconductor wafers, a flexible manufacturing line can be implemented.

FIG. 22e shows reconstituted wafer 566 with semiconductor die 504 disposed over carrier 560. Reconstituted wafer 566 can be processed into many types of semiconductor packages, including fan-in WLCSP, reconstituted or eWLCSP, fan-out WLCSP, flipchip packages, 3D packages, such as PoP, or other semiconductor packages. Reconstituted wafer 566 is configured according to the specifications of the resulting semiconductor package. In one embodiment, semiconductor die 504 are placed on carrier 560 in a high-density arrangement, i.e., 500 µm apart or less, for processing fan-in devices. Semiconductor die 504 are placed onto carrier 560 separated by a gap or distance D16 between semiconductor die 504. Distance D16 between semiconductor die 504 is selected based on the design and specifications of the semiconductor package to be processed. In one embodiment, distance D16 between semiconductor die 504 is 500 µm or less. Distance D16 between semiconductor die 504 on carrier 560 is optimized for manufacturing the semiconductor packages at the lowest unit cost.

An encapsulant or molding compound 570 is deposited over and around semiconductor die 504 and over carrier 560 and interface layer 562 using a paste printing, transfer molding, liquid encapsulant molding, vacuum lamination, spin coating, or other suitable applicator. Encapsulant 570 can be polymer composite material, such as epoxy resin with filler, epoxy acrylate with filler, or polymer with proper filler. Encapsulant 570 is non-conductive and environmentally protects the semiconductor device from external elements and contaminants. In another embodiment, encapsulant 570 is an insulating or dielectric layer which contains one or more layers of photosensitive low curing temperature dielectric resist, photosensitive composite resist, laminate compound film, insulation paste with filler, solder mask resist film, liquid or granular molding compound, polyimide, BCB, PBO, $SiO_2$, $Si_3N_4$, SiON, $Ta_2O_5$, $Al_2O_3$, prepreg, or other dielectric material having similar insulating and structural properties deposited using printing, spin coating, spray coating, vacuum or pressure lamination with or without heat, or other suitable process. In one embodiment, encapsulant 570 includes a filler having a size of 55 µm or less. In another embodiment, encapsulant 570 includes a filler having a size of 30 µm or less. In yet another embodiment, encapsulant 570 is a low temperature curing photosensitive dielectric polymer with or without insulating fillers cured at less than 200° C.

In particular, encapsulant 570 is disposed in a peripheral region of semiconductor die 504 along side surfaces 542 and into notch 544. Encapsulant 570 fills notch 544 and surrounds the four side walls of semiconductor die 504. A surface 572 of encapsulant 570 is coplanar with active surface 510 of semiconductor die 504. Encapsulant 570 also covers back surface 508 of semiconductor die 504. In one embodiment, a thickness of encapsulant between back surface 508 of semiconductor die 504 and back surface 574 of encapsulant 570 is 50 µm or greater. Back surface 574 of encapsulant 570 is thinned in a subsequent backgrinding step. Alternatively, encapsulant 570 is deposited such that back surface 574 of encapsulant 570 is coplanar with back surface 508 of semiconductor die 504 and encapsulant 570 does not cover back surface 508.

In FIG. 22f, carrier 560 and interface layer 562 are removed by chemical etching, mechanical peeling, CMP, mechanical grinding, thermal bake, UV light, laser scanning, or wet stripping to expose insulating layer 516, conductive layer 512, and surface 572 of encapsulant 570. Reconstituted wafer 566 remains in wafer form or panel form and constitutes a fan-in substrate. A thermal annealing process is applied to reconstituted wafer 566 to facilitate outgassing. In one embodiment, thermal annealing is performed at 200° C. or greater for 30 minutes.

An insulating or passivation layer 580 is formed over insulating layer 516 and conductive layer 512 using PVD, CVD, printing, spin coating, spray coating, screen printing or lamination. Insulating layer 580 can be one or more layers of $SiO_2$, $Si_3N_4$, SiON, $Ta_2O_5$, $Al_2O_3$, or other material having similar insulating and structural properties. In one embodiment, insulating layer 580 is a photosensitive dielectric polymer low-cured at less than 200° C. Insulating layer 580 is formed within the footprint of semiconductor die 504 and does not extend beyond the footprint of semiconductor die 504 over encapsulant 570. In other words, a peripheral region of semiconductor die 504 adjacent to semiconductor die 504 is devoid of insulating layer 580 such that encapsulant 570 remains exposed with respect to insulating layer 580. In another embodiment, insulating layer 580 is formed over insulating layer 516, semiconductor die 504, and extends over encapsulant 570.

A portion of insulating layer 580 is removed by an etching process with a patterned photoresist layer or by LDA to form openings 582 to expose conductive layer 512. Openings 582 are formed over conductive layer 512 to provide for electrical connection to conductive layer 512. In one embodiment, openings 582 are formed to expose both conductive layer 512 and a portion of insulating layer 516. Insulating layer 580 is completely removed from over conductive layer 512. Insulating layer 580 does not overlap conductive layer 512 and does not overlap openings 522 in insulating layer 516 over conductive layer 512. Conductive layer 312 is devoid of insulating layer 580. In another embodiment, openings 582 are formed to expose conductive layer 512 while leaving a portion of insulating layer 580 disposed in contact with conductive layer 512. Insulating layer 580 is formed within openings 522 in insulating layer 516 over conductive layer 512. Insulating layer 580 extends into openings 522 in insulating layer 516 and over conductive layer 512.

In FIG. 22g, an electrically conductive layer 584 is formed over insulating layer 580 and conductive layer 512 using a patterning and metal deposition process such as printing, PVD, CVD, sputtering, electrolytic plating, and electroless plating. Conductive layer 584 can be one or more layers of Al, Cu, Sn, Ti, Ni, Au, Ag, or other suitable electrically conductive material. A portion of conductive layer 584 extends horizontally along insulating layer 580 and parallel to active surface 510 of semiconductor die 504 to laterally redistribute the electrical interconnect to conductive layer 512. Conductive layer 584 operates as an RDL for the electrical signals of semiconductor die 504. Conductive layer 584 is formed over a footprint of semiconductor die 504 and does not extend beyond the footprint of semiconductor die 504 or over encapsulant 570. In other words, a peripheral region of semiconductor die 504 adjacent to semiconductor die 504 is devoid of conductive layer 584 such that encapsulant 570 remains exposed with respect to conductive layer 584. In one embodiment, conductive layer 584 is formed up to edges 514 of semiconductor die 504 and does not extend beyond the active area of semiconductor die 504. In another embodiment, conductive layer 584 is formed a distance D18 from edge 514 of semiconductor die 504, where distance D18 is greater than 0 µm. A portion of conductive layer 584 is electrically connected to conductive layer 512. Other portions of conductive layer 584 are electrically common or electrically isolated depending on the connectivity of semiconductor die 504.

In FIG. 22h, an insulating or passivation layer 590 is formed over insulating layer 580 and conductive layer 584 using PVD, CVD, printing, spin coating, spray coating, screen printing or lamination. Insulating layer 590 can be one or more layers of SiO2, Si3N4, SiON, Ta2O5, Al2O3, or other material having similar insulating and structural properties. In one embodiment, insulating layer 590 includes the same material as insulating layer 580. In another embodiment, insulating layer 590 includes a different material than insulating layer 580, such as a material with a higher or lower coefficient of thermal expansion (CTE). In another embodiment, insulating layer 590 is a photosensitive dielectric polymer low-cured at less than 200° C.

Insulating layer 590 is formed within the footprint of semiconductor die 504 and does not extend beyond the footprint of semiconductor die 504, beyond edges 514, or over encapsulant 570. A peripheral region of semiconductor die 504 adjacent to semiconductor die 504 is devoid of insulating layer 590 such that encapsulant 570 remains exposed with respect to insulating layer 590. In another embodiment, insulating layer 590 is formed over semiconductor die 504 and outside a footprint of semiconductor die 504 over base substrate material 502, and does not extend over encapsulant 570. Insulating layer 590 is formed over base substrate material 502 around semiconductor die 504 while encapsulant remains exposed with respect to insulating layer 590. In yet another embodiment, insulating layer 590 is formed over insulating layer 580, semiconductor die 504, and encapsulant 570. A portion of insulating layer 590 is removed by an etching process with a patterned photoresist layer or by LDA to form openings to expose conductive layer 584.

An electrically conductive bump material is deposited over conductive layer 584 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 584 using a suitable attachment or bonding process. In one embodiment, the bump material is reflowed by heating the material above its melting point to form balls or bumps 592. In some applications, bumps 592 are reflowed a second time to improve electrical contact to conductive layer 584. Bumps 592 can also be compression bonded or thermocompression bonded to conductive layer 584. Bumps 592 represent one type of interconnect structure that can be formed over conductive layer 584. The interconnect structure can also use bond wires, conductive paste, stud bump, micro bump, or other electrical interconnect.

Collectively, insulating layers 580 and 590, conductive layer 584 and bumps 592 constitute a fan-in build-up interconnect structure 594 formed over semiconductor die 504 and within a footprint of semiconductor die 504. A peripheral region of semiconductor die 504 adjacent to semiconductor die 504 is devoid of interconnect structure 594 such that encapsulant 570 remains exposed with respect to interconnect structure 594. Accordingly, interconnect structure 594 constitutes a fan-in interconnect structure. Build-up interconnect structure 594 may include as few as one RDL or conductive layer, such as conductive layer 584, and one insulating layer, such as insulating layer 590. Additional insulating layers and RDLs can be formed over insulating layer 590 prior to forming bumps 592, to provide additional vertical and horizontal electrical connectivity across the package according to the design and functionality of semiconductor die 504.

In FIG. 22i, a backgrinding tape 596 is applied over active surface 510 of semiconductor die 504 and covering interconnect structure 594 and bumps 592 of reconstituted wafer 566. Reconstituted wafer 566 may be mounted to a support table with backgrinding tape 596 oriented toward the support table. A portion of encapsulant 570 from back surface 574 is optionally removed by backgrinding with grinder 600, or by CMP, etching processes, or LDA. The backgrinding operation removes encapsulant 570 from back surface 508 of semiconductor die 504 to reduce warpage of reconstituted wafer 566. In one embodiment, the backgrinding operation completely removes encapsulant 570 from over semiconductor die 504 to expose back surface 508 of semiconductor die 504. After backgrinding, a back surface 602 of encapsulant 570 is coplanar with back surface 508 of semiconductor die 504. Reconstituted wafer 566 has a reduced thickness after the backgrinding operation. In one embodiment, a portion of back surface 508 of semiconductor die 504 is removed to thin semiconductor die 504 during the backgrinding operation. In one embodiment, semiconductor die 504 has a thickness of 500 μm or less. Laser marking can be applied directly to back surface 508 of semiconductor die 504 for alignment and singulation.

In FIG. 22*j*, a mounting tape, dicing tape, or support carrier 610 is applied to a back surface of reconstituted wafer 566. Dicing tape 610 provides support for reconstituted wafer 566 during subsequent manufacturing steps and during singulation into individual semiconductor packages. Backgrinding tape 596 is removed from reconstituted wafer 566 while reconstituted wafer 566 is mounted to dicing tape 610.

In FIG. 22*k*, reconstituted wafer 566 is singulated using a saw blade or laser cutting tool 620 into individual eWLCSP 622. Reconstituted wafer 566 is singulated through encapsulant 570 and through dicing tape 610. Saw blade 620 does not cut through base substrate material 502 of semiconductor die 504. Because reconstituted wafer 566 is singulated through encapsulant 570 rather than base substrate material 502, base substrate material 502 is less prone to cracking and chipping. Saw blade 620 is selected having a width less than a width of the gap between adjacent semiconductor die 504. In one embodiment, saw blade 620 is at least 20 μm narrower than the gap between adjacent semiconductor die 504. In another embodiment, saw blade 620 is 40-100 μm narrower than the gap between adjacent semiconductor die 504. Because saw blade 620 is narrower than the gap between die 504, encapsulant 570 remains covering side surfaces 542 after singulation of reconstituted wafer 566. The thickness of encapsulant 570 disposed over surface 542 is shown as thickness or distance D20. In one embodiment, thickness D20 of encapsulant 570 over side surfaces 542 is 0.5 μm or greater. In another embodiment, thickness D20 of encapsulant 570 over side surfaces 542 ranges from 5-50 μm. In yet another embodiment, thickness D20 of encapsulant 570 over side surfaces 542 is at least 10 μm. Reconstituted wafer 566 may also be singulated using a stepped singulation process, similar to the process shown in FIGS. 22*b*-22*c*. A groove is formed through encapsulant 570 using a saw blade or laser cutting tool. The groove extends partially through encapsulant 570 between semiconductor die 504. The groove constitutes a first cut in the stepped singulation process. Reconstituted wafer 566 is singulated through the groove in encapsulant 570 using a second cut in the stepped singulation process to completely separate individual eWLCSP 622. After singulation of reconstituted wafer 566, dicing tape 610 is removed from eWLCSP 622.

FIG. 22*l* shows eWLCSP 622 after singulation having encapsulant 570 covering side surfaces 542. Semiconductor die 504 is electrically connected through conductive layers 512 and 584 to bumps 592 for external interconnect through interconnect structure 594. The electrical interconnections of interconnect structure 594 do not extend beyond a footprint of semiconductor die 504 and thus forms a fan-in package. The process of manufacturing eWLCSP 622 improves yield by reducing defects of semiconductor die 504 through the use of a stepped singulation process and encapsulant 570 covering the sidewall of semiconductor die 504. The step cut used during singulation of semiconductor wafer 500 reduces cracking and chipping of active surface 510 of semiconductor die 504. Grooves 530 are formed prior to singulating semiconductor wafer 500 in order to control cracking and chipping of semiconductor die 504. Notches 544 in base substrate material 502 can also be used for alignment during singulation of semiconductor wafer 500. The stepped singulation process for semiconductor wafer 500 improves yield by reducing the damage to semiconductor die 504.

Encapsulant 570 provides sidewall protection over four sides of semiconductor die 504 to mechanically strengthen semiconductor die 504. Encapsulant 570 covers side surfaces 542 and covers base substrate material 502, which surrounds edges 514 of semiconductor die 504. Encapsulant 570 protects semiconductor die 504 during backgrinding and singulation. Encapsulant 570 is singulated to separate individual eWLCSP 622 without singulating through base substrate material 502 or semiconductor die 504. Encapsulant 570 disposed over side surfaces 542 reduces cracking and chipping of base substrate material 502 and semiconductor die 504. In one embodiment, thickness D20 of encapsulant 570 over side surfaces 542 is 0.5 μm or greater. In another embodiment, thickness D20 of encapsulant 570 over side surfaces 542 ranges from 5-50 μm. Semiconductor die 504 is surrounded by a ring of base substrate material 502 around edges 514 of semiconductor die 504. Semiconductor die 504 and base substrate material 502 are surrounded by a ring of encapsulant 570. The ring of encapsulant 570 has a thickness D22 between notch 544 in base substrate material 502 and the outer edge of eWLCSP 622. In one embodiment, thickness D22 is at least 0.5 μm.

Encapsulant 570 is removed from back surface 508 of semiconductor die 504 during the backgrinding process to reduce the thickness of eWLCSP 622. Semiconductor die 504 is thinned during backgrinding to reduce warpage of eWLCSP 622. In one embodiment, semiconductor die 504 has a thickness D21 of 500 μm or less. The reduced thickness of encapsulant 570 and semiconductor die 504 improves the reliability of eWLCSP 622 after mounting eWLCSP 622 to a substrate, such as a PCB.

eWLCSP 622 is a fan-in package with side wall protection to strengthen semiconductor die 504 without the need for a backside protection layer. eWLCSP 622 can be manufactured at a lower cost without a backside protection layer. Further, the exposed back surface 508 of semiconductor die 504 allows for visual inspection of semiconductor die 504 for cracks and chipping. eWLCSP 622 is manufactured by forming a reconstituted wafer on standardized carrier 560 using equipment designed for a single standardized carrier size, which reduces equipment and material costs for eWLCSP 622. eWLCSP 622 is manufactured at a higher volume using standardized carrier 560, thereby simplifying the manufacturing process and reducing unit cost.

Figure 22M:
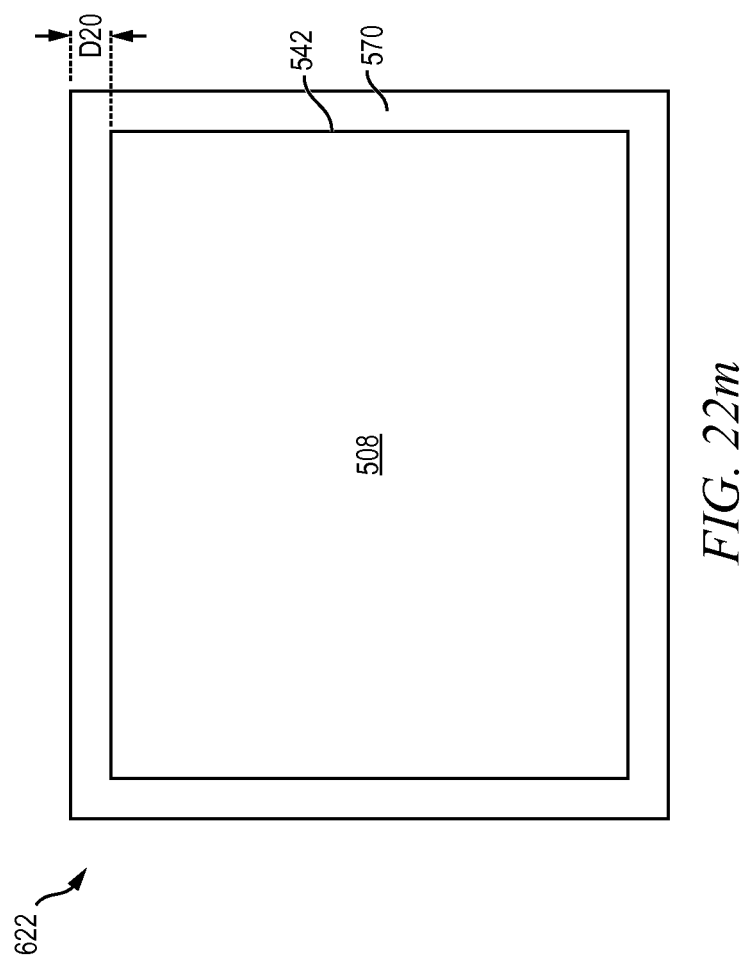

FIG. 22*m* shows a plan view of a back surface of eWLCSP 622. Back surface 508 of semiconductor die 504 is exposed from encapsulant 570. Semiconductor die 504 is surrounded by a ring of encapsulant 570, which covers the four side surfaces of semiconductor die 504. In one embodiment, thickness D20 of encapsulant 570 over side surfaces 542 is 0.5 μm or greater. In another embodiment, thickness D20 of encapsulant 570 over side surfaces 542 ranges from 5-50 μm. Encapsulant 570 disposed over side surfaces 542 reduces cracking and chipping of base substrate material 502 and semiconductor die 504. Encapsulant 570 protects improves yield by reducing the damage to semiconductor die 504 during processing and singulation into eWLCSP 622.

FIG. 23 shows eWLCSP 630 having encapsulant 570 over the sidewall of semiconductor die 504 and having an exposed back surface 508. Semiconductor die 504 is electrically connected through conductive layers 512 and 584 to bumps 592 for external interconnect through interconnect structure 632. The electrical interconnections of interconnect structure 632 do not extend beyond a footprint of semiconductor die 504 and thus forms a fan-in package. Insulating layer 590 is formed over conductive layer 584 and insulating layer 580. Additionally, insulating layer 590 of eWLCSP 630 extends beyond a footprint of semiconductor die 504 to cover a portion of encapsulant 570 in a peripheral region of semiconductor die 504. Insulating layer 590 contacts surface 572 of encapsulant 570 and extends over encapsulant 570 by a distance D24, where distance D24 is greater than 0 µm. The overlap of insulating layer 590 with encapsulant 570 provides an improved seal between semiconductor die 504 and encapsulant 570. As a result of insulating layer 590 extending over encapsulant 570, the reliability of eWLCSP 622 is improved.

The process of manufacturing eWLCSP 630 improves yield by reducing defects of semiconductor die 504 through the use of a stepped singulation process and encapsulant 570 covering the sidewall of semiconductor die 504. The step cut used during singulation of semiconductor wafer 500 reduces cracking and chipping of active surface 510 of semiconductor die 504. Grooves 530 are formed prior to singulating semiconductor wafer 500 in order to control cracking and chipping of semiconductor die 504. Notches 544 in base substrate material 502 can also be used for alignment during singulation of semiconductor wafer 500. The stepped singulation process for semiconductor wafer 500 improves yield by reducing damage to semiconductor die 504.

Encapsulant 570 provides sidewall protection over four sides of semiconductor die 504 to mechanically strengthen semiconductor die 504. Semiconductor die 504 is surrounded by a ring of base substrate material 502 around edges 514 of semiconductor die 504. Semiconductor die 504 and base substrate material 500 are surrounded by a ring of encapsulant 570. The ring of encapsulant 570 has a thickness D22 between notch 544 in base substrate material 502 and the outer edge of eWLCSP 630. In one embodiment, thickness D22 is at least 0.5 µm. Encapsulant 570 covers side surfaces 542 and covers base substrate material 502, which surrounds edges 514 of semiconductor die 504. Encapsulant 570 protects semiconductor die 504 during backgrinding and singulation. Encapsulant 570 is singulated to separate individual eWLCSP 630 without singulating through base substrate material 502 or semiconductor die 504. Encapsulant 570 disposed over side surfaces 542 reduces cracking and chipping of base substrate material 502 and semiconductor die 504. In one embodiment, thickness D20 of encapsulant 570 over side surfaces 542 is 0.5 µm or greater. In another embodiment, thickness D20 of encapsulant 570 over side surfaces 542 ranges from 5-50 µm.

Encapsulant 570 is removed from back surface 508 of semiconductor die 504 during the backgrinding process to reduce the thickness of eWLCSP 630. Semiconductor die 504 is thinned during backgrinding to reduce warpage of eWLCSP 630. In one embodiment, semiconductor die 504 has a thickness D21 of 500 µm or less. The reduced thickness of encapsulant 570 and semiconductor die 504 improves the reliability of eWLCSP 630 after mounting eWLCSP 630 to a substrate, such as a PCB.

eWLCSP 630 is a fan-in package with side wall protection to strengthen semiconductor die 504 without the need for a backside protection layer. eWLCSP 630 can be manufactured at a lower cost without a backside protection layer. Further, the exposed back surface 508 of semiconductor die 504 allows for visual inspection of semiconductor die 504 for cracks and chipping. eWLCSP 630 is manufactured by forming a reconstituted wafer on standardized carrier 560 using equipment designed for a single standardized carrier size, which reduces equipment and material costs for eWLCSP 630. eWLCSP 630 is manufactured at a higher volume using standardized carrier 560, thereby simplifying the manufacturing process and reducing unit cost.

FIG. 24 shows eWLCSP 640 having encapsulant over the sidewall of the semiconductor die, an exposed back surface, and a UBM. An electrically conductive layer 642 is formed over the exposed portion of conductive layer 584 and over insulating layer 590 after final repassivation using PVD, CVD, evaporation, electrolytic plating, electroless plating, or other suitable metal deposition process. Conductive layer 642 can be Al, Cu, Sn, Ni, Au, Ag, W, or other suitable electrically conductive material. Conductive layer 642 is a UBM electrically connected to conductive layers 584 and 512. UBMs 642 can be a multi-metal stack with adhesion layer, barrier layer, and seed or wetting layer. The adhesion layer is formed over conductive layer 584 and can be Ti, TiN, TiW, Al, or Cr. The barrier layer is formed over the adhesion layer and can be Ni, NiV, Pt, Pd, TiW, Ti, or CrCu. The barrier layer inhibits the diffusion of Cu into active surface 510 of semiconductor die 504. The seed layer is formed over the barrier layer and can be Cu, Ni, NiV, Au, or Al. UBMs 642 provide a low resistive interconnect to conductive layer 584, as well as a barrier to solder diffusion and seed layer for solder wettability.

An electrically conductive bump material is deposited over conductive layer 642 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 642 using a suitable attachment or bonding process. In one embodiment, the bump material is reflowed by heating the material above its melting point to form balls or bumps 592. In some applications, bumps 592 are reflowed a second time to improve electrical contact to conductive layer 642. Bumps 592 can also be compression bonded or thermocompression bonded to conductive layer 642. Bumps 592 represent one type of interconnect structure that can be formed over conductive layer 642. The interconnect structure can also use bond wires, conductive paste, stud bump, micro bump, or other electrical interconnect.

Collectively, insulating layers 580 and 590, conductive layers 584 and 642, and bumps 592 constitute a build-up interconnect structure 644 formed over semiconductor die 504 and within a footprint of semiconductor die 504. A peripheral region of semiconductor die 504 adjacent to semiconductor die 504 is devoid of interconnect structure 644 such that surface 572 of encapsulant 570 remains exposed with respect to interconnect structure 644. Build-up interconnect structure 644 may include as few as one RDL or conductive layer, such as conductive layer 584, and one insulating layer, such as insulating layer 580. Additional insulating layers and RDLs can be formed over insulating layer 580 prior to forming bumps 592, to provide additional vertical and horizontal electrical connectivity across the package according to the design and functionality of semiconductor die 504.

The process of manufacturing eWLCSP 640 improves yield by reducing defects of semiconductor die 504 through the use of a stepped singulation process and encapsulant 570 covering the sidewall of semiconductor die 504. The step cut used during singulation of semiconductor wafer 500 reduces cracking and chipping of active surface 510 of semiconductor die 504. Grooves 530 are formed prior to singulating semiconductor wafer 500 in order to control cracking and chipping of semiconductor die 504. Notches 544 in base substrate material 502 can also be used for alignment during singulation of semiconductor wafer 500. The stepped singulation process for semiconductor wafer 500 improves yield by reducing the damage to semiconductor die 504.

Encapsulant 570 provides sidewall protection over four sides of semiconductor die 504 to mechanically strengthen semiconductor die 504. Semiconductor die 504 is surrounded by a ring of base substrate material 502 around edges 514 of semiconductor die 504. Encapsulant 570 covers side surfaces 542 and covers base substrate material 502, which surrounds edges 514 of semiconductor die 504. Encapsulant 570 protects semiconductor die 504 during backgrinding and singulation. Encapsulant 570 is singulated to separate individual eWLCSP 640 without singulating through base substrate material 502 or semiconductor die 504. Encapsulant 570 disposed over side surfaces 542 reduces cracking and chipping of base substrate material 502 and semiconductor die 504. In one embodiment, thickness D20 of encapsulant 570 over side surfaces 542 is 0.5 µm or greater. In another embodiment, thickness D20 of encapsulant 570 over side surfaces 542 ranges from 5-50 µm.

Encapsulant 570 is removed from back surface 508 of semiconductor die 504 during the backgrinding process to reduce the thickness of eWLCSP 640 and to expose back surface 508 of semiconductor die 504. Semiconductor die 504 is thinned during backgrinding to reduce warpage of eWLCSP 640. In one embodiment, semiconductor die 504 has a thickness D21 of 500 µm or less. The reduced thickness of encapsulant 570 and semiconductor die 504 improves the reliability of eWLCSP 640 after mounting eWLCSP 640 to a substrate, such as a PCB.

eWLCSP 640 is a fan-in package with side wall protection to strengthen semiconductor die 504 without the need for a backside protection layer. eWLCSP 640 can be manufactured at a lower cost without a backside protection layer. Further, the exposed back surface 508 of semiconductor die 504 allows for visual inspection of semiconductor die 504 for cracks and chipping. eWLCSP 640 is manufactured by forming a reconstituted wafer on standardized carrier 560 using equipment designed for a single standardized carrier size, which reduces equipment and material costs for eWLCSP 640. eWLCSP 640 is manufactured at a higher volume using standardized carrier 560, thereby simplifying the manufacturing process and reducing unit cost.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a semiconductor die including a notch formed in a peripheral region of an active surface of the semiconductor die;
   an encapsulant deposited around the semiconductor die and into the notch, wherein a surface of the encapsulant is coplanar with the notched active surface of the semiconductor die; and
   a build-up interconnect structure formed over the semiconductor die and entirely within a footprint of the semiconductor die.

2. The semiconductor device of claim 1, wherein the build-up interconnect structure further includes:
   an insulating layer formed over the semiconductor die; and
   a conductive layer formed over the insulating layer, the encapsulant devoid of the conductive layer.

3. The semiconductor device of claim 1, wherein a non-active surface of the semiconductor die is exposed with respect to the encapsulant.

4. The semiconductor device of claim 1, wherein the encapsulant covers a sidewall of the semiconductor die.

5. The semiconductor device of claim 4, wherein the encapsulant covering the sidewall of the semiconductor die includes a thickness of 50 micrometers (µm) or less.

\* \* \* \* \*